(12) United States Patent
Lee et al.

(10) Patent No.: US 12,707,632 B2
(45) Date of Patent: Aug. 11, 2026

(54) SEMICONDUCTOR MEMORY DEVICE

(71) Applicant: Samsung Electronics Co., Ltd., Suwon-si (KR)

(72) Inventors: Jeonil Lee, Suwon-si (KR); Kyunghwan Lee, Suwon-si (KR); Juho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 329 days.

(21) Appl. No.: 18/537,987

(22) Filed: Dec. 13, 2023

(65) Prior Publication Data

US 2024/0276713 A1 Aug. 15, 2024

(30) Foreign Application Priority Data

Feb. 15, 2023 (KR) ........................ 10-2023-0020126

(51) Int. Cl.
*H10B 12/00* (2023.01)
*H10D 30/68* (2025.01)

(52) U.S. Cl.
CPC ......... *H10B 12/485* (2023.02); *H10B 12/315* (2023.02); *H10B 12/482* (2023.02); *H10B 12/488* (2023.02); *H10D 30/689* (2025.01); *H10D 30/6891* (2025.01)

(58) Field of Classification Search
CPC .. H10B 12/245; H10B 12/315; H10B 12/482; H10B 12/488; H10B 12/20; H10B 41/127; H10D 30/689; H10D 30/6891
See application file for complete search history.

(56) References Cited

U.S. PATENT DOCUMENTS

| | | | | |
|---|---|---|---|---|
| 5,712,817 | A | 1/1998 | Suh | |
| 8,809,930 | B2 | 8/2014 | Jeon et al. | |
| 9,007,823 | B2 | 4/2015 | Kurita et al. | |
| 10,141,326 | B1 * | 11/2018 | Oh | H10B 41/41 |
| 11,222,690 | B2 | 1/2022 | Karda et al. | |
| 11,296,094 | B2 | 4/2022 | Karda et al. | |
| 11,417,381 | B2 | 8/2022 | Sarpatwari et al. | |
| 2020/0211602 | A1 | 7/2020 | Karda et al. | |
| 2020/0212045 | A1 | 7/2020 | Karda et al. | |
| 2021/0036002 | A1 * | 2/2021 | Lee | H10B 43/40 |
| 2021/0066196 | A1 | 3/2021 | Karda et al. | |

(Continued)

*Primary Examiner* — Alexander G Ghyka
(74) *Attorney, Agent, or Firm* — Wolf, Greenfield & Sacks, P.C.

(57) ABSTRACT

A semiconductor memory device includes a memory cell that extends in a first horizontal direction, a second horizontal direction that intersects the first horizontal direction, and a vertical direction. The memory cell includes a first transistor including a first channel structure, a second transistor including a second channel structure, a charge storage element electrically connected to a first end of the second channel structure and adjacent to the first channel structure a first bit line electrically connected to a first end of the first channel structure and that extends in the second horizontal direction, a selection line electrically connected to a second end of the first channel structure and that extends in the second horizontal direction, a second bit line electrically connected to a second end of the second channel structure and that extends in the second horizontal direction, and a gate line that extends in the vertical direction.

20 Claims, 56 Drawing Sheets

(56) References Cited

U.S. PATENT DOCUMENTS

| | | | | |
|---|---|---|---|---|
| 2021/0159245 | A1* | 5/2021 | Hong | H10B 43/10 |
| 2022/0149053 | A1* | 5/2022 | Lee | H10B 43/27 |
| 2022/0302164 | A1* | 9/2022 | Ino | H10B 43/27 |
| 2023/0016278 | A1* | 1/2023 | Choi | H10B 43/27 |
| 2023/0301097 | A1* | 9/2023 | Kwak | H10B 43/10 |
| 2024/0237348 | A1* | 7/2024 | Lee | H10B 43/10 |
| 2024/0334704 | A1* | 10/2024 | Lee | H10B 43/27 |

* cited by examiner

FIG. 1

MC
BLW
TR-W
SLR
TR-R
BLR
STG
GL
WL
X
Y

SEMICONDUCTOR MEMORY DEVICE

CROSS-REFERENCE TO RELATED APPLICATION

This application is based on and claims priority under 35 U.S.C. § 119 to Korean Patent Application No. 10-2023-0020126, filed on Feb. 15, 2023, in the Korean Intellectual Property Office, the disclosure of which is incorporated by reference herein in its entirety.

TECHNICAL FIELD

The present disclosure relates to a semiconductor memory device, and more particularly, to a three dimensional (3D) semiconductor memory device.

BACKGROUND

As miniaturized, multifunctional, and high-performance electronic products become ubiquitous, high-capacity semiconductor memory devices may be desired and, in order to provide the high-capacity semiconductor memory devices, an increased degree of integration may be desired. Because the degree of integration of a conventional two dimensional (2D) semiconductor memory device may be determined by an area occupied by a unit memory cell, the degree of integration of the 2D semiconductor memory device is increasing, but the degree of integration is still limited. Accordingly, a three dimensional (3D) semiconductor memory device that increases memory capacity by stacking a plurality of memory cells in the vertical direction on a substrate has been proposed.

SUMMARY

The present disclosure relates to a three dimensional (3D) semiconductor memory device having an increased degree of integration.

According to an aspect of the present disclosure, a semiconductor memory device includes semiconductor memory device includes a memory cell that extends in a first horizontal direction, a second horizontal direction that intersects the first horizontal direction, and a vertical direction. The memory cell includes a first transistor including a first channel structure, a second transistor including a second channel structure, a charge storage element electrically connected to a first end of the second channel structure and adjacent to the first channel structure a first bit line electrically connected to a first end of the first channel structure and that extends in the second horizontal direction, a selection line electrically connected to a second end of the first channel structure and that extends in the second horizontal direction, a second bit line electrically connected to a second end of the second channel structure and that extends in the second horizontal direction, and a gate line that extends in the vertical direction.

According to another aspect of the present disclosure, a semiconductor memory device includes a plurality of memory cells that extend in a first horizontal direction, a second horizontal direction that intersects the first horizontal direction, and a vertical direction, where each memory cell of the plurality of memory cells comprises a first transistor includes a first channel structure, a second transistor includes a second channel structure, and a charge storage element electrically connected to a first end of the second channel structure and adjacent to the first channel structure; a plurality of first bit lines, where a first bit line of the plurality of first bit lines is electrically connected to a first end of the first channel structure, and where the first bit line extends in the second horizontal direction; a plurality of selection lines, where a selection line of the plurality of selection lines is electrically connected to a second end of first channel structure, and where the selection line extends in the second horizontal direction; a plurality of second bit lines, where a second bit line of the plurality of second bit lines is electrically connected to a second end of the second channel structure, and where the second bit line extends in the second horizontal direction; and a plurality of gate lines, where a gate line of the plurality of gate lines is adjacent to the first end of the first channel structure, the second end of the first channel structure, the first end of the second channel structure, and the second end of the second channel structure, where the gate lines extends in the vertical direction, where the first channel structure of the plurality of memory cells comprises a portion with a nonlinear shape, and where a first end of charge storage elements of the plurality of memory cells and the first end of the second channel structures of the plurality of memory cells are adjacent to portion with the nonlinear shape of the first channel structure of the plurality of memory cells.

According to another aspect of the present disclosure, a semiconductor memory device includes a plurality of memory cells on a substrate and that extend in a first horizontal direction, a second horizontal direction that intersects the first horizontal direction, and a vertical direction, where each memory cell of the plurality of memory cells includes a first transistor and a second transistor; a plurality of first bit lines that extend in the second horizontal direction; a plurality of selection lines that extend in the second horizontal direction; a plurality of second bit lines that extend in the second horizontal direction; and a plurality of gate lines that extend in the vertical direction, where the first transistor includes a charge storage element includes a first channel structure and is configured to operate as a floating gate, and one of the plurality of first bit lines and one of the plurality of selection lines are electrically connected to a first end of the first channel structure and a second end of the first channel structure, the second transistor includes a second channel structure, and the charge storage element and one of the plurality of second bit lines are electrically connected to a first end and a second end of the second channel structure, where a pair of gate lines of the plurality of gate lines are adjacent to the first end of the first channel structure, the second end of the first channel structure, the first end of the second channel structure, and the second end of the second channel structure, and a word line electrically connects the pair of gate lines, the first channel structure includes a pair of horizontal parts spaced apart from one another in the vertical direction and that extend in the first horizontal direction, and a vertical part that extends in the vertical direction and electrically connected to the pair of horizontal parts, and a first end of the charge storage element and the first end of the second channel structure are between the pair of horizontal parts of the first channel structure.

BRIEF DESCRIPTION OF THE DRAWINGS

Embodiments will be more clearly understood from the following detailed description taken in conjunction with the accompanying drawings in which:

FIG. 1 is an equivalent circuit diagram illustrating a cell array of a semiconductor memory device according to embodiments of the present disclosure;

DETAILED DESCRIPTION OF THE EMBODIMENTS

Figure 2A:
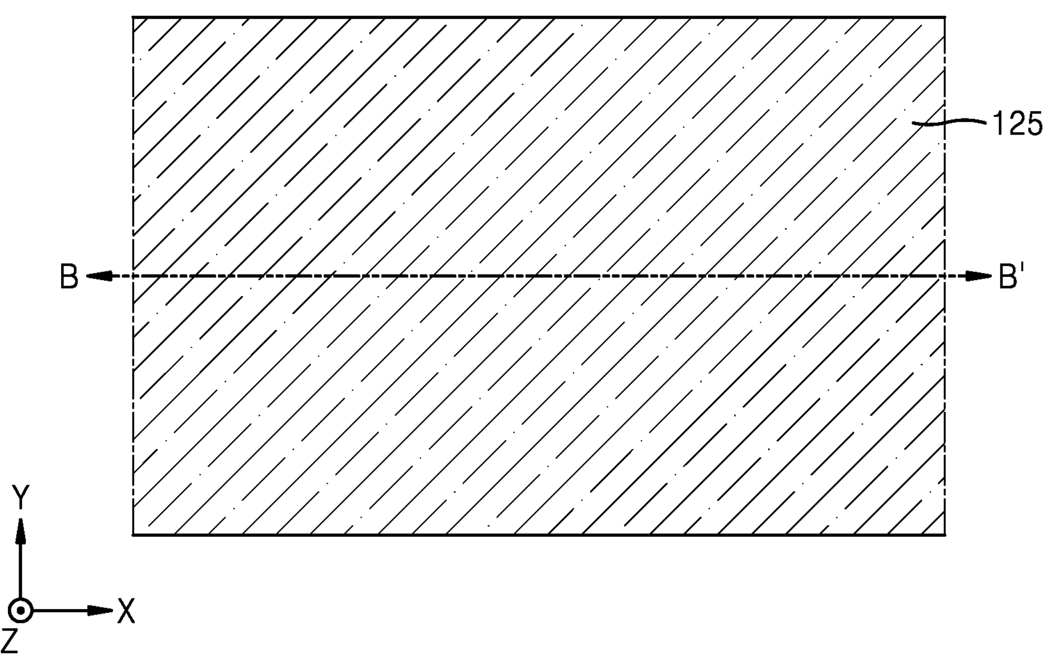
FIGS. 2A, 2B, 3A, 3B, 4A, 4B, 5A, 5B, 6A, 6B, 7A, 7B, 8A, 8B, 8C, 8D, 9A, 9B, 9C, 10A, 10B, 10C, 11A, 11B, 11C, 12A, 12B, 12C, 13A, 13B, 13C, 13D, 14A, 14B, 14C, 14D, 15A, 15B, and 15C illustrate a method of manufacturing a semiconductor memory device according to embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection. The phrase "an element A fills element B" may refer to element A being at least partially within a space defined by element B.

Figure 1:
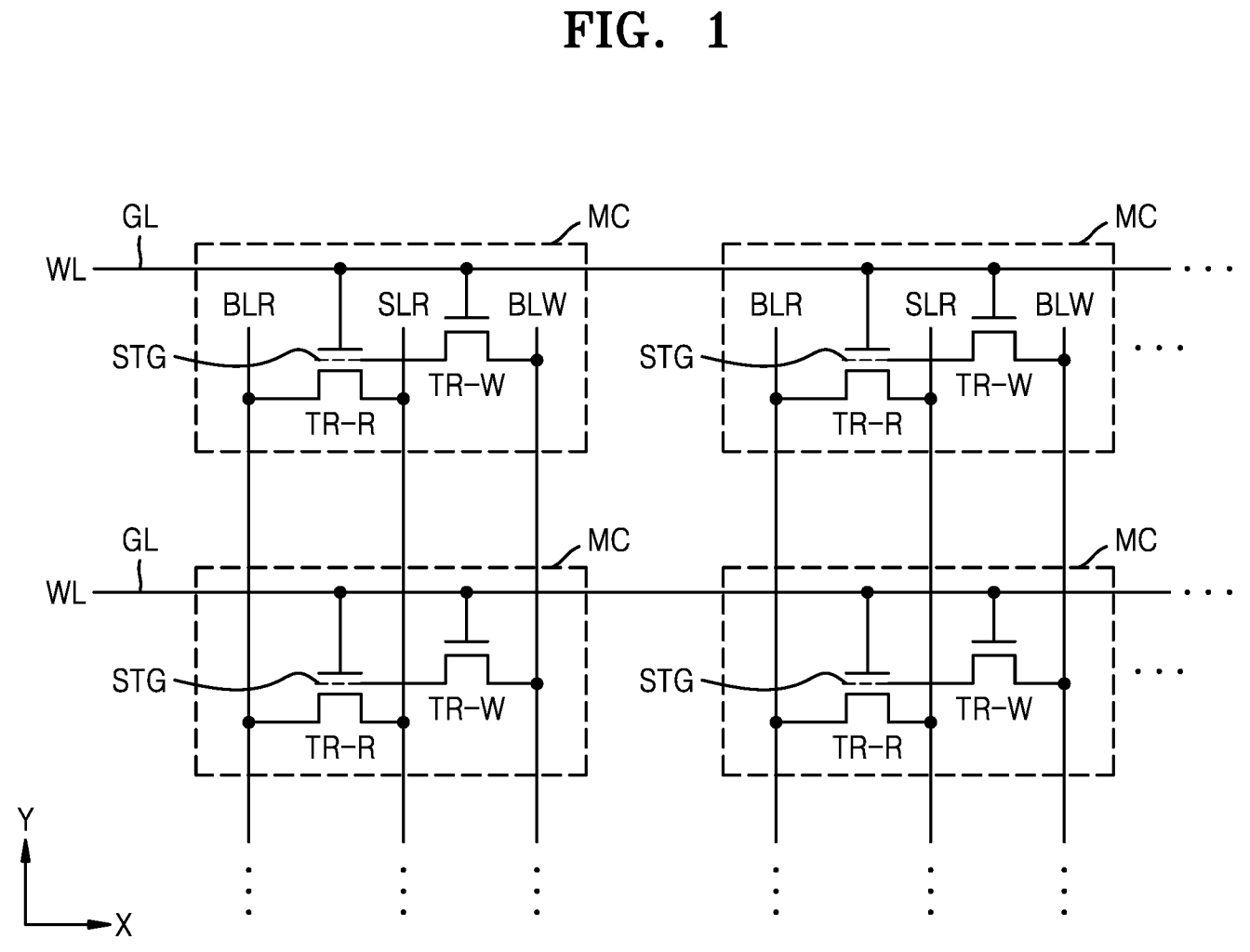

FIG. 1 is an equivalent circuit diagram illustrating a cell array of a semiconductor memory device according to embodiments.

Referring to FIG. 1, the cell array of the semiconductor memory device may include a plurality of memory cells MC. Each of the plurality of memory cells MC may include a pair of transistors, for example, a first transistor TR-R and a second transistor TR-W. In some embodiments, each of the first transistor TR-R and the second transistor TR-W may include a field effect transistor (FET).

A charge storage element STG may constitute a memory element of the memory cell MC. The charge storage element STG may function as a floating gate of the first transistor TR-R and may be electrically coupled to the second transistor TR-W. For example, the charge storage element STG may be electrically coupled to a channel region of the second transistor TR-W.

Each of the plurality of memory cells MC may operate as a dynamic random access memory (DRAM) memory cell in which a writing operation for storing information and a read operation for reading information are performed. Each of the plurality of memory cells MC may store information in the charge storage element STG instead of a capacitor. A semiconductor memory device including the plurality of memory cells MC may be referred to as a DRAM memory device of a floating gate substrate. The semiconductor memory device including the plurality of memory cells MC may include a volatile semiconductor memory device.

A plurality of word lines WL may be electrically connected to gate lines GL of each of the first transistor TR-R and the second transistor TR-W of the memory cells MC. In some embodiments, the plurality of word lines WL may extend in a first horizontal direction (an X direction) and may be spaced apart from one another in a second horizontal direction (a Y direction) that is orthogonal and/or intersects to the first horizontal direction (the X direction). The gate lines GL of each of the first transistor TR-R and the second transistor TR-W may extend in the vertical direction that is orthogonal to each of the first horizontal direction (the X direction) and the second horizontal direction (the Y direction).

One end of a channel region of the first transistor TR-R may be electrically coupled to a first bit line BLR and the other end of a channel region of the first transistor TR-R may be electrically coupled to a selection line SLR. One end of the channel region of the second transistor TR-W may be electrically coupled to a second bit line BLW and the other end of the channel region of the second transistor TR-W may be electrically coupled to the charge storage element STG. In some embodiments, each of the first bit line BLR, the second bit line BLW, and the selection line SLR may extend in the second horizontal direction (the Y direction). As used herein, "the other end" may also be referred to as "an additional end."

The second transistor TR-W may store electric charges in the charge storage element STG. A threshold voltage of the first transistor TR-R in which the charge storage element STG functions as a floating gate may vary according to the amount of charge stored in the charge storage element STG. Information stored in the memory cell MC may be read as '0' or '1' according to the threshold voltage of the first transistor TR-R, which is determined by the amount of charge stored in the charge storage element STG. For example, the second transistor TR-W of one memory cell MC may be selected by one word line WL and one second bit line BLW to store charge in the charge storage element STG. In addition, the first transistor TR-R of one memory cell MC may be selected by one word line WL, one first bit line BLR, and one selection line SLR, and information stored in the memory cell MC may be read according to the threshold voltage of the first transistor TR-R determined by the amount of charge stored in the charge storage element STG. The first transistor TR-R may be referred to as a read transistor and the second transistor TR-W may be referred to as a write transistor. Each of the plurality of memory cells MC may be referred to as a 2T memory cell.

Figure 13A:
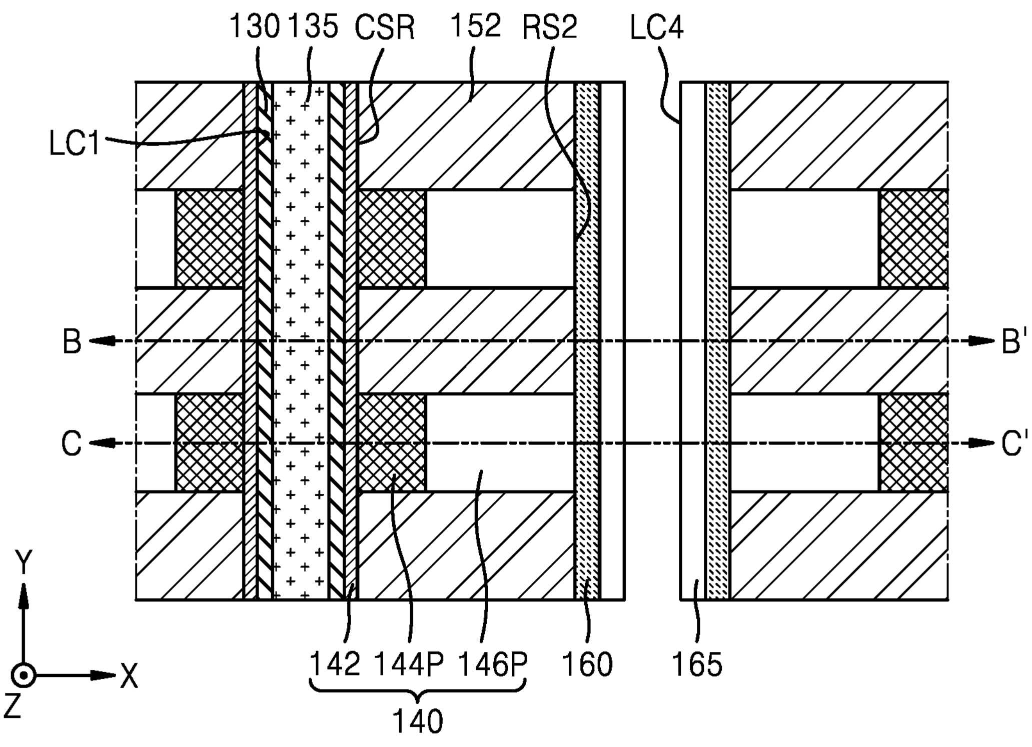
Figure 13B:
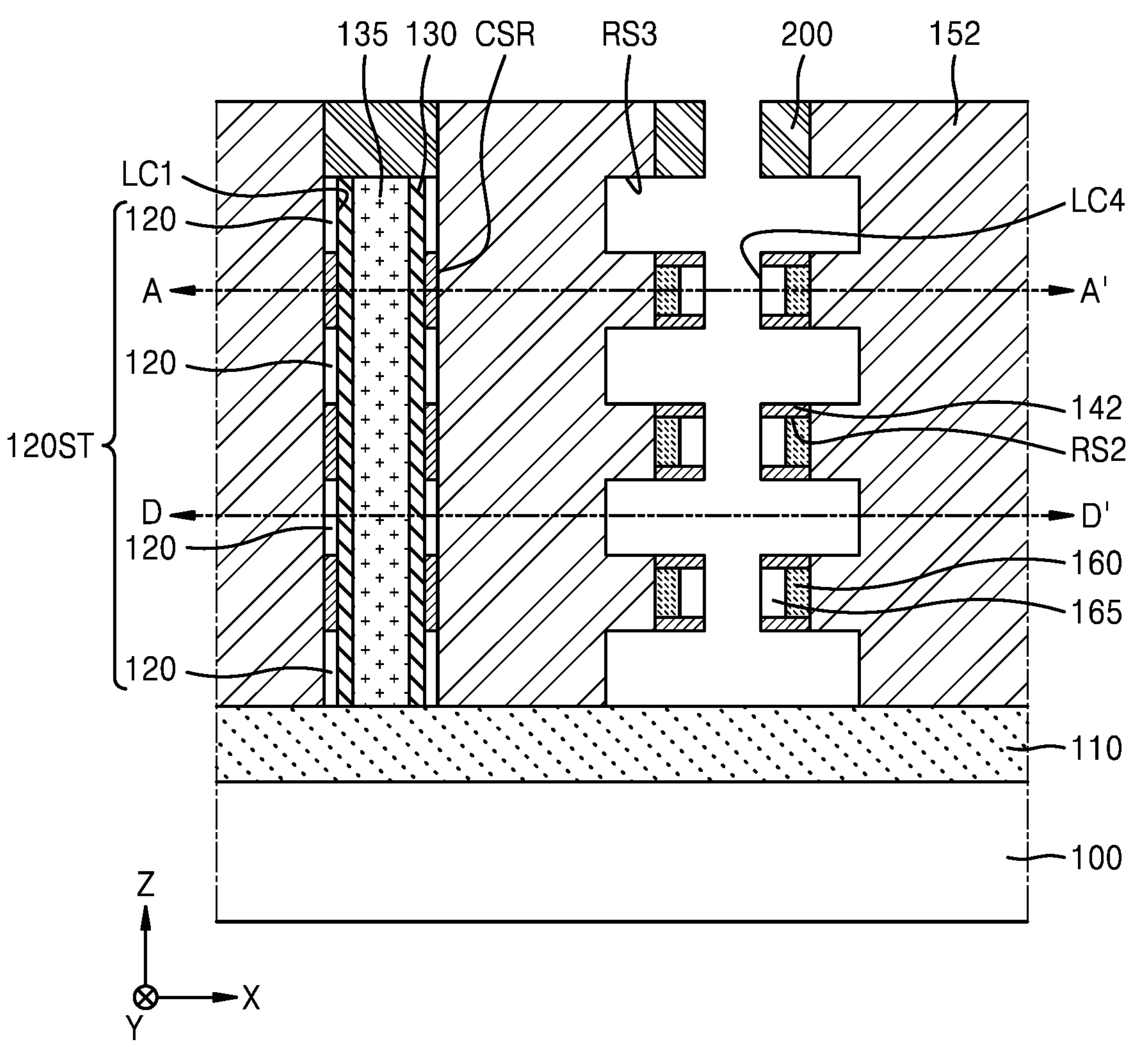
Figure 13C:
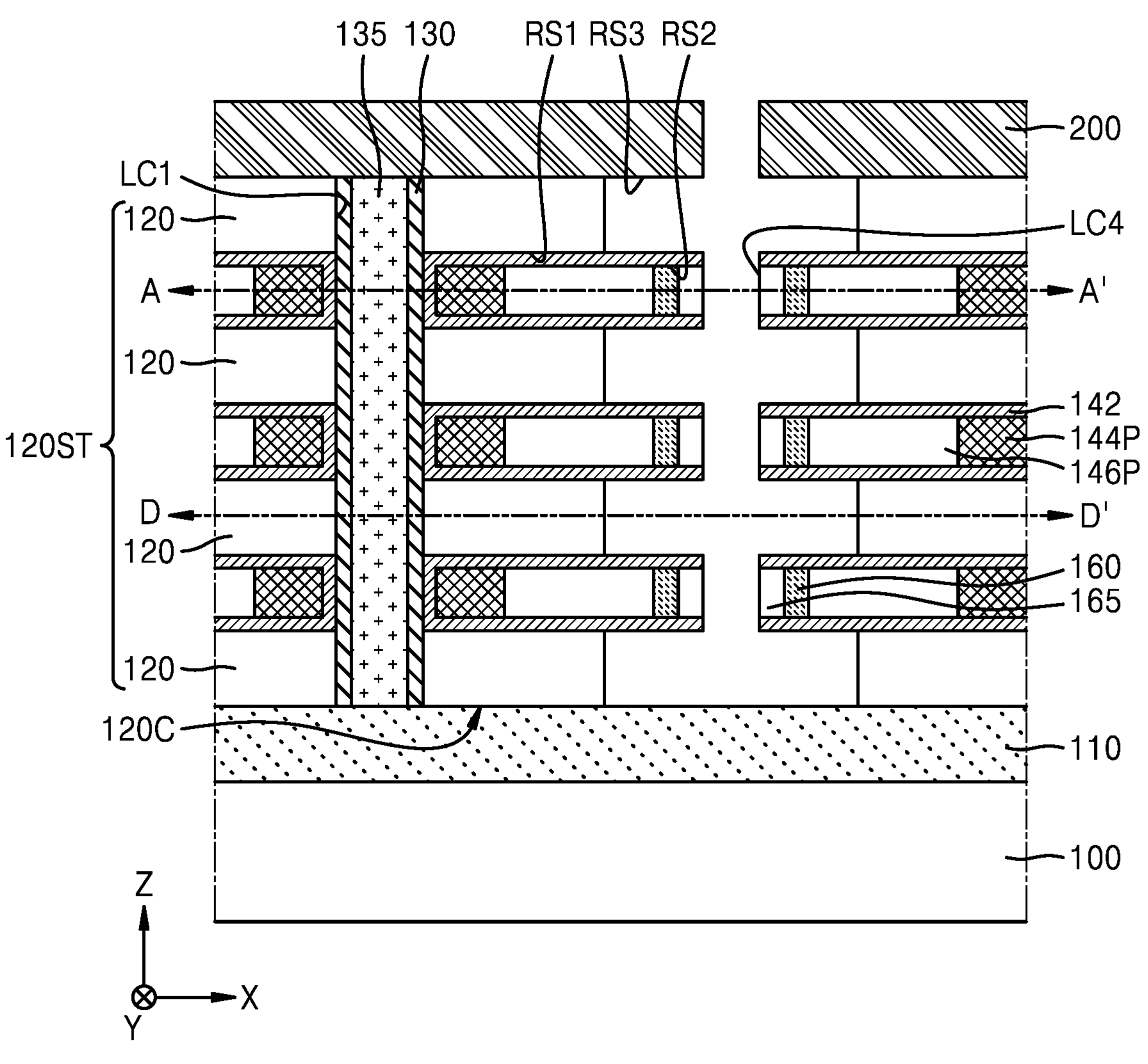
Figure 13D:
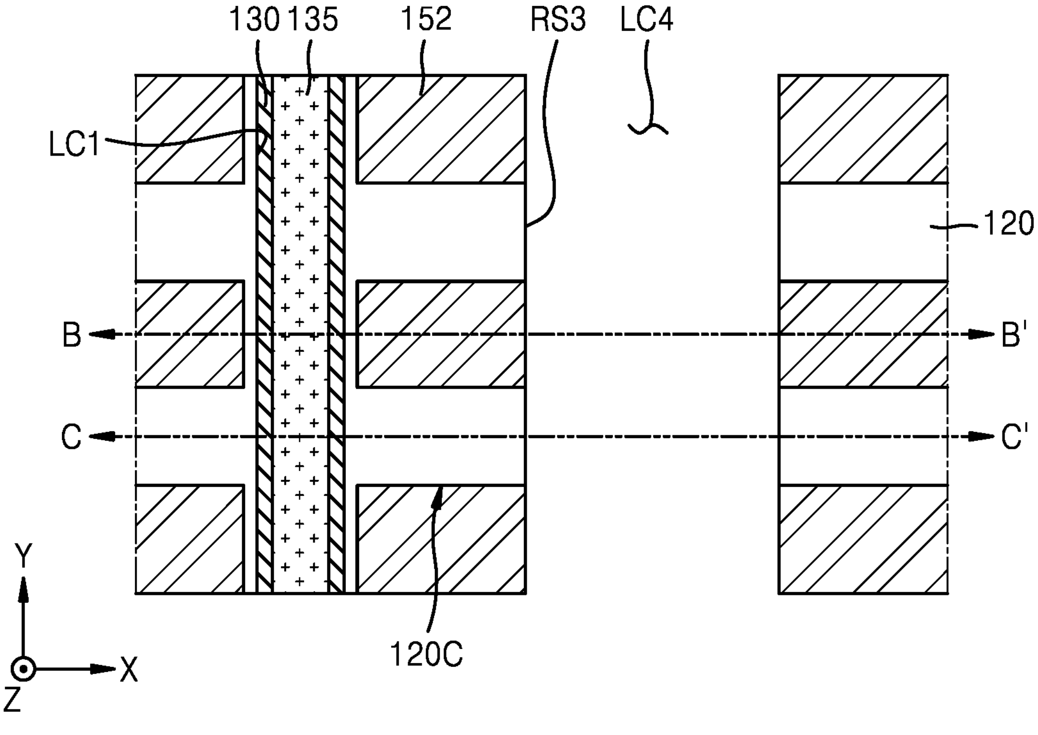
Figure 14A:
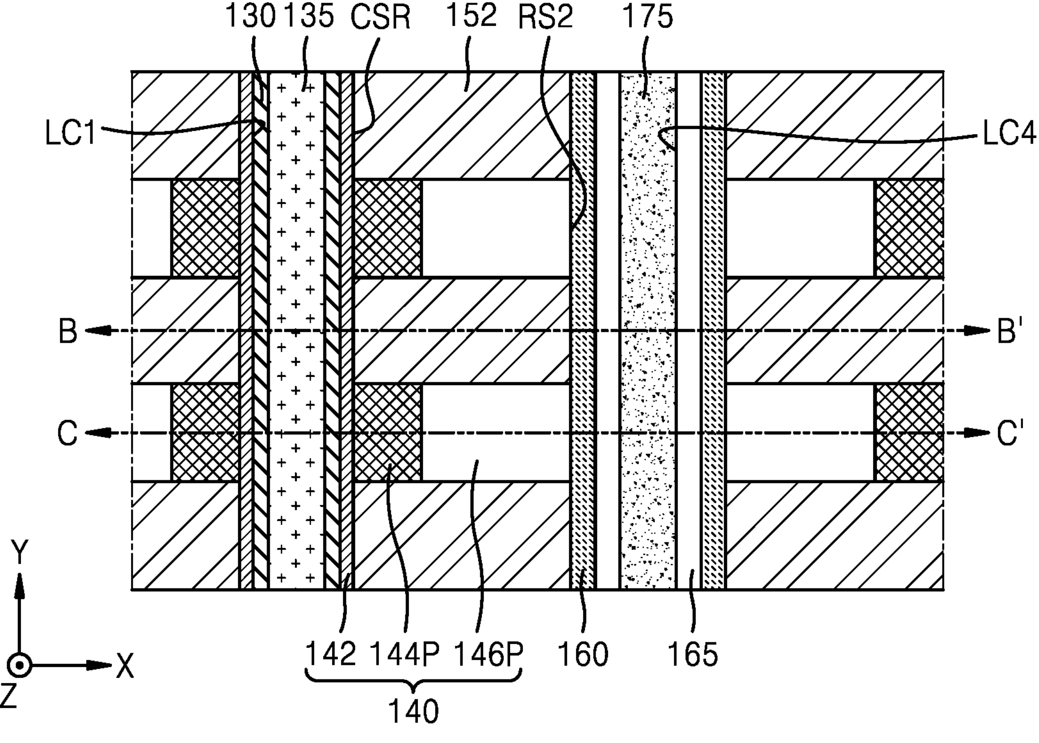
Figure 14B:
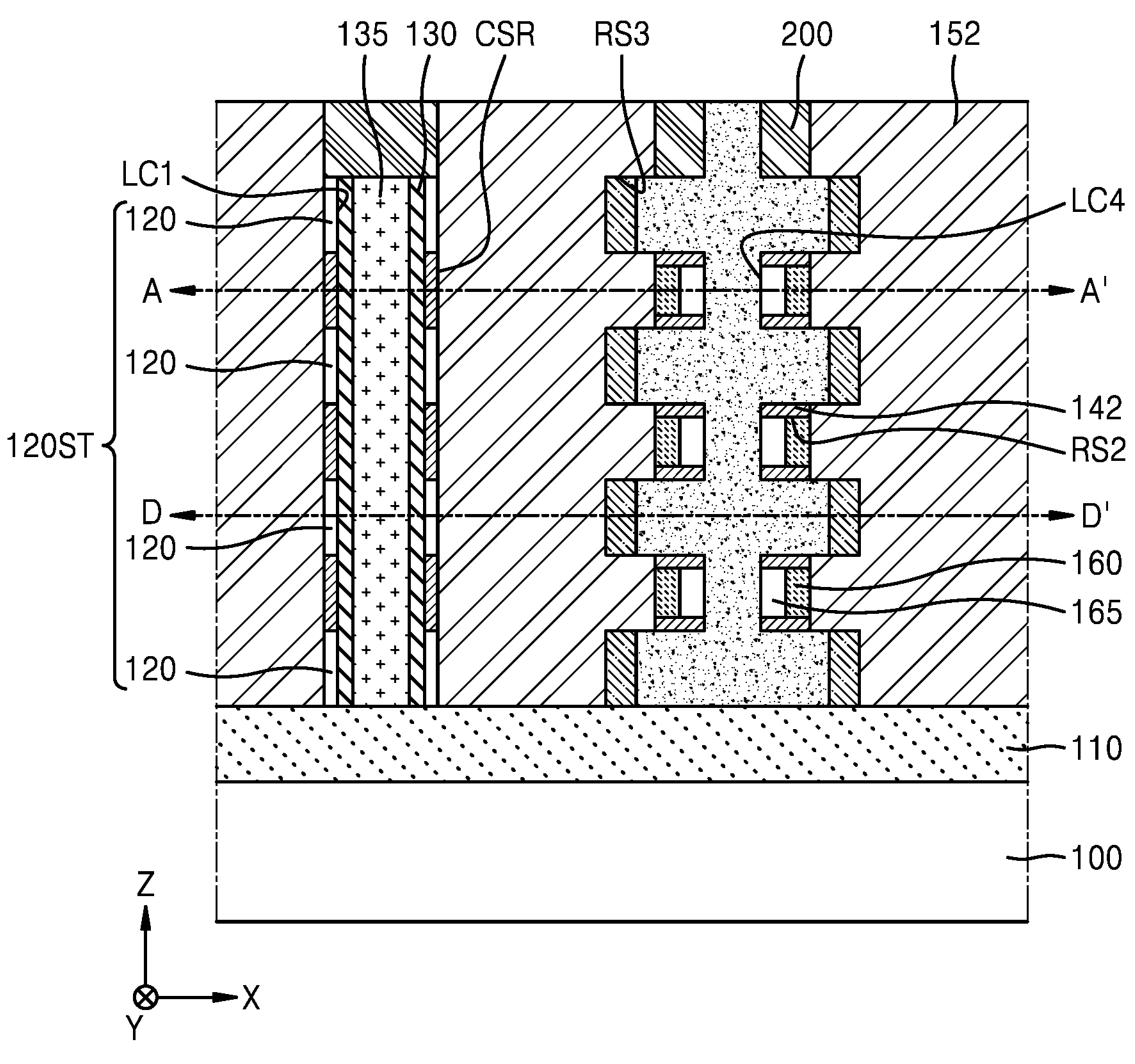
Figure 14C:
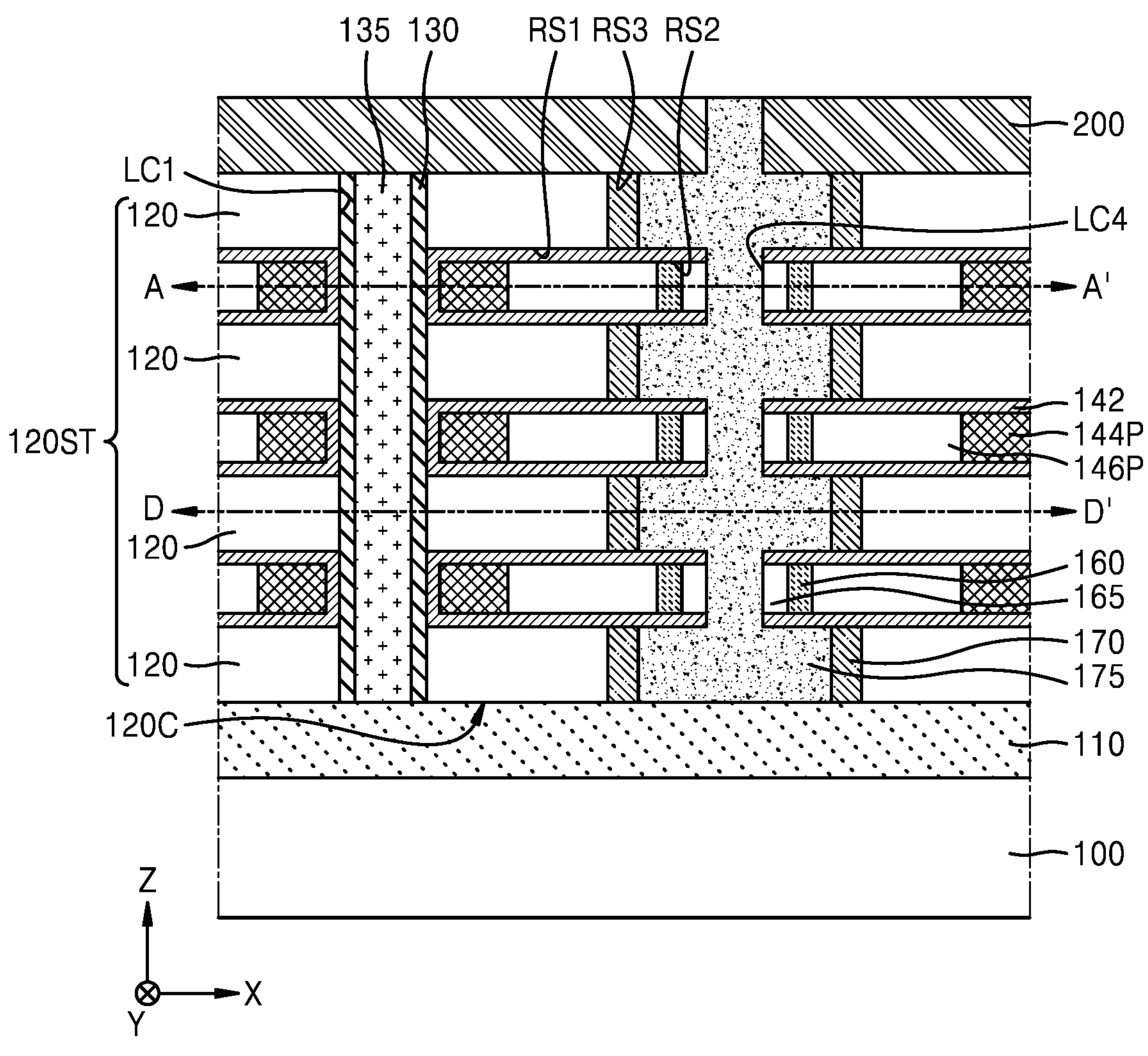
Figure 14D:
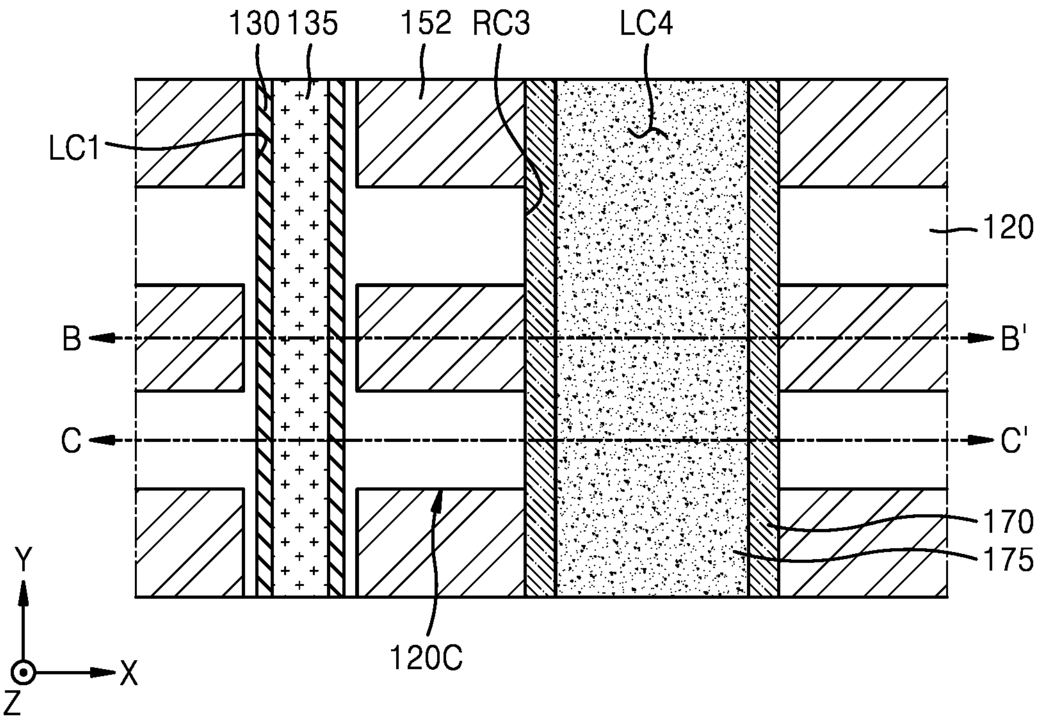
Figure 15A:
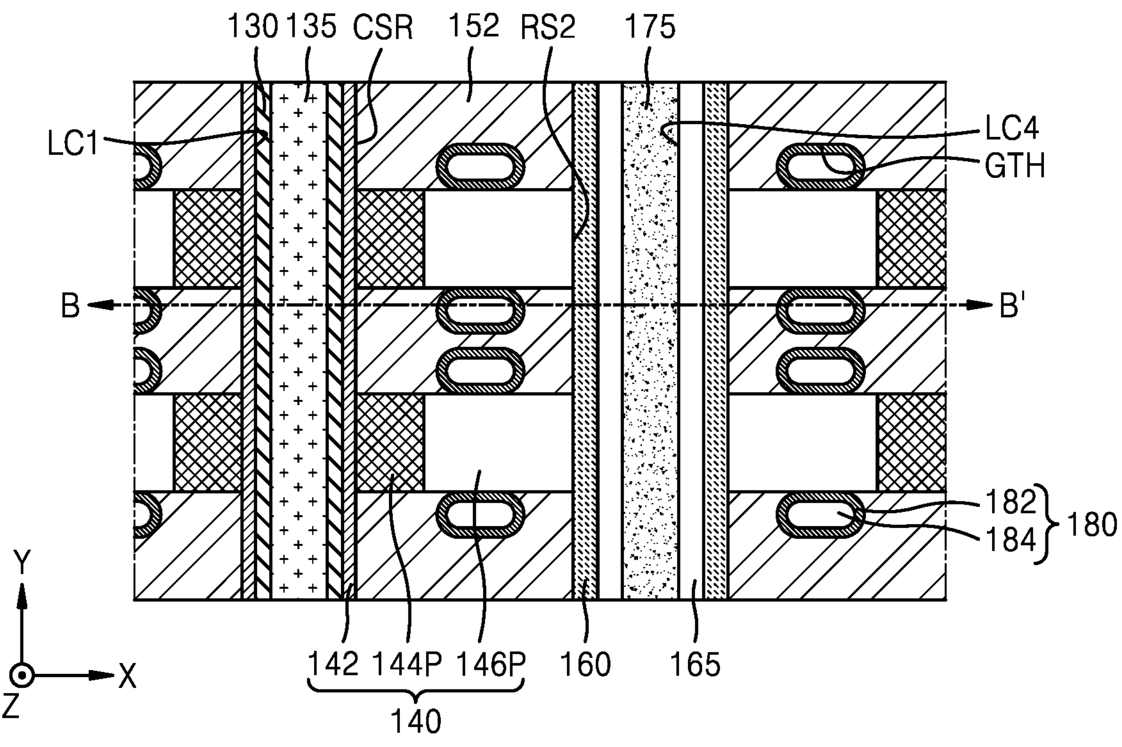
Figure 15B:
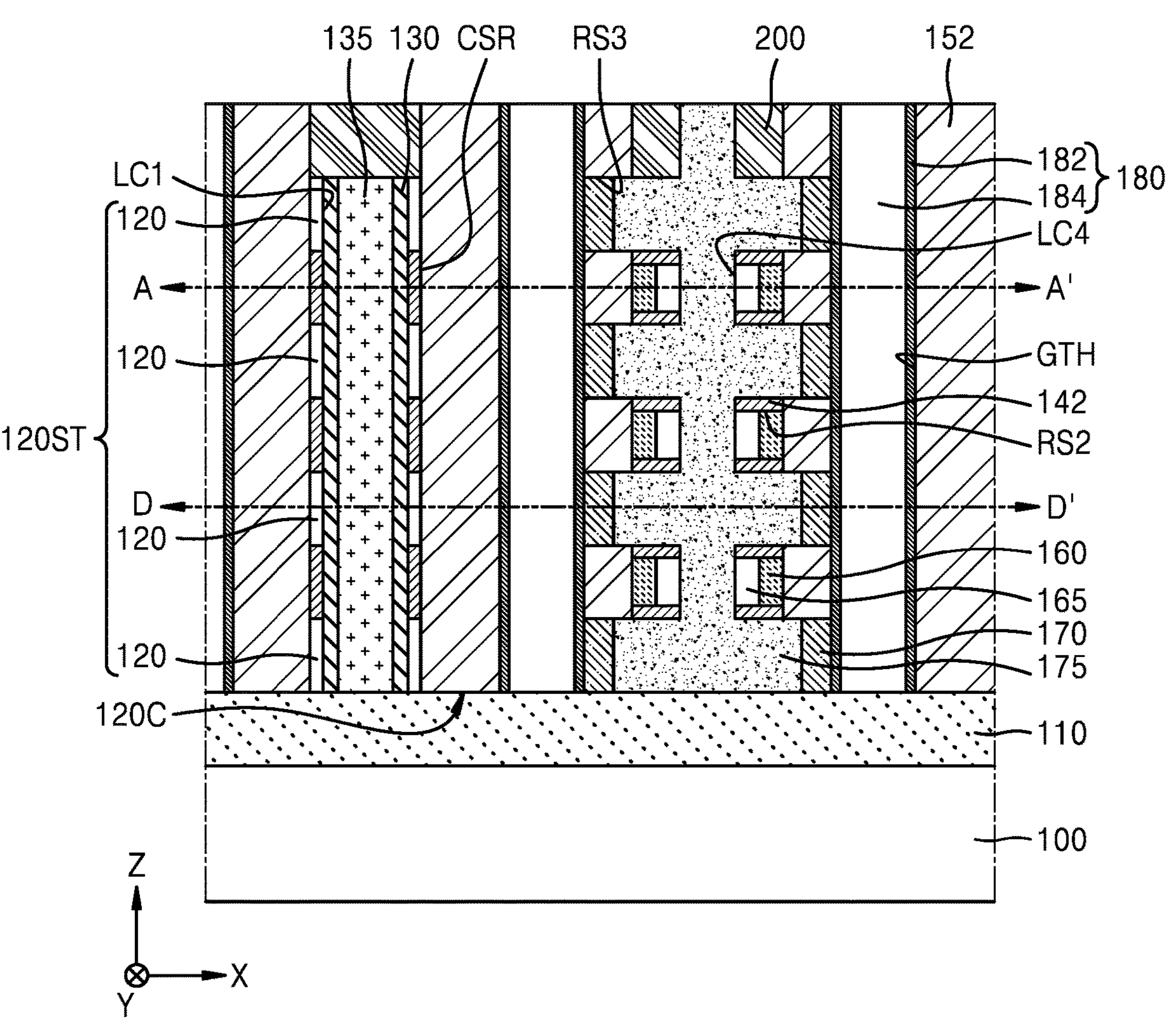
Figure 15C:
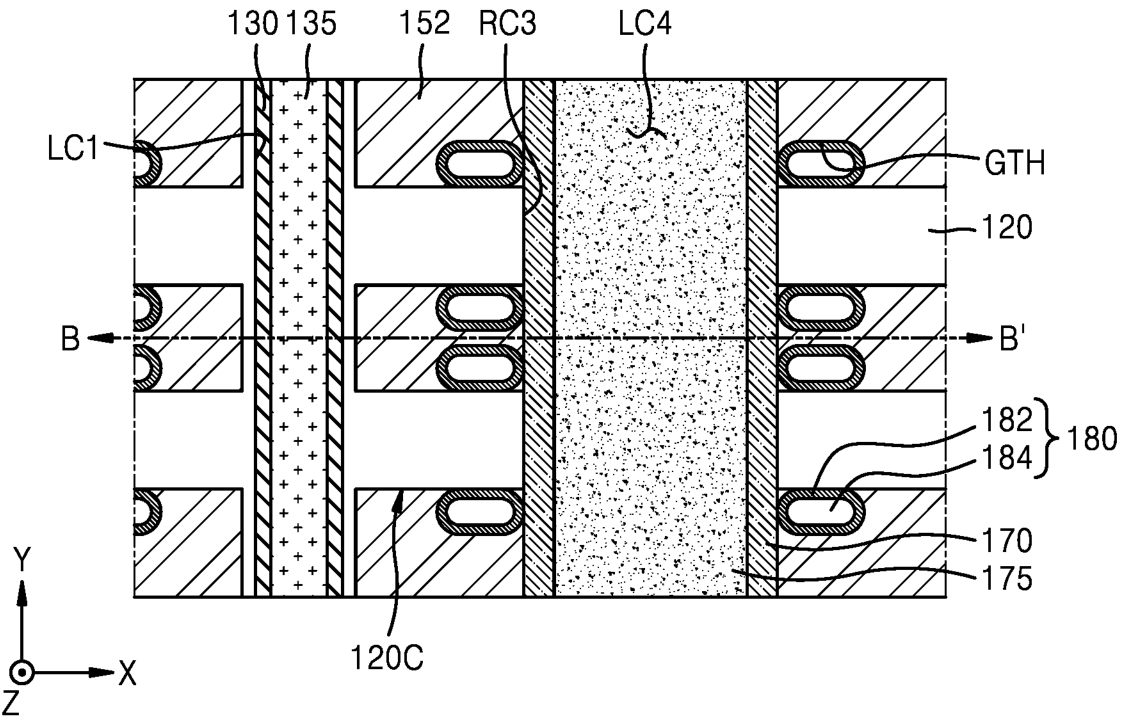

FIGS. 2A to 15C are views illustrating a method of manufacturing a semiconductor memory device, according to embodiments. Specifically, FIGS. 2A, 3A, 4A, 5A, 6A, and 7A are horizontal cross-sectional views taken along the line A-A' of FIGS. 2B, 3B, 4B, 5B, 6B, and 7B, and FIGS. 2B, 3B, 4B, 5B, 6B, and 7B are vertical cross-sectional views taken along the line B-B' of FIGS. 2A, 3A, 4A, 5A, 6A, and 7A. FIG. 8A is a horizontal cross-sectional view taken along the line A-A' of FIGS. 8B and 8C, FIG. 8B is a vertical cross-sectional view taken along the line B-B' of FIGS. 8A and 8D, FIG. 8C is a vertical cross-sectional view taken along the line C-C' of FIGS. 8A and 8D, and FIG. 8D is a vertical cross-sectional view taken along the line D-D' of FIGS. 8B and 8C. FIGS. 9A, 10A, 11A, and 12A are horizontal cross-sectional views taken along the line A-A' of FIGS. 9B, 9C, 10B, 10C, 11B, 11C, 12B, and 12C, FIGS. 9B, 10B, 11B, and 12B are vertical cross-sectional views taken along the line B-B' of FIGS. 9A, 10A, 11A, and 12A, and FIGS. 9C, 10C, 11C, and 12C are vertical cross-sectional views taken along the line C-C' of FIGS. 9A, 10A, 11A, and 12A. FIGS. 13A and 14A are horizontal cross-sectional views taken along the line A-A' of FIGS. 13B, 13C, 14B, and 14C, FIGS. 13B and 14B are vertical cross-sectional views taken along the line B-B' of FIGS. 13A, 13D, 14A, and 14D, FIGS. 13C and 14C are vertical cross-sectional views taken along the line C-C' of FIGS. 13A, 13D, 14A, and 14D, and FIGS. 13D and 14D are vertical cross-sectional views taken along the line D-D' of FIGS. 13B, 13C, 14B, and 14C. FIG. 15A is a horizontal cross-sectional view taken along the line A-A' of FIG. 15B, FIG. 15B is a vertical cross-sectional view taken along line B-B' of FIG. 15A, and FIG. 15C is a horizontal cross-sectional view taken along line C-C' of FIG. 15B.

Figure 2B:
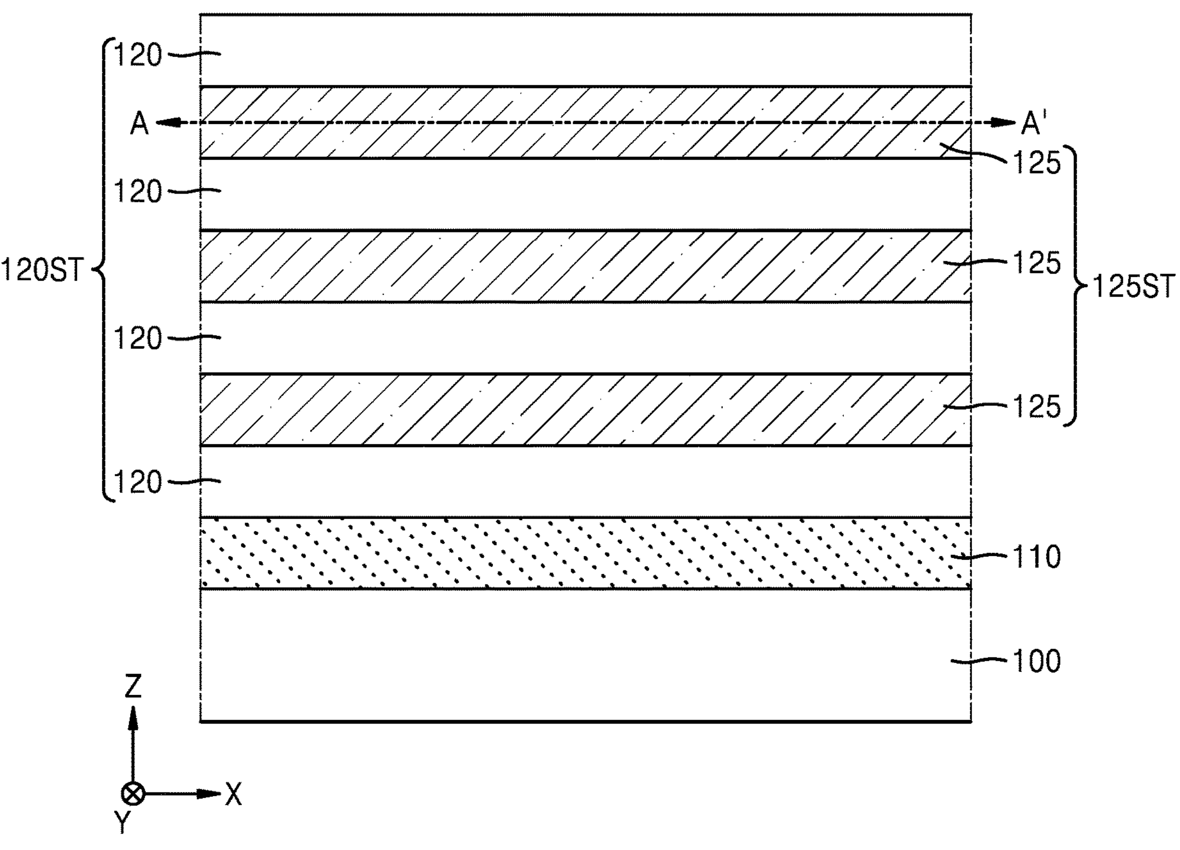

Referring to FIGS. 2A and 2B, a plurality of semiconductor layers 120 and a plurality of sacrificial layers 125 are formed on a substrate 100. The plurality of semiconductor layers 120 and the plurality of sacrificial layers 125 may be alternately stacked on the substrate 100. The plurality of semiconductor layers 120 may be referred to as a stacked semiconductor structure 120ST and the plurality of sacrificial layers 125 may be referred to as a stacked sacrificial structure 125ST. The stacked semiconductor structure 120ST may include the plurality of semiconductor layers 120 arranged on the substrate 100 to be spaced apart from one another in the vertical direction (a Z direction). The stacked sacrificial structure 125ST may include the plurality of sacrificial layers 125 arranged on the substrate 100 to be spaced apart from one another in the vertical direction (the Z direction). A base insulating layer 110 may be arranged between the substrate 100 and the stacked semiconductor structure 120ST. For example, the stacked semiconductor structure 120ST may be formed on the base insulating layer 110.

FIG. 2B illustrates that the stacked semiconductor structure 120ST includes four semiconductor layers 120 spaced apart from one another in the vertical direction (the Z direction), and the stacked sacrificial structure 125ST includes three sacrificial layers 125 each filling a space between two adjacent semiconductor layers 120 in the vertical direction (the Z direction). However, the present disclosure is not limited thereto. For example, the stacked semiconductor structure 120ST may include five or more or dozens to hundreds of semiconductor layers 120, and the stacked sacrificial structure 125ST may include one less sacrificial layer 125 than the number of semiconductor layers 120 included in the stacked semiconductor structure 120ST so that each of the sacrificial layers 125 fills a space between two adjacent semiconductor layers 120 in the vertical direction (the Z direction). In one variation, the stacked sacrificial structure 125ST may include the same number of sacrificial layers 125 as the number of semiconductor layers 120 so that the sacrificial layers 125 are arranged on top surfaces or bottom surfaces of the semiconductor layers 120. In one variation, the stacked sacrificial structure 125ST may include one more sacrificial layer 125 than the number of semiconductor layers 120 so that the sacrificial layers 125 are arranged on the top surface and the bottom surfaces of the semiconductor layers 120.

The substrate 100 may include, for example, silicon (Si), such as crystalline Si, polycrystalline Si, or amorphous Si. Alternatively, the substrate 100 may include a semiconductor element, such as germanium (Ge), or at least one compound semiconductor selected from silicon germanium (SiGe), silicon carbide (SiC), gallium arsenide (GaAs), indium arsenide (InAs), and indium phosphide (InP). Alternatively, the substrate 100 may include a silicon-on-insulator (SOI) substrate or a germanium-on-insulator (GeOI) substrate. For example, the substrate 100 may include a buried oxide (BOX) layer. The substrate 100 may include a conductive region, for example, a well doped with impurities or a structure doped with impurities.

The base insulating layer 110 may include, for example, silicon oxide, silicon nitride, silicon oxynitride, or a combination thereof.

The semiconductor layer 120 and the sacrificial layer 125 may include materials having different etching selectivities. For example, the semiconductor layer 120 may include polysilicon and the sacrificial layer 125 may include oxide. In some embodiments, the semiconductor layer 120 may include a two dimensional (2D) material semiconductor. For example, the 2D material semiconductor may include $MoS_2$, $WSe_2$, graphene, carbon nano tube, or a combination thereof.

Figure 3A:
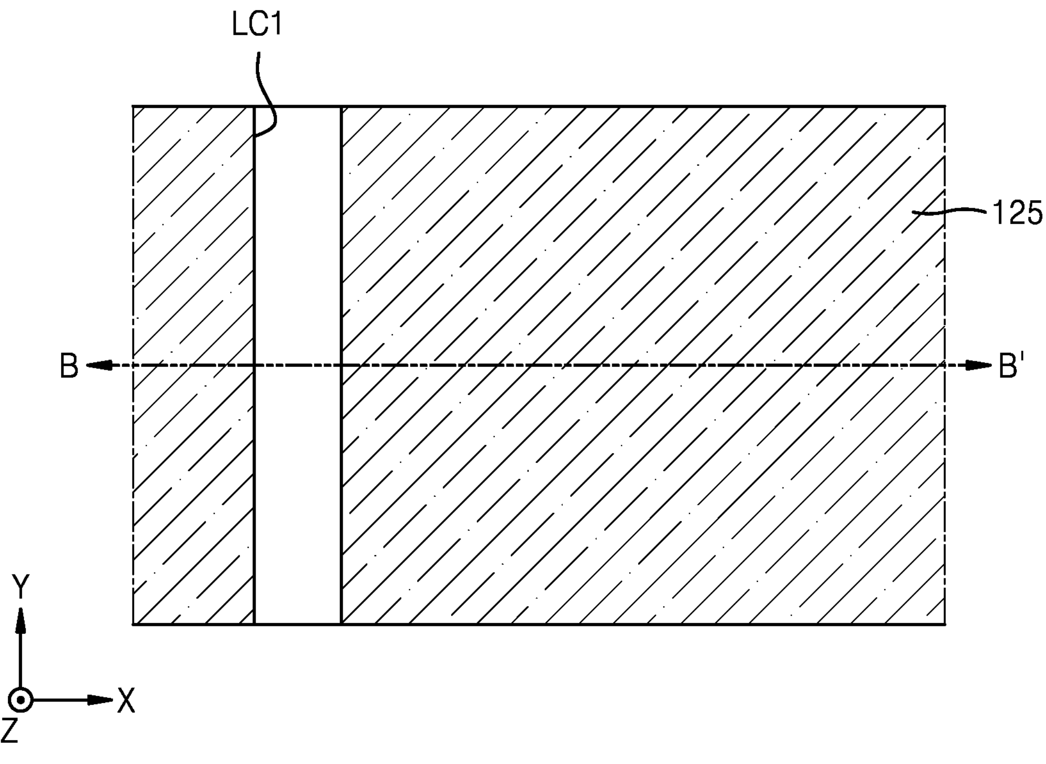
Figure 3B:
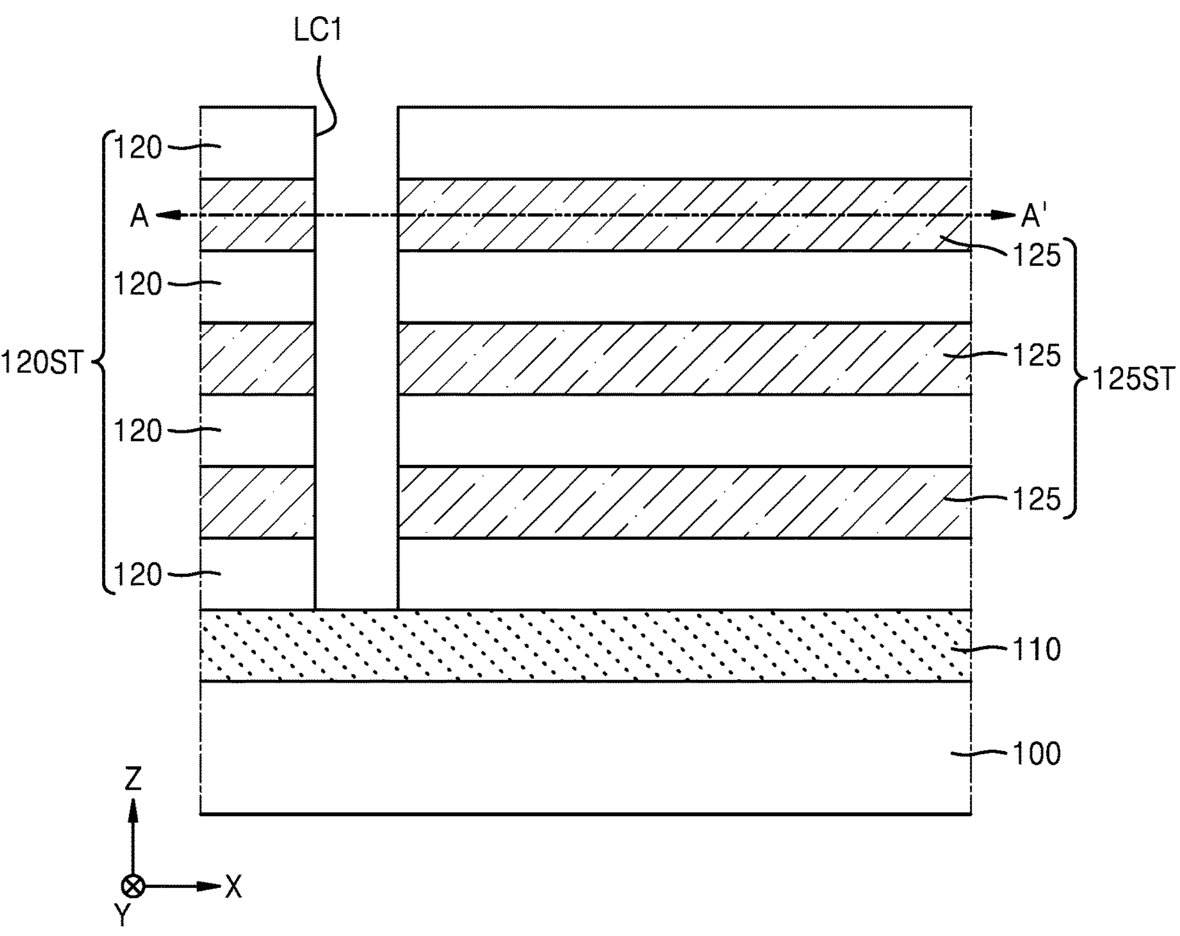

Referring to FIGS. 3A and 3B, a first line cut region LC1 that extends through the stacked semiconductor structure 120ST and the stacked sacrificial structure 125ST is formed. The first line cut region LC1 may have a substantially constant width in the first horizontal direction (the X direction) and may extend in the second horizontal direction (the Y direction) orthogonal to the first horizontal direction (the X direction). In some embodiments, a plurality of first line cut regions LC1 may be spaced apart from one another in the first horizontal direction (the X direction) and may extend in the second horizontal direction (the Y direction). The first line cut region LC1 may extend in the vertical direction (the Z direction) from the uppermost end to the lowermost end of the stacked semiconductor structure 120ST. The base insulating layer 110 may be exposed on a bottom surface of the first line cut region LC1. In some embodiments, the first line cut region LC1 may extend through the base insulating layer 110, the stacked semiconductor structure 120ST, and the stacked sacrificial structure 125ST.

Figure 4A:
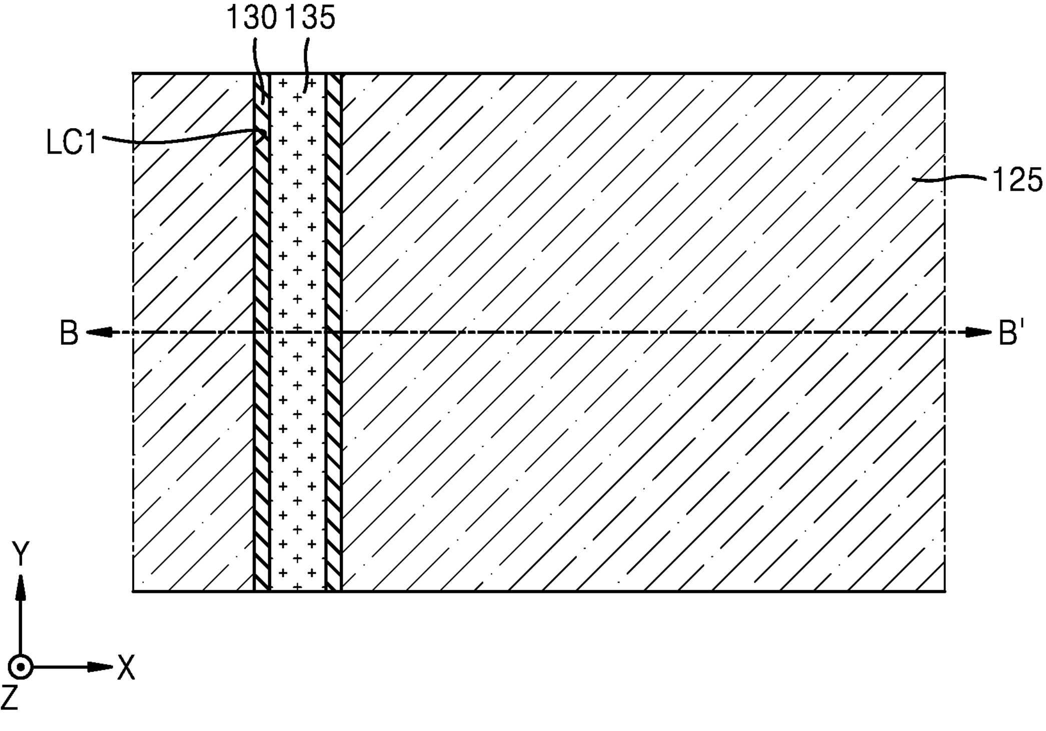
Figure 4B:
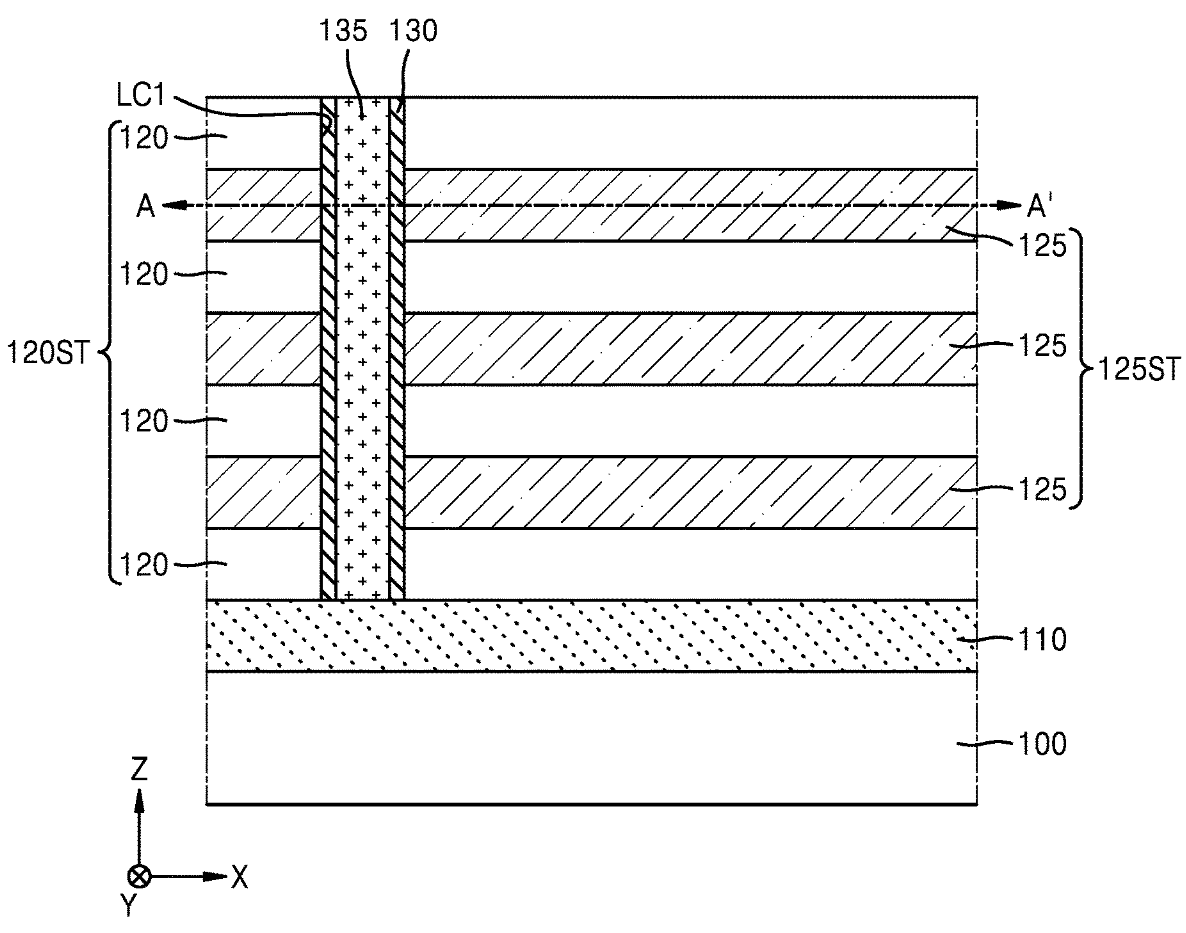

Referring to FIGS. 4A and 4B, a vertical channel layer 130 overlapping or covering side surfaces of the stacked semiconductor structure 120ST and the stacked sacrificial structure 125ST exposed in the first line cut region LC1 and a first filling insulating layer 135 overlapping or covering the vertical channel layer 130 and the first line cut region LC1 are formed. The vertical channel layer 130 may be obtained by forming a vertical channel material layer conformally covering a top surface of a structure formed by the stacked semiconductor structure 120ST and the stacked sacrificial structure 125ST and internal and bottom surfaces of the first line cut region LC1. Then, the vertical channel material layer covering top surfaces of the stacked semiconductor structure 120ST and the stacked sacrificial structure 125ST and the bottom surface of the first line cut region LC1 is partially removed. The vertical channel layer 130 may contact and be connected to the plurality of semiconductor layers 120 exposed in the first line cut region LC1.

The top surface of the structure formed by the stacked semiconductor structure 120ST and the stacked sacrificial structure 125ST refers to a top surface of the semiconductor layer 120 or the sacrificial layer 125 at the uppermost end of the plurality of semiconductor layers 120 included in the stacked semiconductor structure 120ST or the plurality of sacrificial layers 125 included in the stacked sacrificial structure 125ST. The top surface of the structure formed by the stacked semiconductor structure 120ST and the stacked sacrificial structure 125ST is illustrated as the top surface of the uppermost semiconductor layer 120. However, the present disclosure is not limited thereto. When the stacked sacrificial structure 125ST includes the sacrificial layer 125 arranged on the uppermost semiconductor layer 120, the top surface of the structure formed by the stacked semiconductor structure 120ST and the stacked sacrificial structure 125ST may be the top surface of the uppermost sacrificial layer 125.

The vertical channel layer 130 may include a semiconductor material. In some embodiments, the vertical channel layer 130 may include the same material as the semiconductor layer 120. For example, the vertical channel layer 130 may include polysilicon or a 2D material semiconductor. The first filling insulating layer 135 may include silicon oxide or an insulating material having a lower dielectric constant than that of silicon oxide. In some embodiments, the first filling insulating layer 135 may include a tetraethyl orthosilicate (TEOS) layer or an ultra-low K (ULK) layer having a dielectric constant K in a range of about 2.2 to about 2.4. The ULK layer may include a SiOC layer or a SiCOH layer.

Figure 5A:
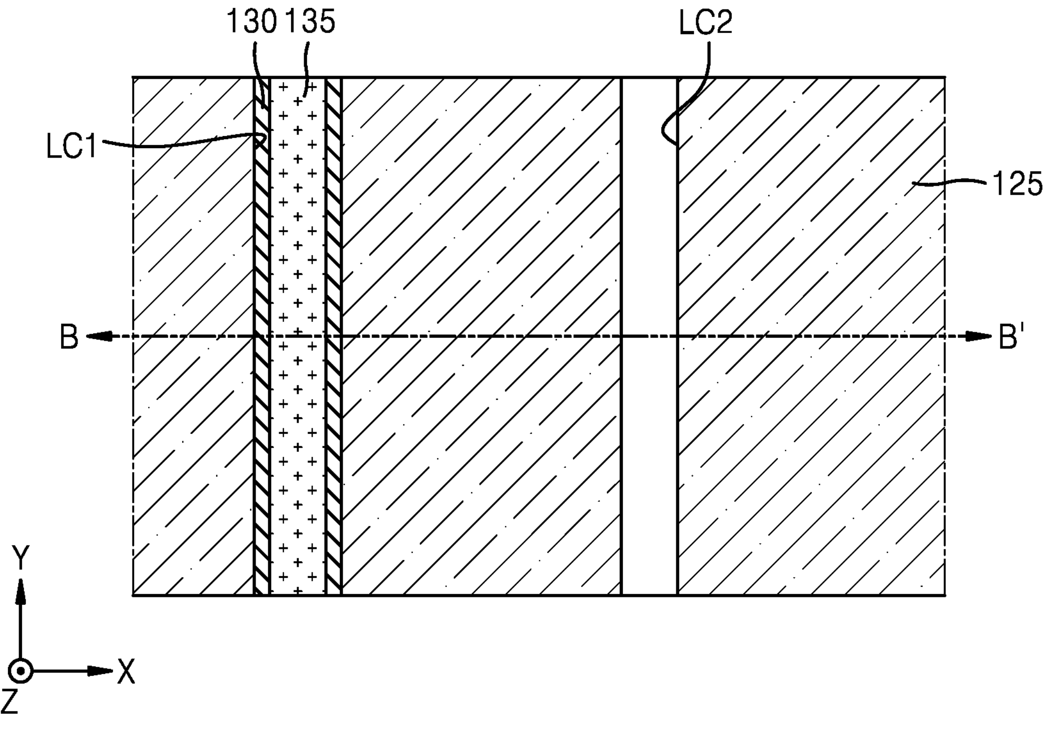
Figure 5B:
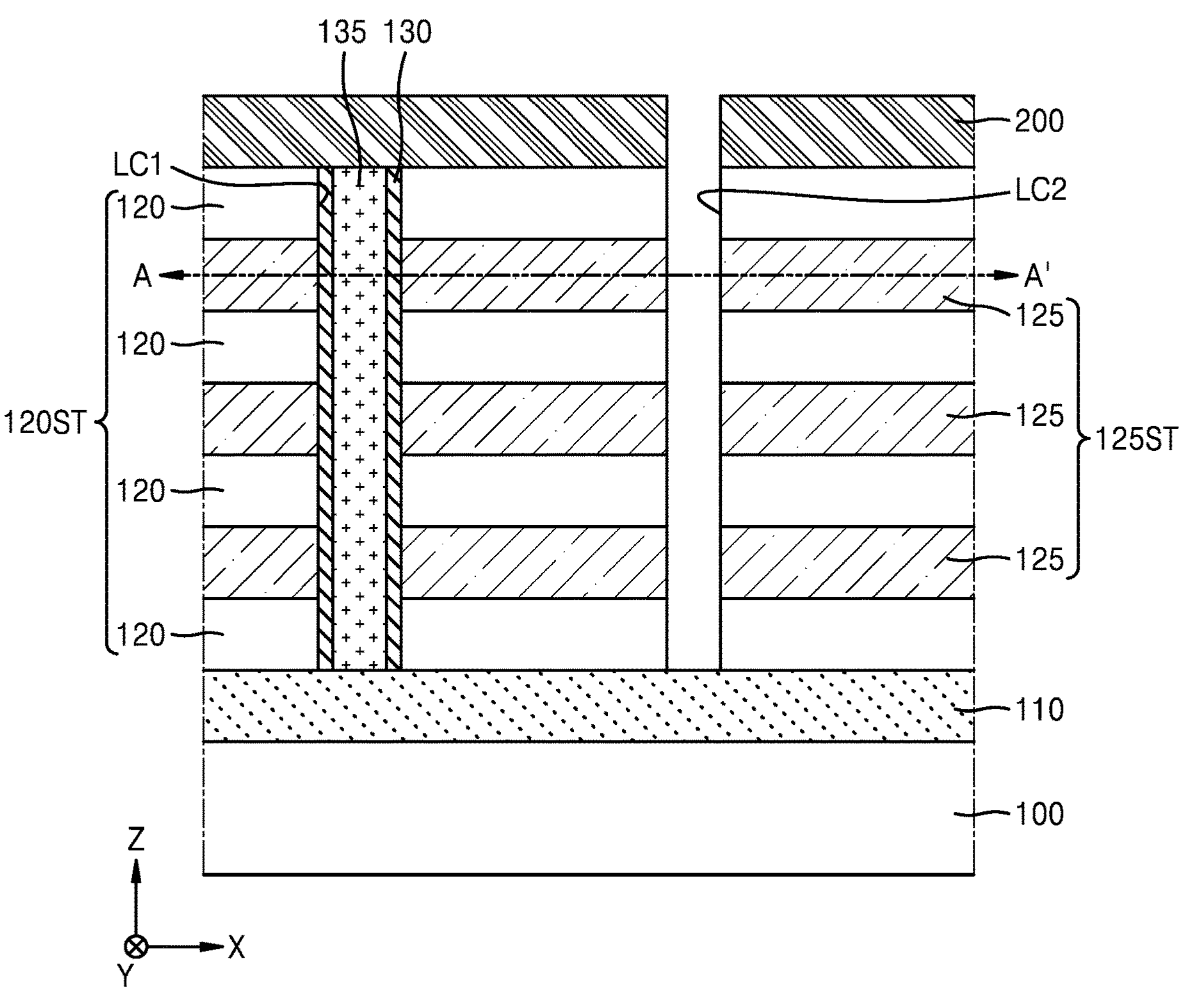
Figure 6A:
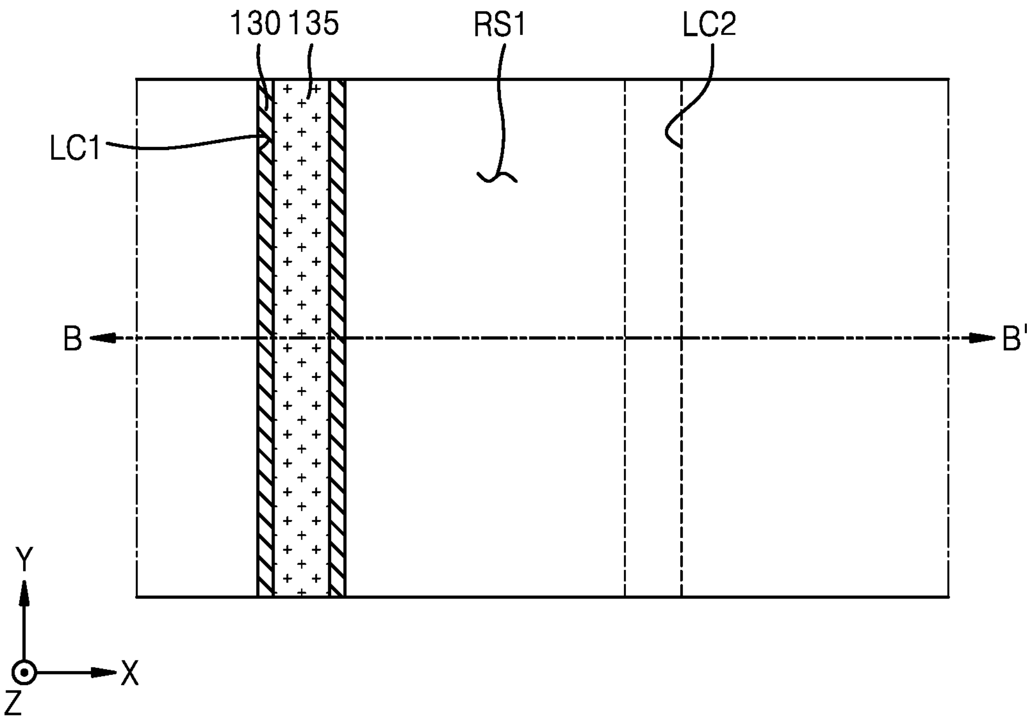
Figure 6B:
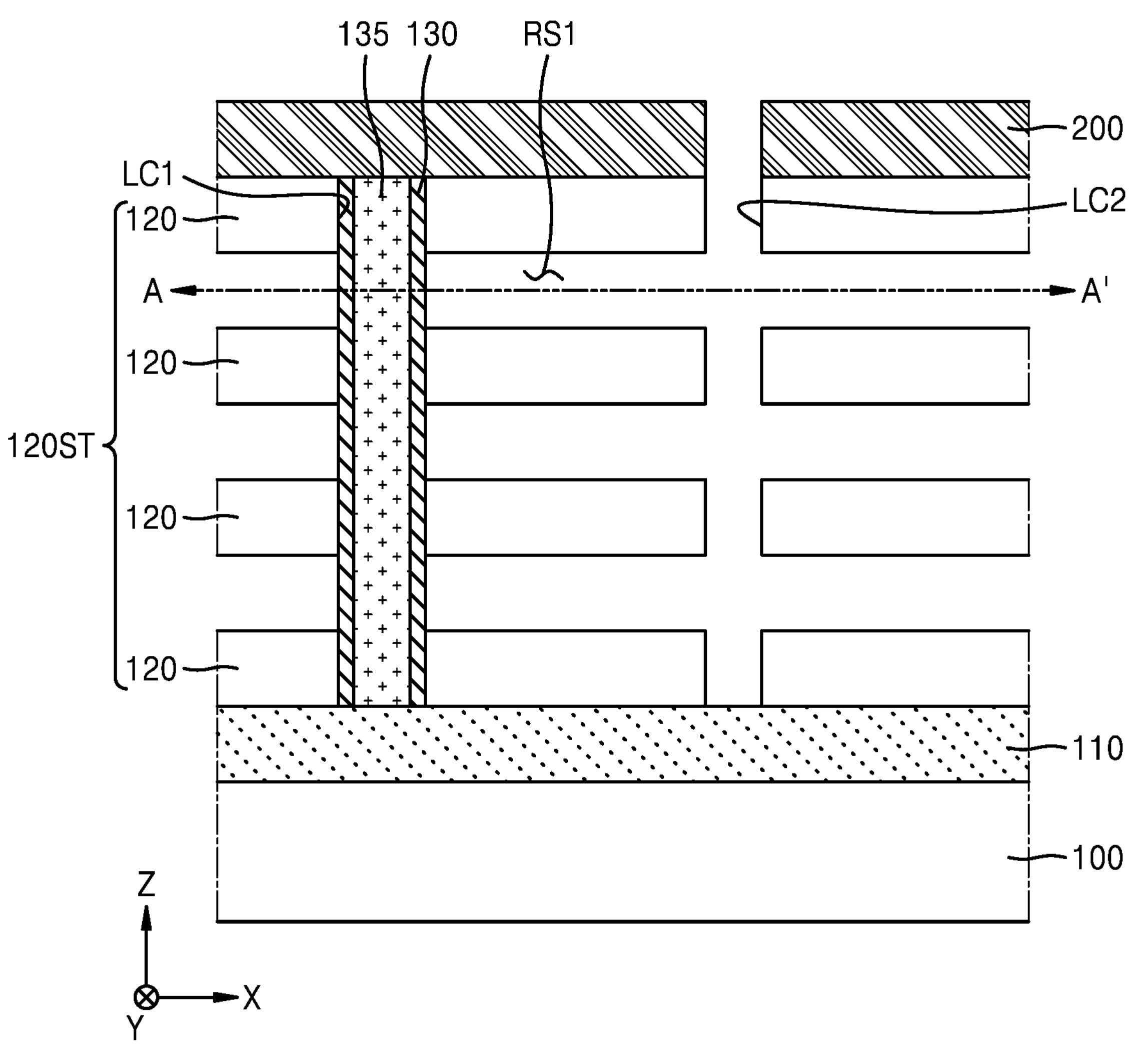

Referring to FIGS. 5A and 5B, a cover insulating layer 200 is formed on the structure comprising the stacked semiconductor structure 120ST and the stacked sacrificial structure 125ST, and then a second line cut region LC2 is formed through the stacked semiconductor structure 120ST and the stacked sacrificial structure 125ST. For example, the cover insulating layer 200 may include silicon nitride. The second line cut region LC2 may have a substantially constant width in the first horizontal direction (the X direction) and may extend in the second horizontal direction (the Y direction) orthogonal to the first horizontal direction (the X direction). In some embodiments, a plurality of second line cut regions LC2 may be spaced apart from one another in the first horizontal direction (the X direction) and may extend in the second horizontal direction (the Y direction). The second line cut region LC2 may extend in the vertical direction (the Z direction) from a top surface of the cover insulating layer 200 to the lowermost end of the stacked semiconductor structure 120ST. The base insulating layer 110 may be exposed on a bottom surface of the second line cut region LC2. In some embodiments, the second line cut region LC2 may extend through the base insulating layer 110, the stacked semiconductor structure 120ST, and the stacked sacrificial structure 125ST.

The second line cut region LC2 may be spaced apart from the first line cut region LC1 in the first horizontal direction (the X direction). In some embodiments, when the plurality of first line cut regions LC1 and the plurality of second line cut regions LC2 are provided, the plurality of first line cut regions LC1 and the plurality of second line cut regions LC2 may be alternately arranged to be spaced apart from one another in the first horizontal direction (the X direction).

Referring to FIGS. 5A, 5B, 6A, and 6B, the stacked sacrificial structure 125ST including the plurality of sacrificial layers 125 is removed through the second line cut region LC2 to form a plurality of first removal spaces RS1. The plurality of first removal spaces RS1 may be connected to the second line cut region LC2. Each of the plurality of first removal spaces RS1 may be between two adjacent semiconductor layers 120 in the vertical direction (the Z direction). Each of the plurality of first removal spaces RS1 may be defined by the two adjacent semiconductor layers 120 in the vertical direction (the Z direction), the vertical channel layer 130, and the second line cut region LC2.

Figure 7A:
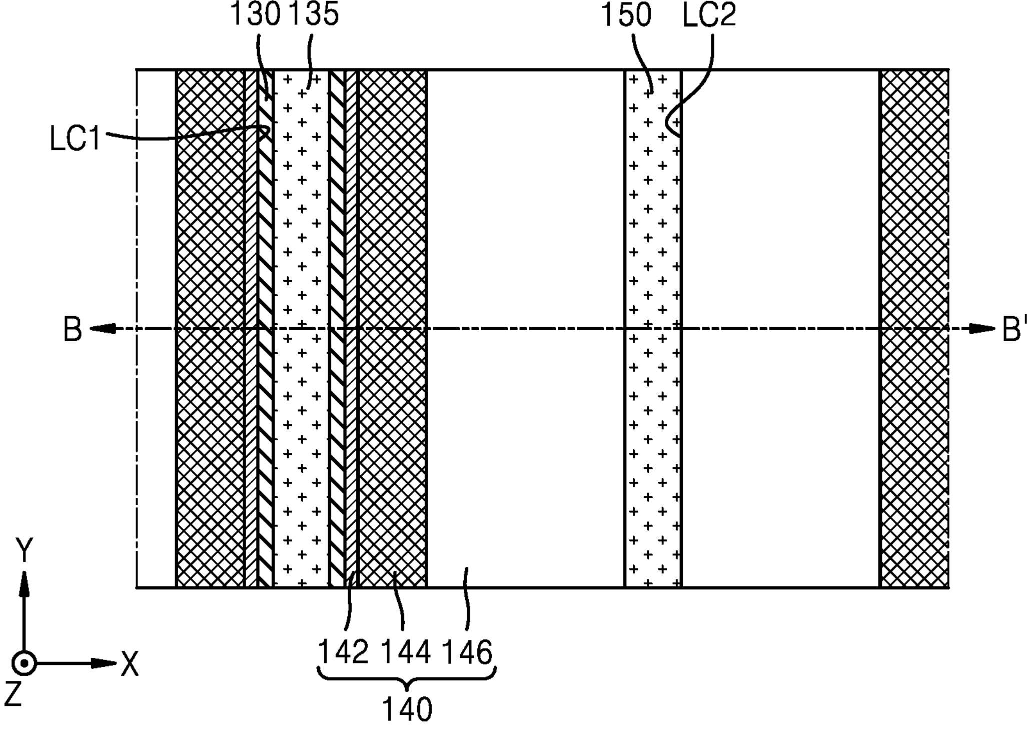
Figure 7B:
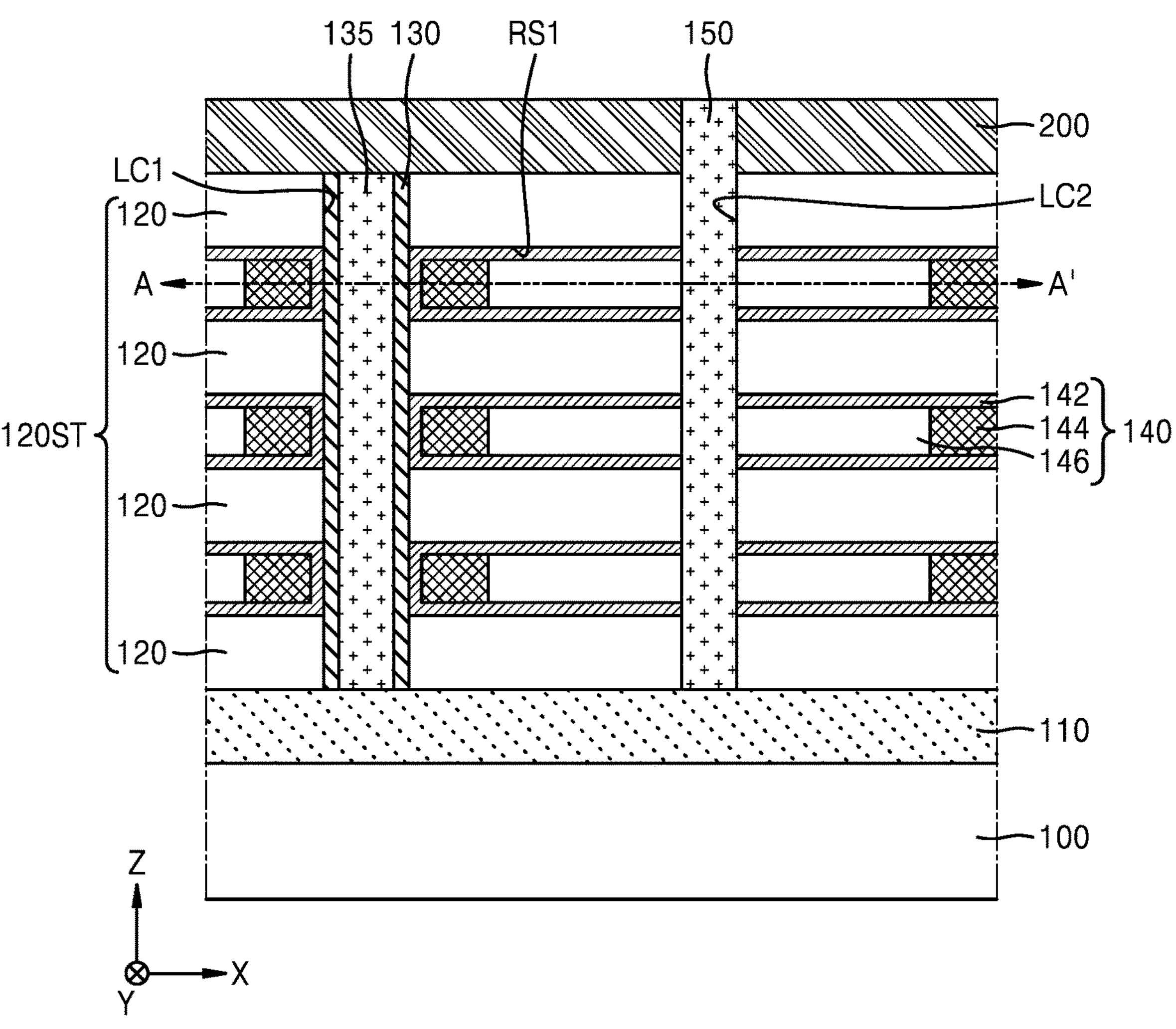
Figure 8A:
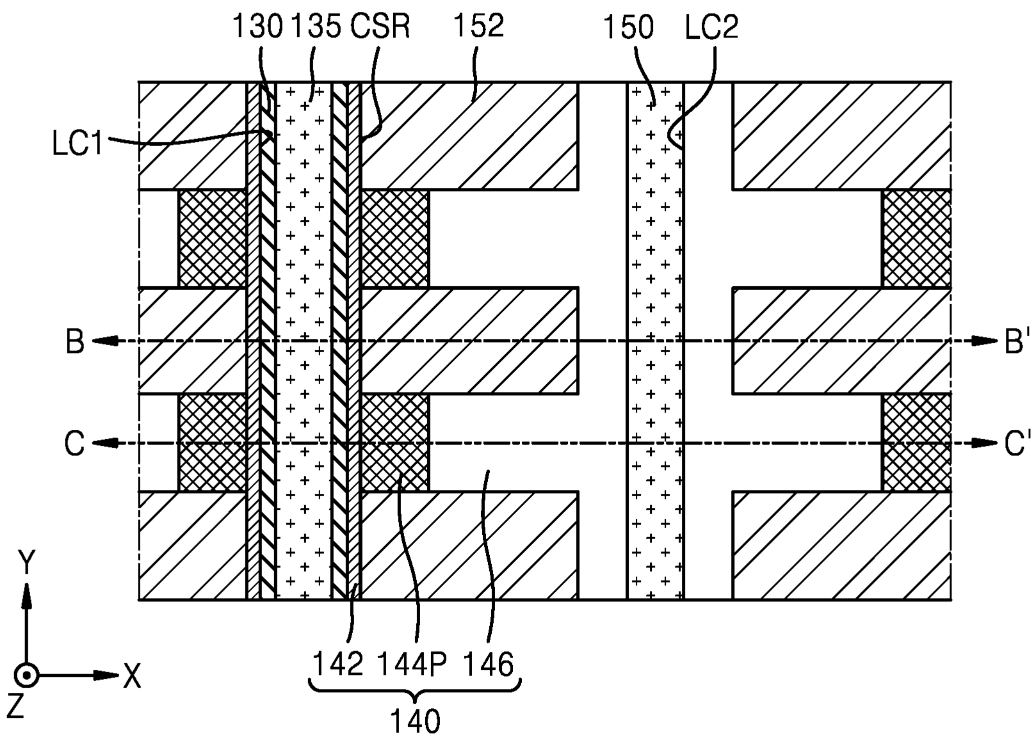
Figure 8B:
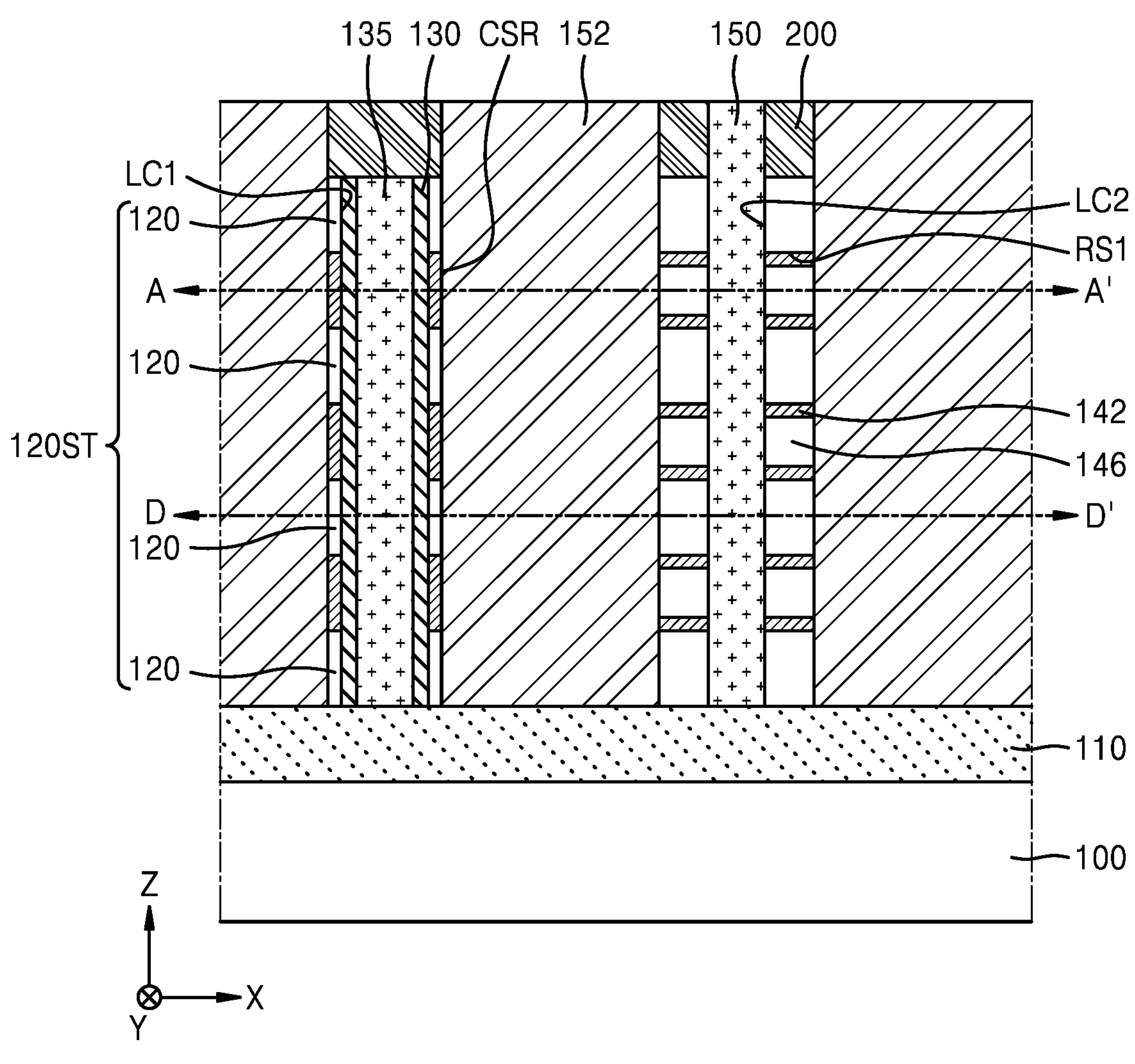
Figure 8C:
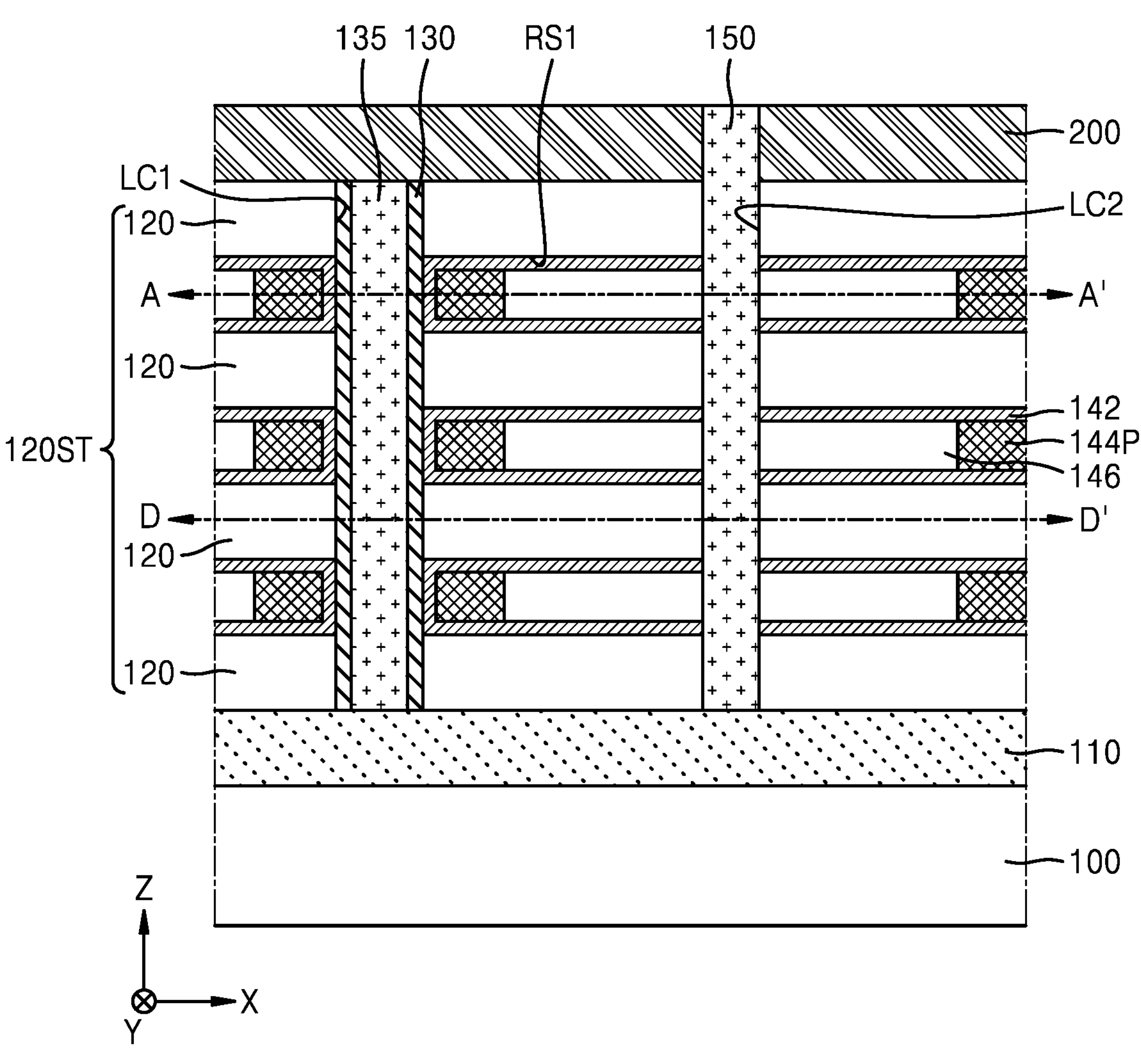
Figure 8D:
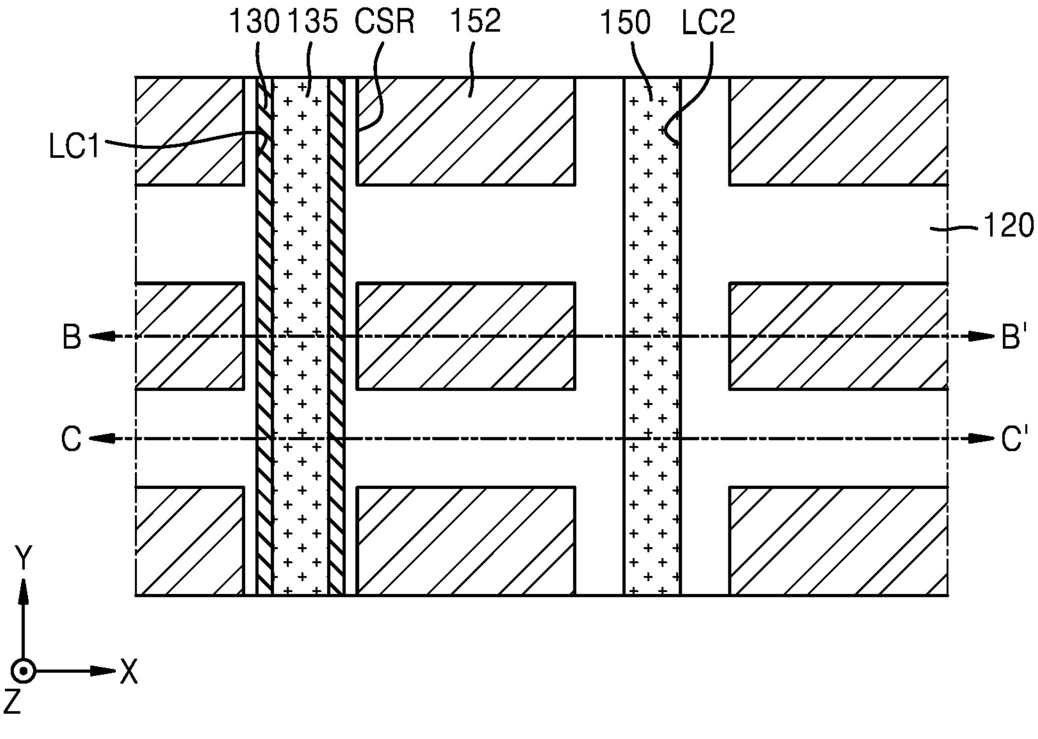
Figure 9A:
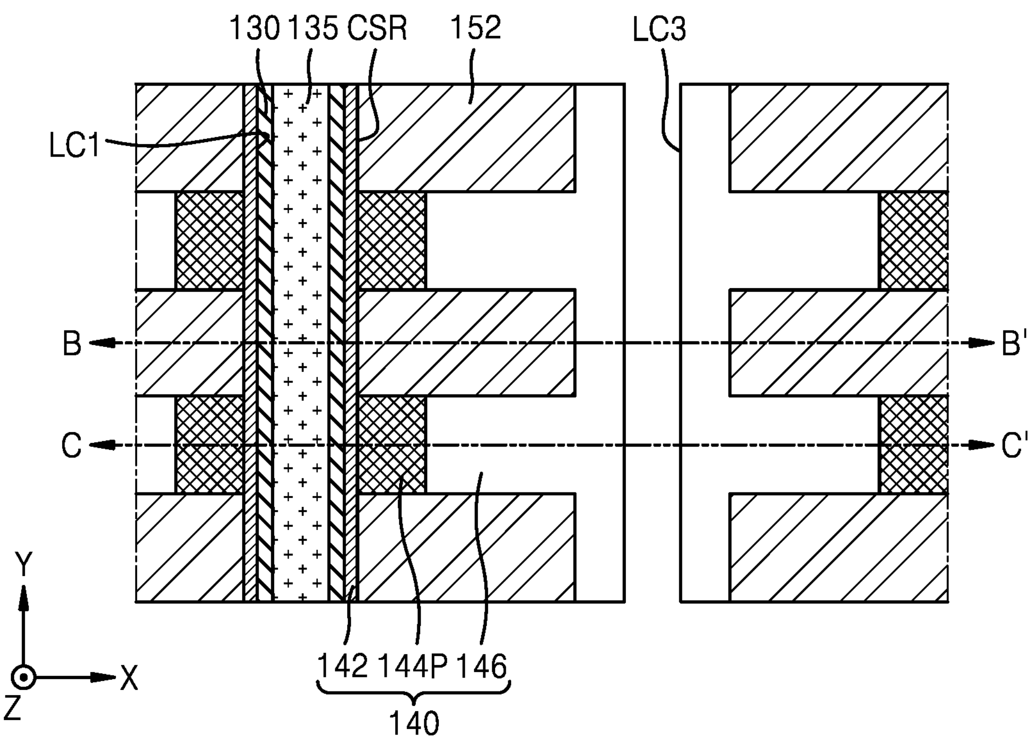
Figure 9B:
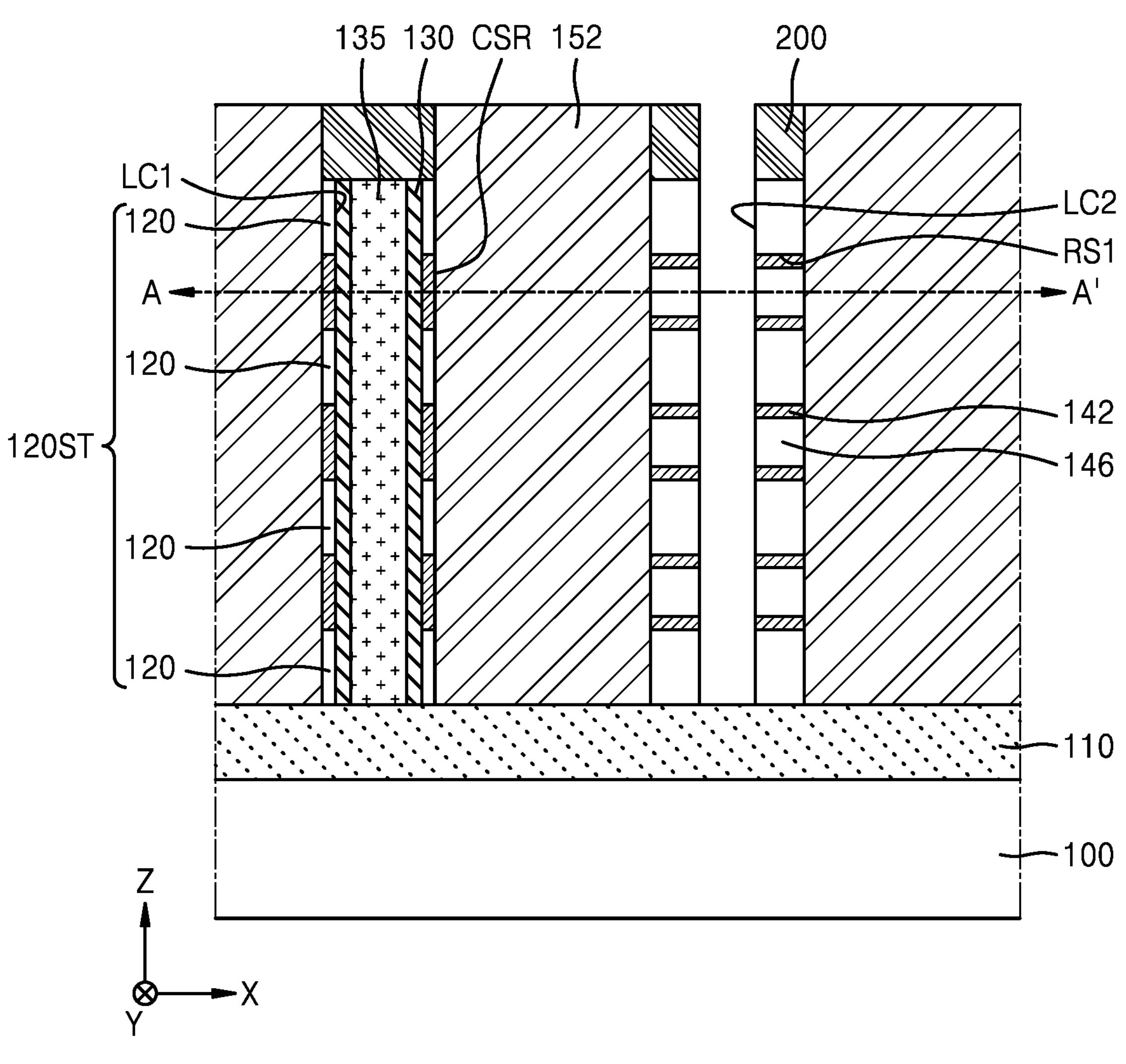
Figure 9C:
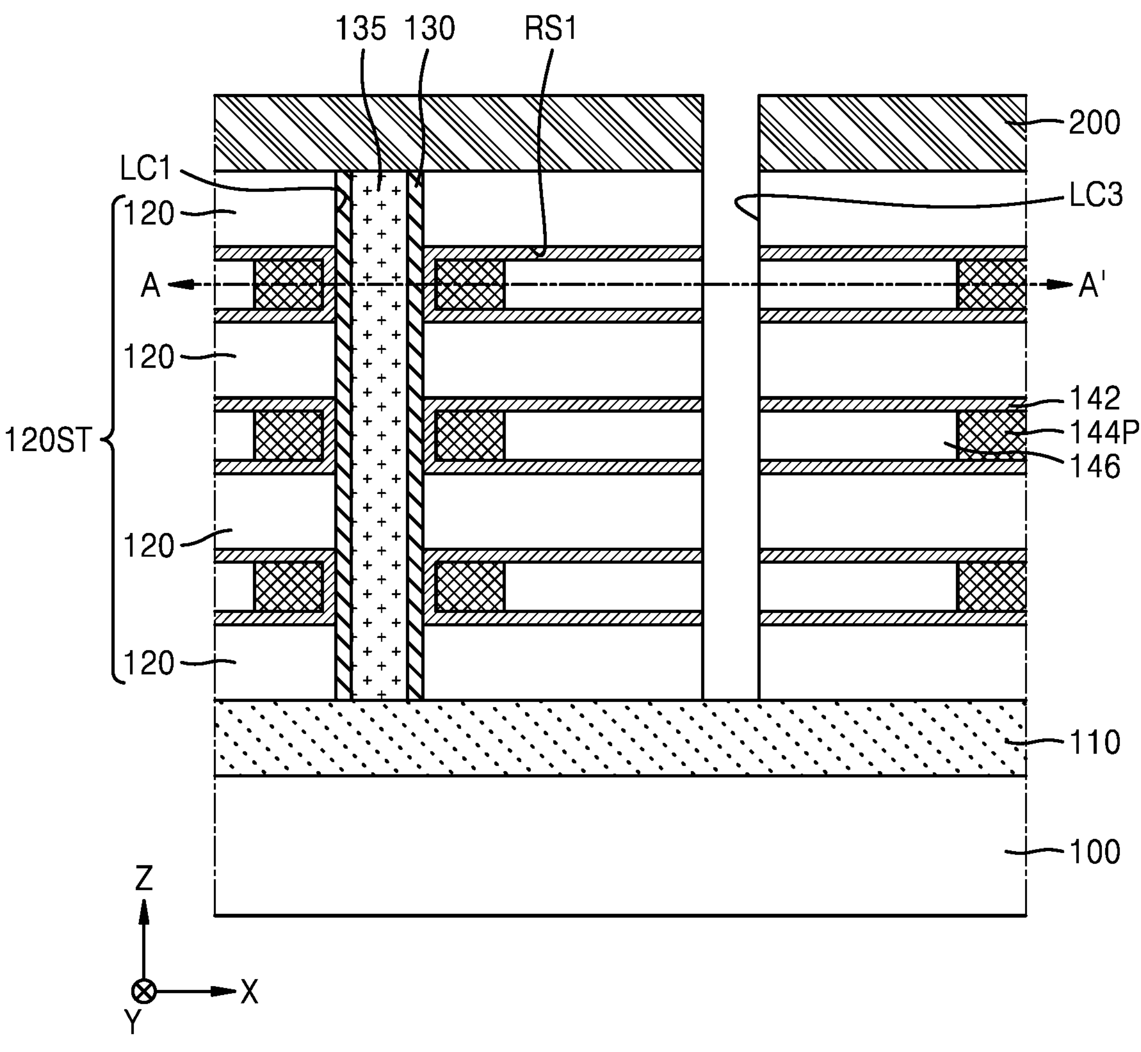
Figure 10A:
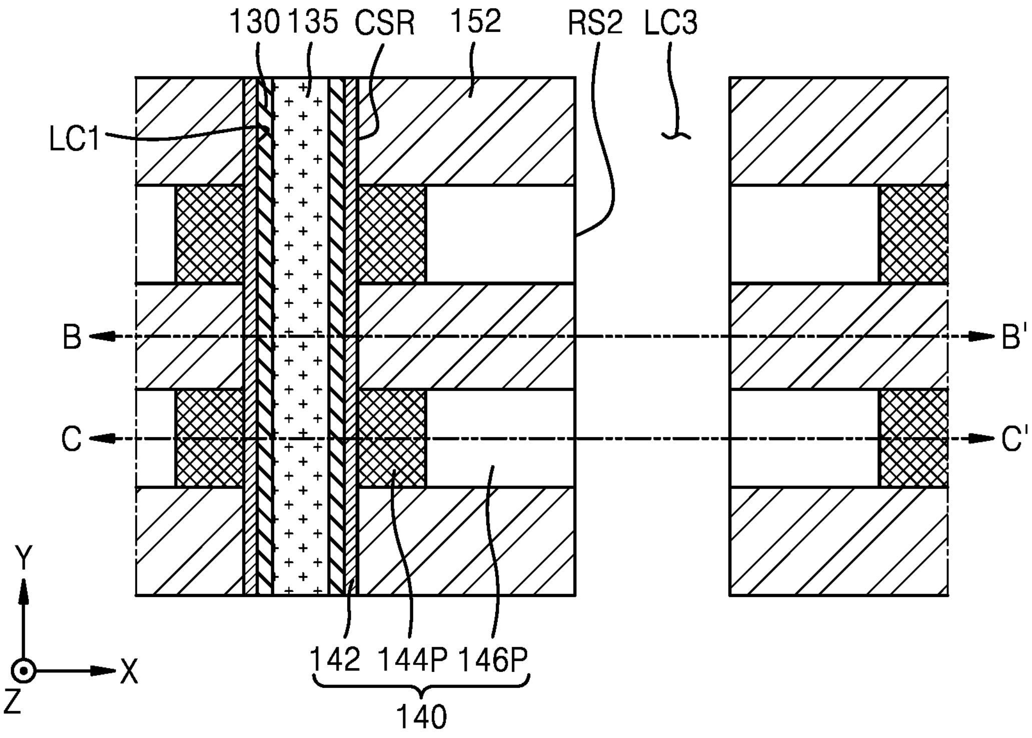
Figure 10B:
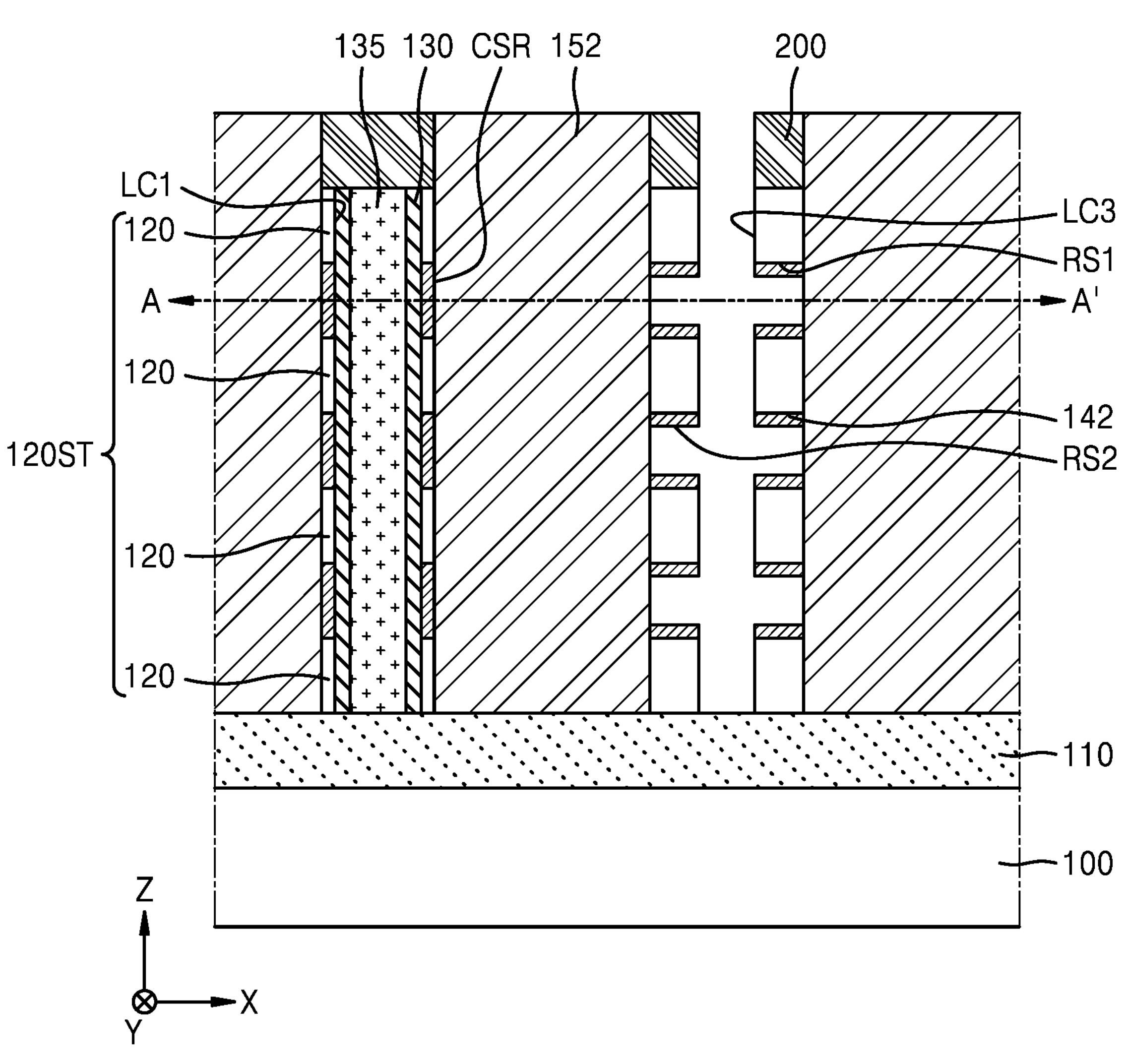
Figure 10C:
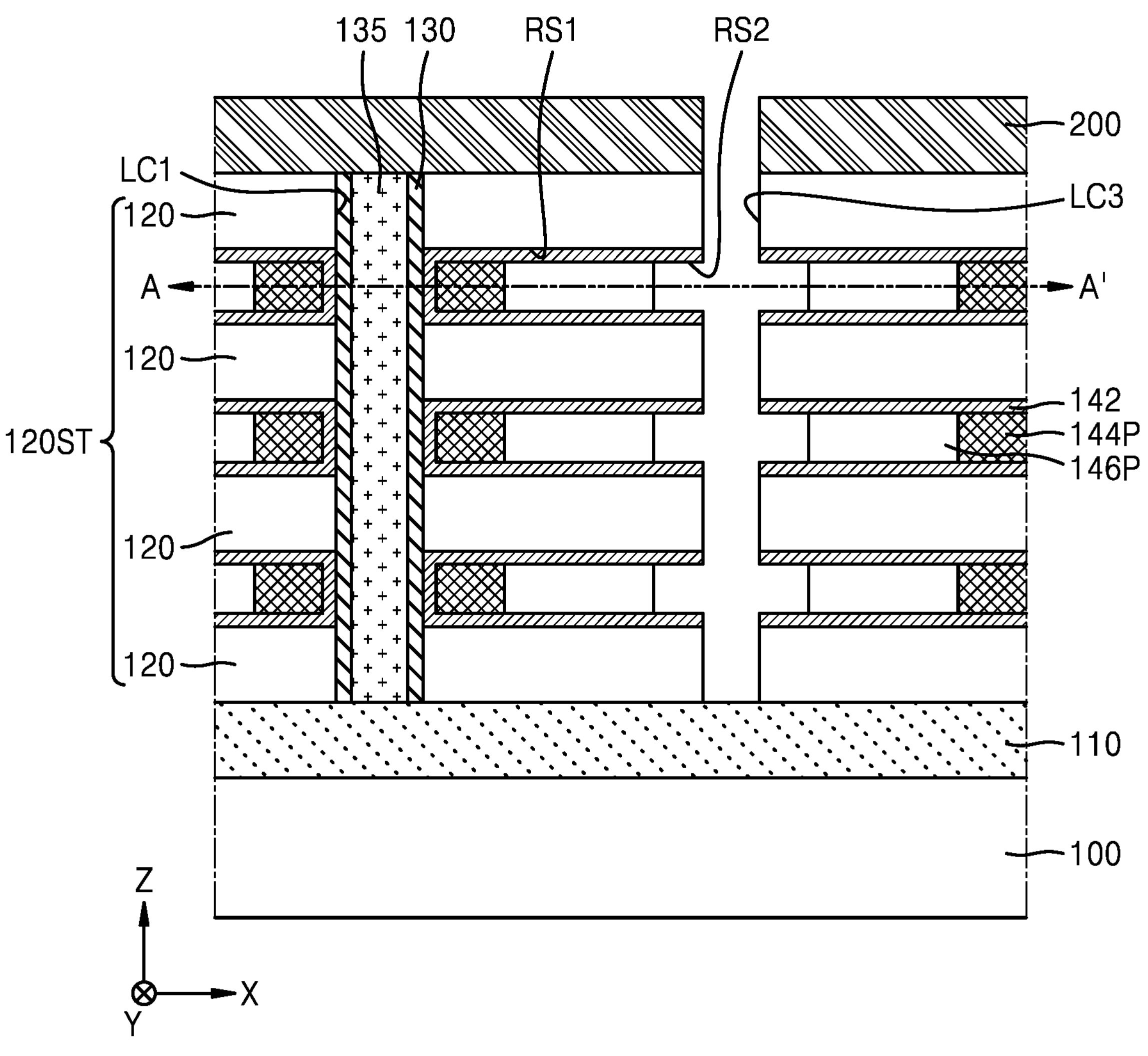

Referring to FIGS. 7A and 7B, in each of the plurality of first removal spaces RS1, a filling structure 140 is formed including a separation insulating layer 142 overlapping or covering a surface of the vertical channel layer 130 and surfaces of the two semiconductor layers 120, a charge storage layer 144 partially filling an internal part of each of the plurality of first removal spaces RS1 on the separation insulating layer 142, and a channel layer 146 filling the remaining internal part of each of the plurality of first removal spaces RS1 on the separation insulating layer 142. Then, a second filling insulating layer 150 is formed that fills the second line cut region LC2.

The separation insulating layer 142 may be formed to conformally cover a side surface of the vertical channel layer 130 exposed in each of the plurality of first removal spaces RS1, a bottom surface of the upper semiconductor layer 120 of the two semiconductor layers 120, and a top surface of the lower semiconductor layer 120 of the two semiconductor layers 120. The separation insulating layer 142 may include, for example, silicon oxide, silicon nitride, silicon oxynitride, or a combination thereof.

The charge storage layer 144 may include a semiconductor material or an oxide semiconductor material. For example, the charge storage layer 144 may include a semiconductor material doped with impurities or an oxide semiconductor material doped with impurities. In some embodiments, the charge storage layer 144 may include polysilicon doped with n-type impurities or an oxide semiconductor material doped with n-type impurities. For example, the charge storage layer 144 may include an amorphous oxide semiconductor material, a single crystal oxide semiconductor material, a polycrystalline oxide semiconductor material, a spinel oxide semiconductor material, or a c-axis aligned crystalline (CAAC) oxide semiconductor material. The oxide semiconductor material may include a binary or ternary oxide semiconductor material including a first metal element, a ternary oxide semiconductor material including a first metal element and a second metal element that are different from each other, or a quaternary oxide semiconductor material including a first metal element, a second metal element, and a third metal element that are different from one another. The binary or ternary oxide semiconductor material may include, for example, one of zinc oxide (ZnO) ($Zn_xO$), gallium oxide (GaO) ($Ga_xO$), titanium oxide (TiO) ($Ti_xO$), zinc oxynitride (ZnON) ($Zn_xON$), indium zinc oxide (IZO) ($In_xZn_yO$), gallium zinc oxide (GZO) ($Ga_xZn_yO$), tin zinc oxide (TZO) ($Sn_xZn_yO$), and tin gallium oxide (TGO) ($Sn_xGa_yO$). The quaternary oxide semiconductor material may include, for example, one of indium gallium zinc oxide (IGZO) ($In_xGa_yZn_zO$), indium gallium silicon oxide (IGSO) ($In_xGa_ySi_zO$), indium tin zinc oxide (ITZO) ($In_xSn_yZn_zO$), indium tin gallium oxide (ITGO) ($In_xSn_yGa_zO$), zirconium zinc tin oxide (ZZTO) ($Zr_xZn_ySn_zO$), hafnium indium zinc oxide (HIZO) ($Hf_xIn_yZnO$), gallium zinc tin oxide (GZTO) ($Ga_xZn_ySn_zO$), aluminum zinc tin oxide (AZTO) ($Al_xZn_ySn_zO$), and ytterbium gallium zinc oxide (YGZO) ($Yb_xGa_yZn_zO$). However, the present disclosure is not limited thereto.

For example, the charge storage layer 144 may include a single layer or multiple layers of the oxide semiconductor material. In some embodiments, the charge storage layer 144 may include a material having bandgap energy greater than that of silicon. For example, the charge storage layer 144 may include a material having bandgap energy in a range of about 1.5 eV to about 5.6 eV. In some embodiments, the charge storage layer 144 may include a material having bandgap energy in a range of about 2.0 eV to about 4.0 eV.

The channel layer 146 may include a material having an etching selectivity with the semiconductor layer 120. For example, the channel layer 146 may include an oxide semiconductor material. In some embodiments, the channel layer 146 may include an undoped oxide semiconductor material. The second filling insulating layer 150 may include silicon oxide or an insulating material having a lower dielectric constant than that of silicon oxide.

Referring to FIGS. 7A and 7B and 8A to 8D, a plurality of cell separation regions CSR are formed through the stacked semiconductor structure 120ST and the filling structure 140. The plurality of cell separation regions CSR may be arranged in a matrix in a plan view to be spaced apart from one another in the first horizontal direction (the X direction) and the second horizontal direction (the Y direction). The charge storage layer 144 may be divided into a plurality of charge storage patterns 144P by the plurality of cell separation regions CSR. Each of the plurality of cell separation regions CSR may be spaced apart from the vertical channel layer 130 with the separation insulating layer 142 therebetween. The plurality of cell separation regions CSR may be spaced apart from the second line cut region LC2 in the first horizontal direction (the X direction).

Each of the plurality of cell separation regions CSR may be filled with a third filling insulating layer 152. The third filling insulating layer 152 may contact the separation insulating layer 142, but may be spaced apart from the vertical channel layer 130. The third filling insulating layer 152 may be spaced apart from the second filling insulating layer 150. A part of the channel layer 146 may be between the second filling insulating layer 150 and the third filling insulating layer 152 in the first horizontal direction (the X direction). The third filling insulating layer 152 may include silicon oxide or an insulating material having a lower dielectric constant than that of silicon oxide.

Referring to FIGS. 8A to 8D and 9A to 9C, the second filling insulating layer 150 is removed to form a third line cut region LC3. In some embodiments, the third line cut region LC3 may be substantially the same as the second line cut region LC2. However, the present disclosure is not limited thereto. A horizontal width of the third line cut region LC3 in the first horizontal direction (the X direction) may be equal to or greater than that of the second line cut region LC2 in the first horizontal direction (the X direction). For example, the third line cut region LC3 may be formed by removing the second filling insulating layer 150 or parts of the second filling insulating layer 150 and the cover insulating layer 200, the semiconductor layer 120, the separation insulating layer 142, and the channel layer 146 adjacent to the second filling insulating layer 150.

Referring to FIGS. 9A to 9C and 10A to 10C, parts of the plurality of channel layers 146 may be removed through the third line cut region LC3 to form a plurality of second removal spaces RS2 and a plurality of channel patterns 146P spaced apart from one another with the plurality of cell separation regions CSR therebetween.

Figure 11A:
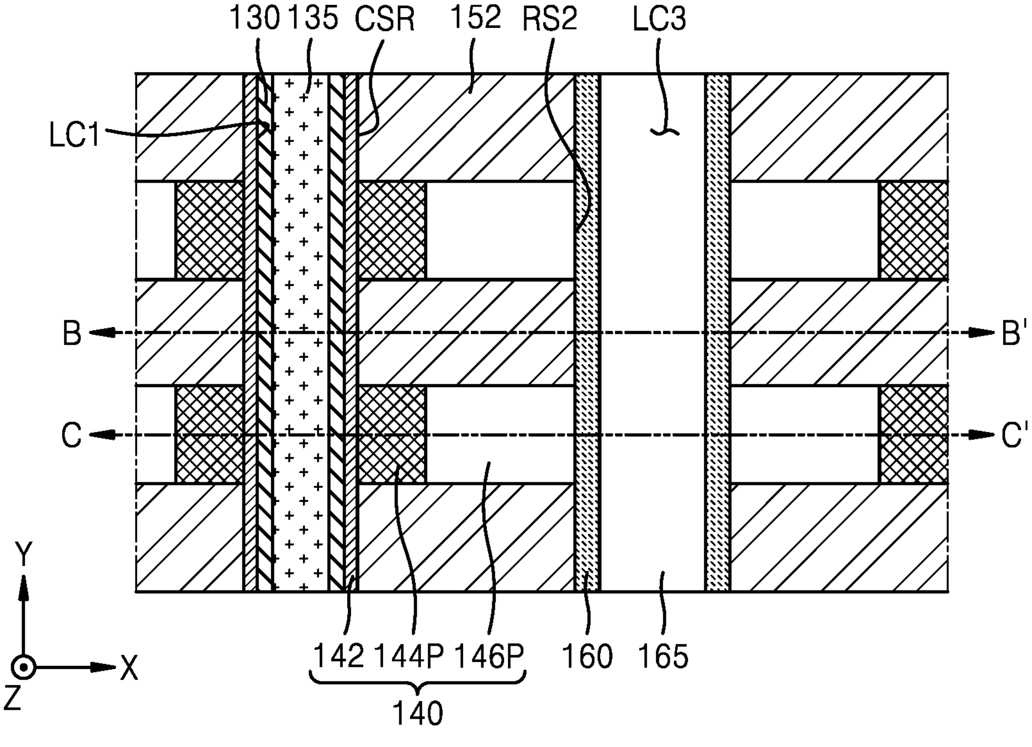
Figure 11B:
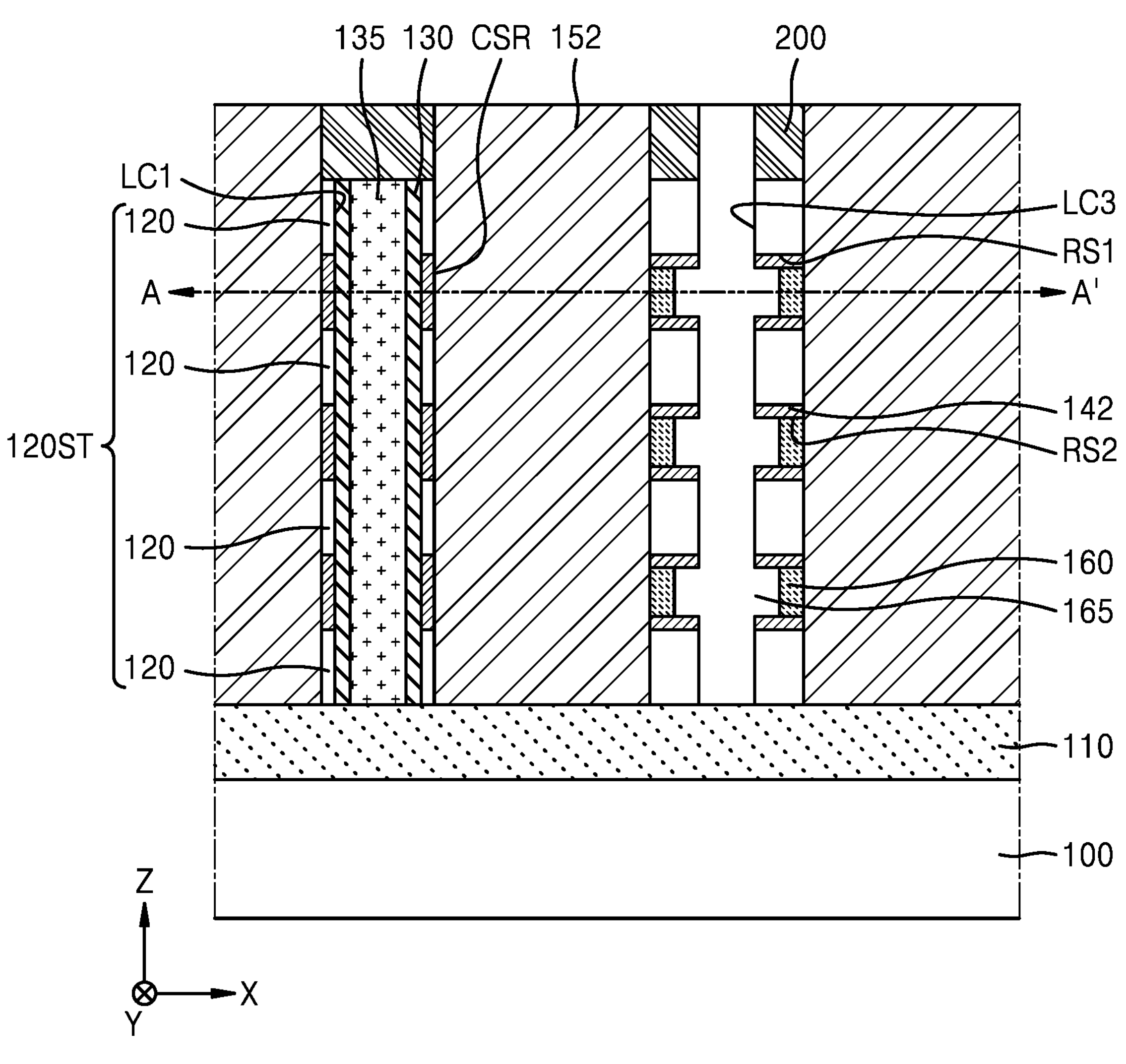
Figure 11C:
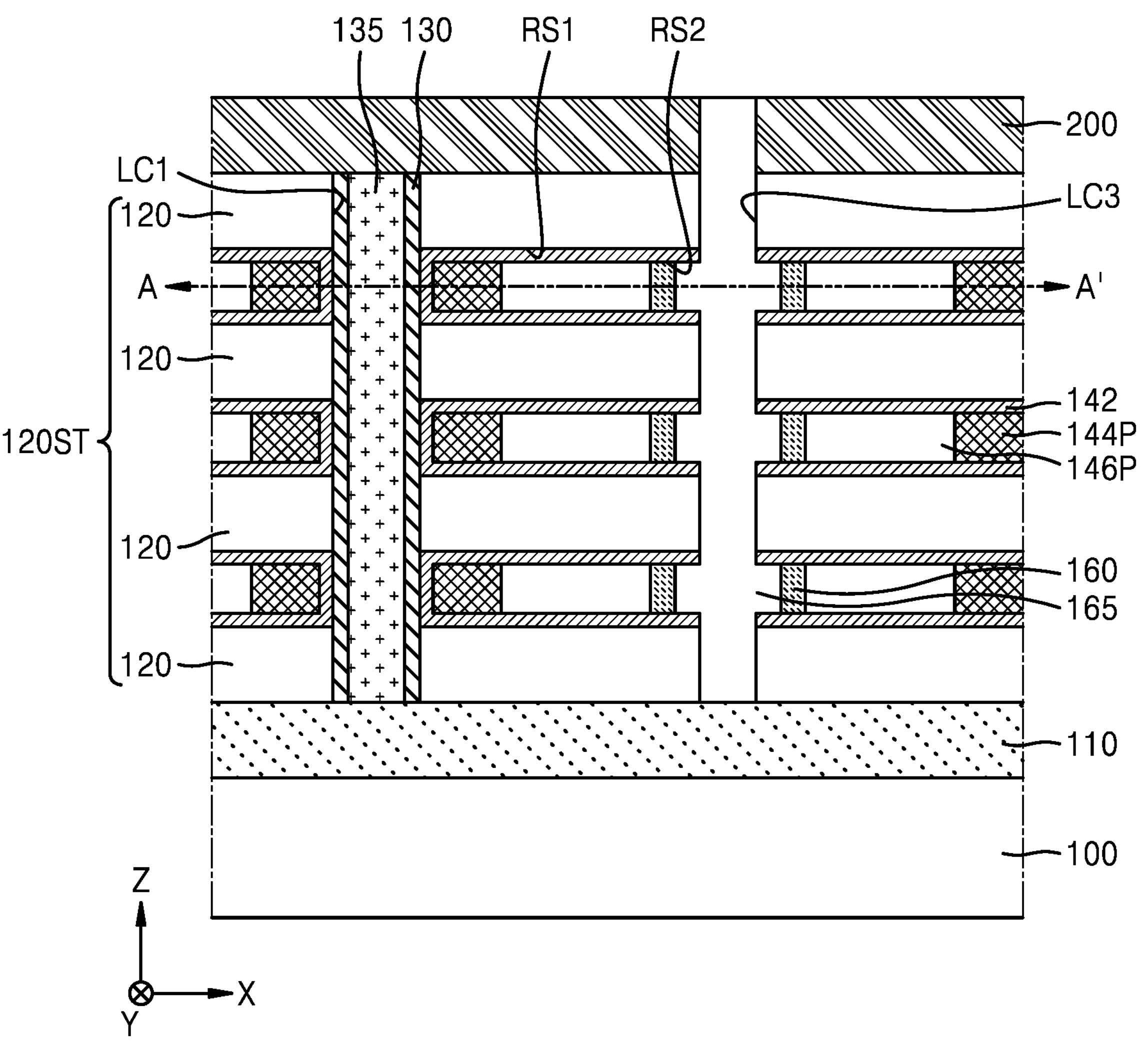

Referring to FIGS. 11A to 11C, a plurality of first conductive lines 160 are formed to fill internal parts of the plurality of second removal spaces RS2. The plurality of first conductive lines 160 may extend in the second horizontal direction (the Y direction). The plurality of first conductive lines 160 may be spaced apart from one another in the first horizontal direction (the X direction) and the vertical direction (the Z direction). Each of the plurality of first conductive lines 160 may contact and be connected to the plurality of channel patterns 146P arranged in the second horizontal direction (the Y direction).

In some embodiments, each of the plurality of first conductive lines 160 may include a conductive barrier layer contacting the plurality of channel patterns 146P and a conductive filling layer overlapping or covering the conductive barrier layer. The conductive barrier layer may include, for example, a metal, conductive metal nitride, conductive metal silicide, or a combination thereof. For example, the conductive barrier layer may include titanium nitride (TiN). The conductive filling layer may include doped silicon, ruthenium (Ru), ruthenium oxide (RuO), platinum (Pt), platinum oxide (PtO), iridium (Ir), iridium oxide (IrO), SRO (SrRuO), BSRO ((Ba,Sr)RuO), CRO (CaRuO), BaRuO, La(Sr,Co)O, titanium (Ti), TiN, tungsten (W), WN, tantalum (Ta), tantalum nitride (TaN), TiAlN, TiSiN, TaAlN, TaSiN, or a combination thereof. In some embodiments, the conductive filling layer may include W.

After forming the plurality of first conductive lines 160, a fourth filling insulating layer 165 is formed and fills the plurality of second removal spaces RS2 and the third line cut region LC3. The fourth filling insulating layer 165 may include silicon oxide or an insulating material having a lower dielectric constant than that of silicon oxide.

Figure 12A:
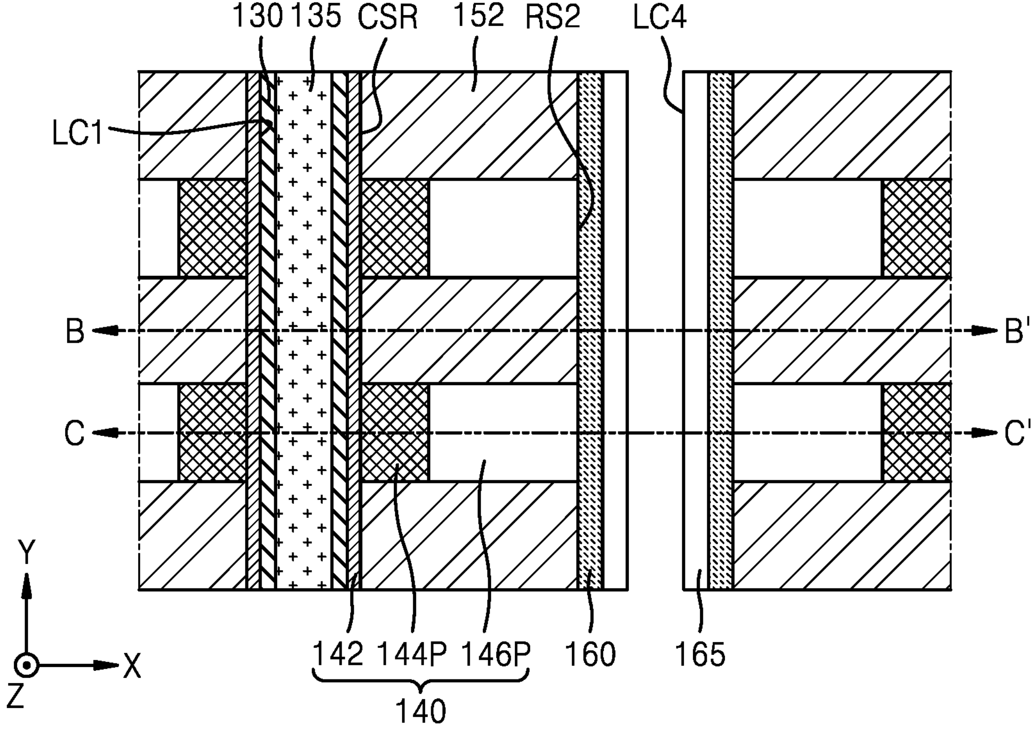
Figure 12B:
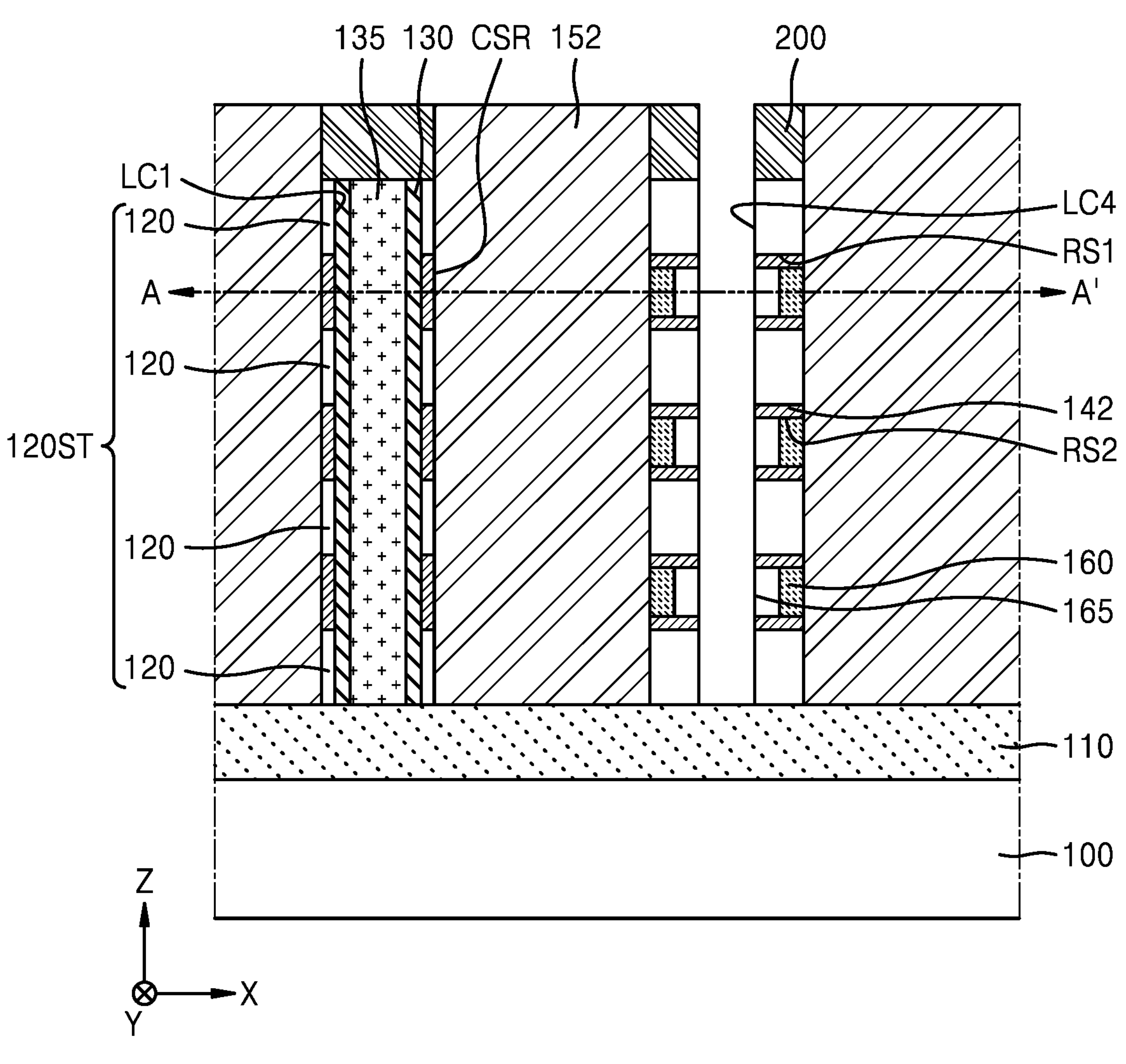
Figure 12C:
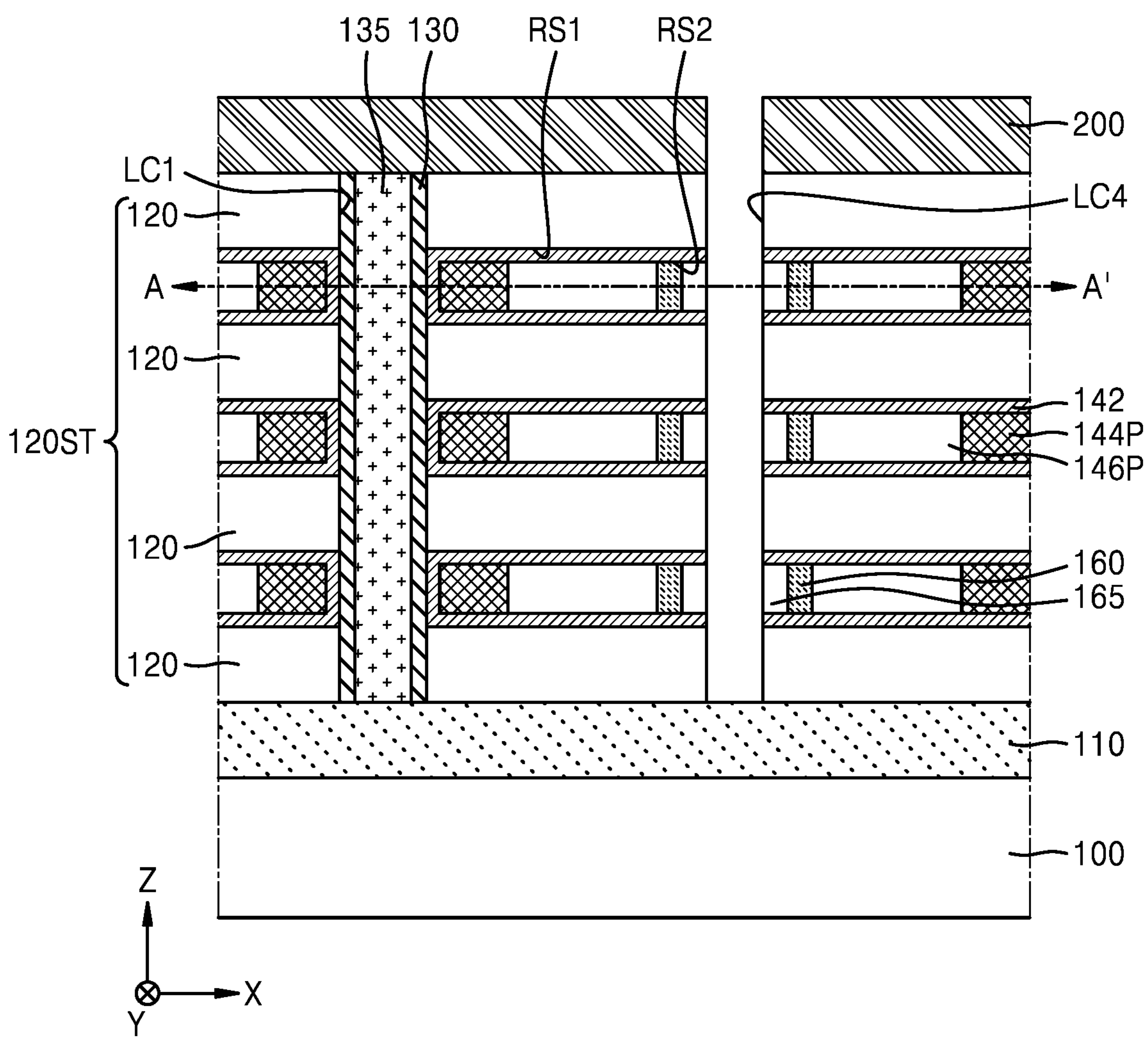

Referring to FIGS. 12A to 12C, a part of the fourth filling insulating layer 165 is removed to form a fourth line cut region LC4. A part of the fourth filling insulating layer 165, which fills the plurality of second removal spaces RS2, may remain without being removed. In some embodiments, the fourth line cut region LC4 may be substantially the same as the third line cut region LC3. However, the present disclosure is not limited thereto. A horizontal width of the fourth line cut region LC4 in the first horizontal direction (the X direction) may be equal to or greater than that of the third line cut region LC3 in the first horizontal direction (the X direction). For example, the fourth line cut region LC4 may be formed by removing a part of the fourth filling insulating layer 165 that fills the third line cut region LC3 (refer to FIGS. 11A to 11C) or parts of the fourth filling insulating layer 165 and the cover insulating layer 200, the semiconductor layer 120, and the separation insulating layer 142 adjacent to the fourth filling insulating layer 165.

Referring to FIGS. 12A to 12C and 13A to 13D, parts of the plurality of semiconductor layers 120 are removed through the fourth line cut region LC4 to form a plurality of third removal spaces RS3. A part of each of the plurality of semiconductor layers 120 between each two of the plurality of cell separation regions CSR, which are adjacent to each other in the second horizontal direction (the Y direction), may include a plurality of horizontal channels 120C. In some embodiments, in the first horizontal direction (the X direction), a length in which each of the plurality of third removal spaces RS3 extends from the fourth line cut region LC4 may be greater than a length in which each of the plurality of second removal spaces RS2 extends from the fourth line cut region LC4.

Referring to FIGS. 14A to 14D, a plurality of second conductive lines 170 are formed to fill internal parts of the plurality of third removal spaces RS3. The plurality of second conductive lines 170 may extend in the second horizontal direction (the Y direction). The plurality of second conductive lines 170 may be spaced apart from one another in the first horizontal direction (the X direction) and the vertical direction (the Z direction). Each of the plurality of second conductive lines 170 may contact and be connected to the plurality of horizontal channels 120C of each of the plurality of semiconductor layers 120 arranged in the second horizontal direction (the Y direction).

In some embodiments, the plurality of second conductive lines 170 may be closer to the first line cut region LC1 in the first horizontal direction (the X direction) than the plurality of first conductive lines 160.

In some embodiments, each of the plurality of second conductive lines 170 may include the conductive barrier layer contacting the plurality of horizontal channels 120C of each of the plurality of semiconductor layers 120 and the conductive filling layer covering the conductive barrier layer. The conductive barrier layer may include, for example, a metal, conductive metal nitride, conductive metal silicide, or a combination thereof. For example, the conductive barrier layer may include titanium nitride (TiN). The conductive filling layer may include doped silicon, Ru, RuO, Pt, PtO, Ir, IrO, SRO (SrRuO), BSRO ((Ba,Sr)RuO), CRO (CaRuO), BaRuO, La(Sr,Co)O, Ti, TiN, W, WN, Ta, TaN, TiAlN, TiSiN, TaAlN, TaSiN, or a combination thereof. In some embodiments, the conductive filling layer may include W.

Then, a fifth filling insulating layer 175 is formed to fill remaining parts of the plurality of third removal spaces RS3 and the fourth line cut region LC4. The fifth filling insulating layer 175 may include silicon oxide or an insulating material having a lower dielectric constant than that of silicon oxide.

Referring to FIGS. 15A to 15C, a plurality of gate holes GTH are formed through the plurality of third filling insulating layers 152. The plurality of gate holes GTH may be adjacent to the plurality of channel patterns 146P and the plurality of horizontal channels 120C. For example, the plurality of gate holes GTH may be formed to expose the plurality of channel patterns 146P and the plurality of horizontal channels 120C on internal surfaces of the plurality of gate holes GTH.

Then, a plurality of gate structures 180 and a gate electrode layer 184 are formed, where each gate structure 180 includes a gate dielectric layer 182 overlapping or covering the internal surface of each of the plurality of gate holes GTH, and where the gate electrode layer 184 overlaps and/or covers the gate dielectric layer 182 and fills each of the plurality of gate holes GTH.

The gate dielectric layer 182 may surround a side surface of the gate electrode layer 184. The gate electrode layer 184 may extend in the vertical direction (the Z direction). The plurality of gate electrode layers 184 may be arranged in a matrix in a plan view to be spaced apart from one another in the first horizontal direction (the X direction) and the second horizontal direction (the Y direction).

The gate dielectric layer 182 may include at least one selected from silicon oxide, a high-k dielectric material having a higher dielectric constant than that of silicon oxide, and a ferroelectric material. In some embodiments, the gate dielectric layer 182 may have a stacked structure of a first dielectric layer including silicon oxide and a second dielectric layer including at least one selected from a high-k dielectric material and a ferroelectric material. For example, the high-k dielectric material and the ferroelectric material may include at least one selected from hafnium oxide (HfO), hafnium silicate (HfSiO), hafnium oxide nitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead acid zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO).

In some embodiments, the gate electrode layer 184 may include a conductive barrier layer overlapping or covering the gate dielectric layer 182 and a conductive filling layer overlapping or covering the conductive barrier layer. The conductive barrier layer may include, for example, a metal, conductive metal nitride, conductive metal silicide, or a combination thereof. For example, the conductive barrier layer may include titanium nitride (TiN). The conductive filling layer may include doped silicon, Ru, RuO, Pt, PtO, Ir, IrO, SRO (SrRuO), BSRO ((Ba,Sr)RuO), CRO (CaRuO), BaRuO, La(Sr,Co)O, Ti, TiN, W, WN, Ta, TaN, TiAlN, TiSiN, TaAlN, TaSiN, or a combination thereof. In some embodiments, the conductive filling layer may include W.

Figure 16A:
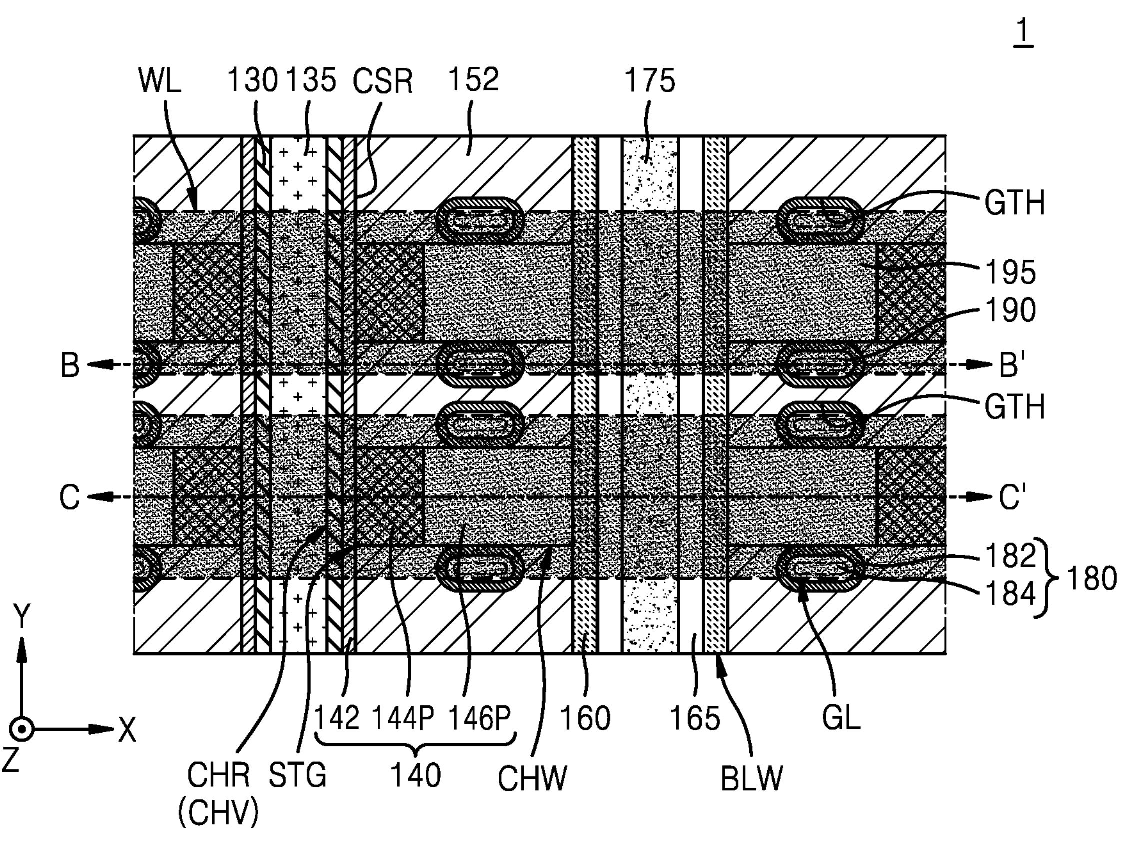
FIGS. 16A, 16B, 16C, and 16D illustrate a semiconductor memory device according to embodiments of the present disclosure.
Figure 16B:
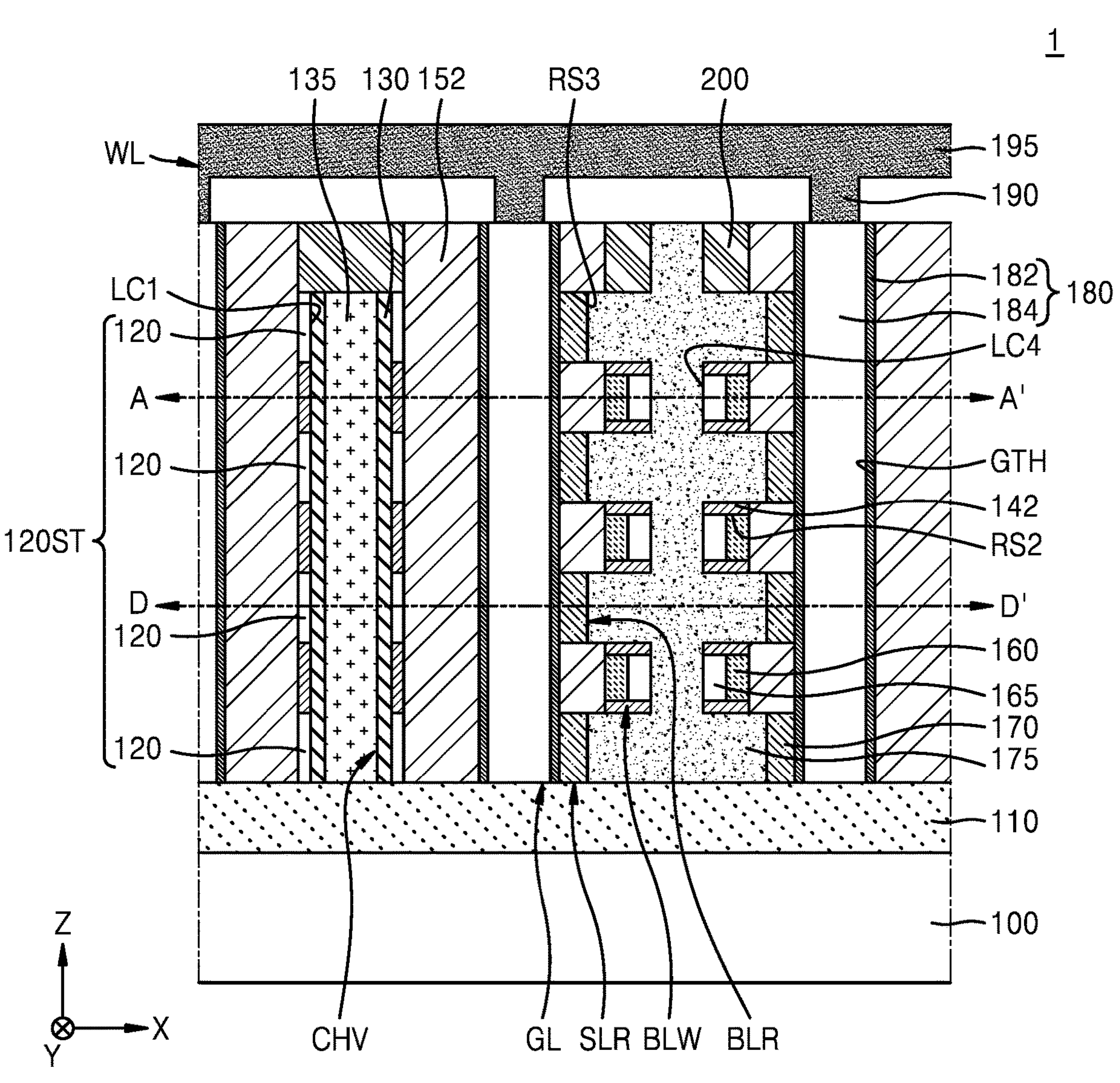
Figure 16C:
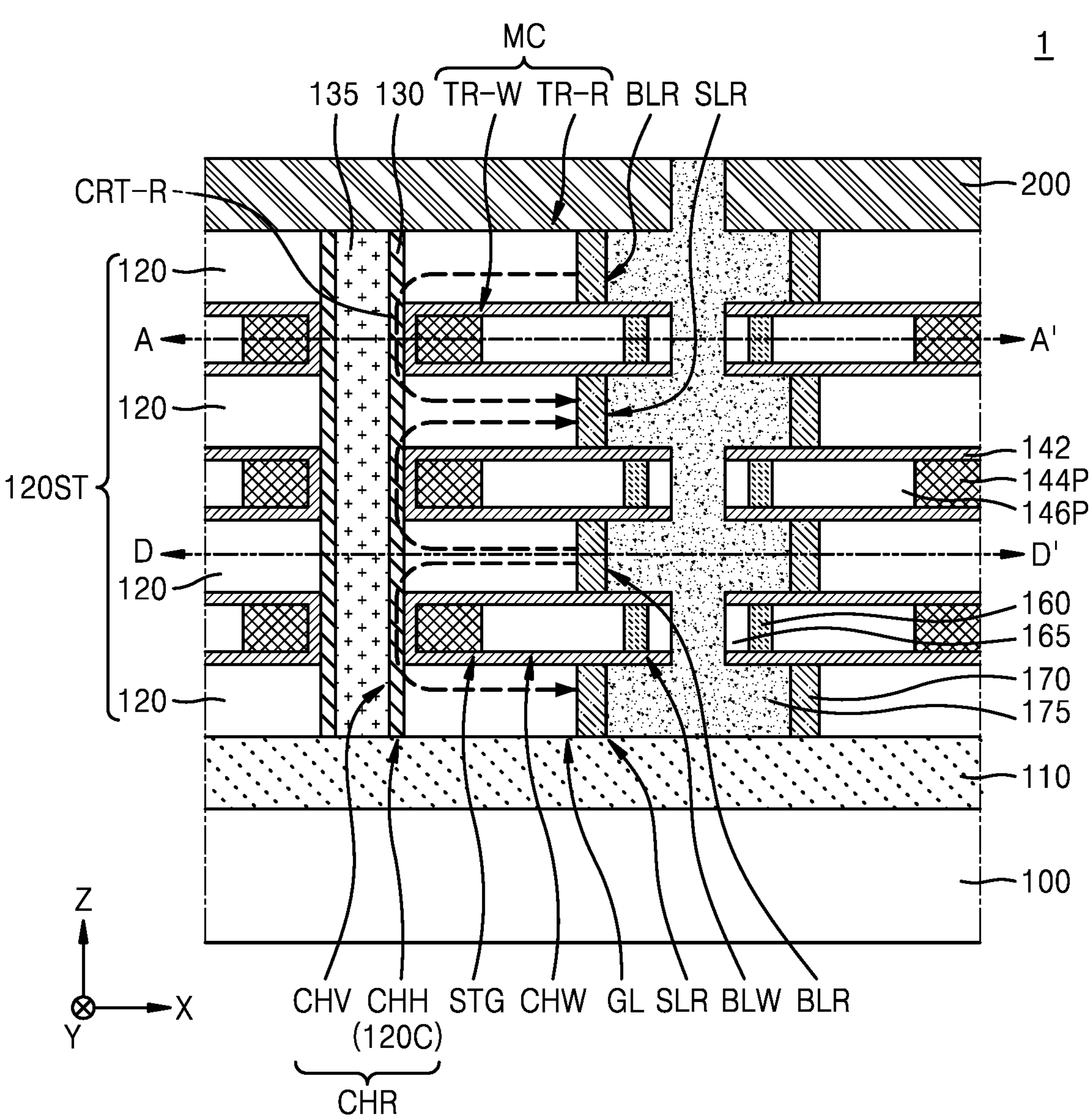
Figure 16D:
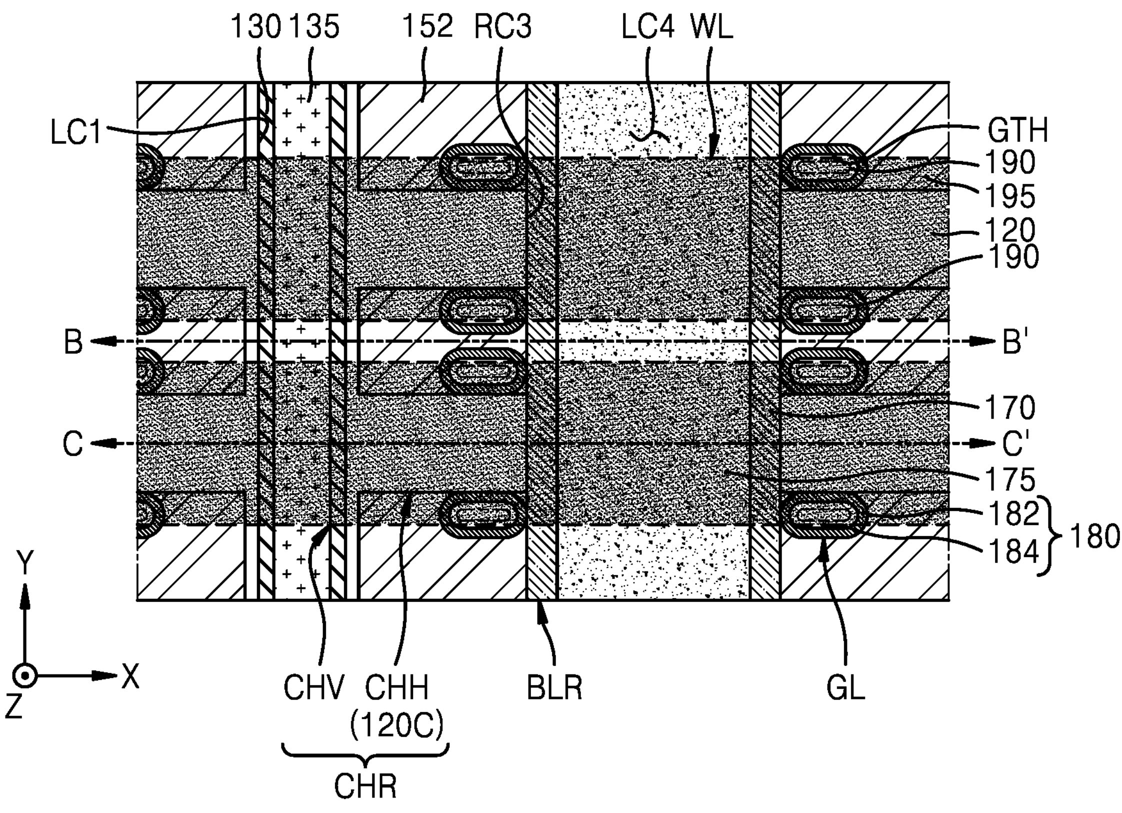

FIGS. 16A to 16D are views illustrating a semiconductor memory device 1 according to embodiments. Specifically, FIG. 16A is a horizontal cross-sectional view taken along the line A-A' of FIGS. 16B and 16C, FIG. 16B is a vertical cross-sectional view taken along the line B-B' of FIGS. 16A and 16D, FIG. 16C is a vertical cross-sectional view taken along the line C-C' of FIGS. 16A and 16D, and FIG. 16D is a vertical cross-sectional view taken along the line D-D' of FIGS. 16B and 16C.

Referring to FIGS. 16A to 16D, after a plurality of word line contacts 190 are formed on the plurality of gate electrode layers 184, a plurality of word line layers 195 connected to some of the plurality of word line contacts 190 are formed to form the semiconductor memory device 1.

The word line contact 190 and the word line layer 195 may include doped polysilicon, a metal, conductive metal nitride, conductive metal silicide, or a combination thereof. For example, the word line contact 190 and the word line layer 195 may include doped polysilicon, aluminum (Al), copper (Cu), Ti, Ta, Ru, W, molybdenum (Mo), Pt, nickel (Ni), cobalt (Co), TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, the present disclosure is not limited thereto.

At least one word line contact 190 may be arranged on each of the plurality of gate electrode layers 184. Each of the plurality of word line layers 195 may be connected to at least one pair of word line contacts 190 arranged on a pair of gate electrode layers 184. The plurality of word line layers 195 may extend in the first horizontal direction (the X direction) and may be spaced apart from one another in the second horizontal direction (the Y direction). The plurality of word line layers 195 may be connected to the plurality of word line contacts 190 arranged on the plurality of gate electrode layers 184 arranged in the first horizontal direction (the X direction). The pair of gate electrode layers 184 may be electrically connected to each other by a pair of word line contacts 190 and word line layers 195.

The semiconductor memory device 1 may include a plurality of memory cells MC. The plurality of memory cells MC may have a three-dimensional arrangement. That is, the plurality of memory cells MC may be arranged in the first horizontal direction (the X direction), the second horizontal direction (the Y direction), and the vertical direction (the Z direction). Each of the plurality of memory cells MC may include the pair of transistors, for example, the first transistor TR-R and the second transistor TR-W. The first transistor TR-R may include a first channel structure CHR and the second transistor TR-W may include a second channel structure CHW. The first channel structure CHR may have a nonlinear shape (e.g., a 'C' shape) in an X-Z plane formed in the first horizontal direction (the X direction) and the vertical direction (the Z direction). The first channel structure CHR may include a pair of horizontal parts CHH and a vertical part CHV connecting the pair of horizontal parts CHH.

In some embodiments, among the plurality of memory cells MC included in the semiconductor memory device 1, two memory cells MC adjacent to each other in the vertical direction (the Z direction) may share one of the pair of horizontal parts CHH of the first channel structure CHR included in each of the two memory cells MC.

A first bit line BLR may be connected to one end of the first channel structure CHR and a selection line SLR may be connected to the other end thereof. The vertical part CHV may be connected to one end of each of the pair of horizontal parts CHH included in the first channel structure CHR, and the first bit line BLR or the selection line SLR may be connected to the other end thereof. The horizontal part CHH that is connected to the first bit line BLR may be referred to as a first horizontal part and the horizontal part CHH that is connected to the selection line SLR may be referred to as a second horizontal part.

The first bit line BLR and the selection line SLR may extend in the second horizontal direction (the Y direction). The plurality of first bit lines BLR and the plurality of selection lines SLR may be spaced apart from one another in the first horizontal direction (the X direction) and the vertical direction (the Z direction). Each of the plurality of first bit lines BLR and each of the plurality of selection lines SLR may be alternately spaced apart from each other in the vertical direction (the Z direction).

A pair of horizontal parts CHH included in the first channel structure CHR may include the horizontal channels 120C of a pair of adjacent semiconductor layers 120 in the vertical direction (the Z direction), and the vertical part CHV may include a part of the vertical channel layer 130 connecting the horizontal channels 120C of the pair of semiconductor layers 120. The vertical parts CHV of the first transistors TR-R arranged in the vertical direction (the Z direction) may include parts of one vertical channel layer 130. In some embodiments, the vertical parts CHV of the first transistors TR-R arranged in the second horizontal direction (the Y direction) may include parts of one vertical channel layer 130. Each of the first bit line BLR and the selection line SLR may include the second conductive line 170.

The second channel structure CHW may extend into the nonlinear shape (e.g., the 'C' shape) of the first channel structure CHR. The second channel structure CHW may extend in the first horizontal direction (the X direction) toward the vertical part CHV between the pair of horizontal parts CHH of the first channel structure CHR. The charge storage element STG may be connected to one end of the second channel structure CHW, and the second bit line BLW may extend to the other end thereof. The charge storage element STG and one end of the second channel structure CHW connected to the charge storage element STG may be arranged in the nonlinear shape (e.g., the 'C' shape) of the first channel structure CHR. The plurality of second bit lines BLW may extend in the second horizontal direction (the Y direction). The plurality of second bit lines BLW may be spaced apart from one another in the first horizontal direction (the X direction) and the vertical direction (the Z direction).

The charge storage element STG may be adjacent to the first channel structure CHR. The charge storage element STG may be between the vertical part CHV of the first channel structure CHR and one end of the second channel structure CHW, and the charge storage element STG may be between the pair of horizontal parts CHH included in the first channel structure CHR. The charge storage element STG and the second channel structure CHW may be arranged in the first horizontal direction (the X direction). The second channel structure CHW may include the channel pattern 146P, and the charge storage element STG may include the charge storage pattern 144P. The second bit line BLW may include the first conductive line 160.

In some embodiments, the first bit line BLR and the selection line SLR connected to the pair of horizontal parts CHH of the first channel structure CHR may be arranged closer to the vertical part CHV of the first channel structure CHR in the first horizontal direction (the X direction) than the second bit line BLW connected to the second channel structure CHW. The other end of the second channel structure CHW that is connected to the second bit line BLW may be arranged outside the nonlinear shape (e.g., the 'C' shape) of the first channel structure CHR.

The separation insulating layer 142 may be between the first channel structure CHR and the second channel structure CHW, and the separation insulating layer 142 may be between the first channel structure CHR and the charge storage element STG. The separation insulating layer 142 may extend from between the first channel structure CHR and the second channel structure CHW to between the first channel structure CHR and the charge storage element STG.

The gate line GL may be adjacent to the first channel structure CHR and the second channel structure CHW and may extend in the vertical direction (the Z direction). For example, a pair of gate lines GL may be arranged at both ends of the pair of horizontal parts CHH of the first channel structure CHR and the second channel structure CHW in the second horizontal direction (the Y direction). The gate line GL may extend in the vertical direction (the Z direction). Each of the pair of gate lines GL may include the gate electrode layer 184. The gate dielectric layer 182 may be between the gate line GL, the pair of horizontal parts CHH of the first channel structure CHR, and the second channel structure CHW.

The plurality of word lines WL may extend in the first horizontal direction (the X direction) and may be spaced apart from one another in the second horizontal direction (the Y direction). For example, each of the plurality of word lines WL may be connected to the pair of gate lines GL arranged at both ends of the pair of horizontal parts CHH of the first channel structure CHR and the second channel structure CHW in the second horizontal direction (the Y direction). Each of the plurality of word lines WL is connected to the gate lines GL arranged in the first horizontal direction (the X direction) and may extend in the first horizontal direction (the X direction). The word line WL may include the word line layer 195.

The first transistor TR-R may generate a current flow CRT-R along the first channel structure CHR by the first bit line BLR, the selection line SLR, and the pair of gate lines GL. The second transistor TR-W may store charges in the charge storage element STG along the second channel structure CHW by the second bit line BLW and the pair of gate lines GL. The charge storage element STG may be arranged adjacent to the first channel structure CHR to function as a floating gate of the first transistor TR-R, so that a threshold voltage of the first transistor TR-R may be determined based on the amount of charge stored in the charge storage element STG. Therefore, information stored in the memory cell MC may be read by determining the degree of the current flow CRT-R generated in the first transistor TR-R. Additionally, information stored in the memory cell MC may be read by determining whether the current flow CRT-R exists/is present.

Because the semiconductor memory device 1 according to the present disclosure includes the plurality of memory cells MC three-dimensionally arranged in the first horizontal direction (the X direction), the second horizontal direction (the Y direction), and the vertical direction (the Z direction), the memory capacity may be increased. Furthermore, because two memory cells MC adjacent to each other in the vertical direction (the Z direction) share one horizontal part CHH of the pair of horizontal parts CHH of the first channel structure CHR, the degree of integration may be increased.

In addition, because information is stored in the charge storage element STG instead of the capacitor in the semiconductor memory device 1 according to the present disclosure, the difficulty of a process may be reduced and the degree of integration may be increased.

Figure 17:
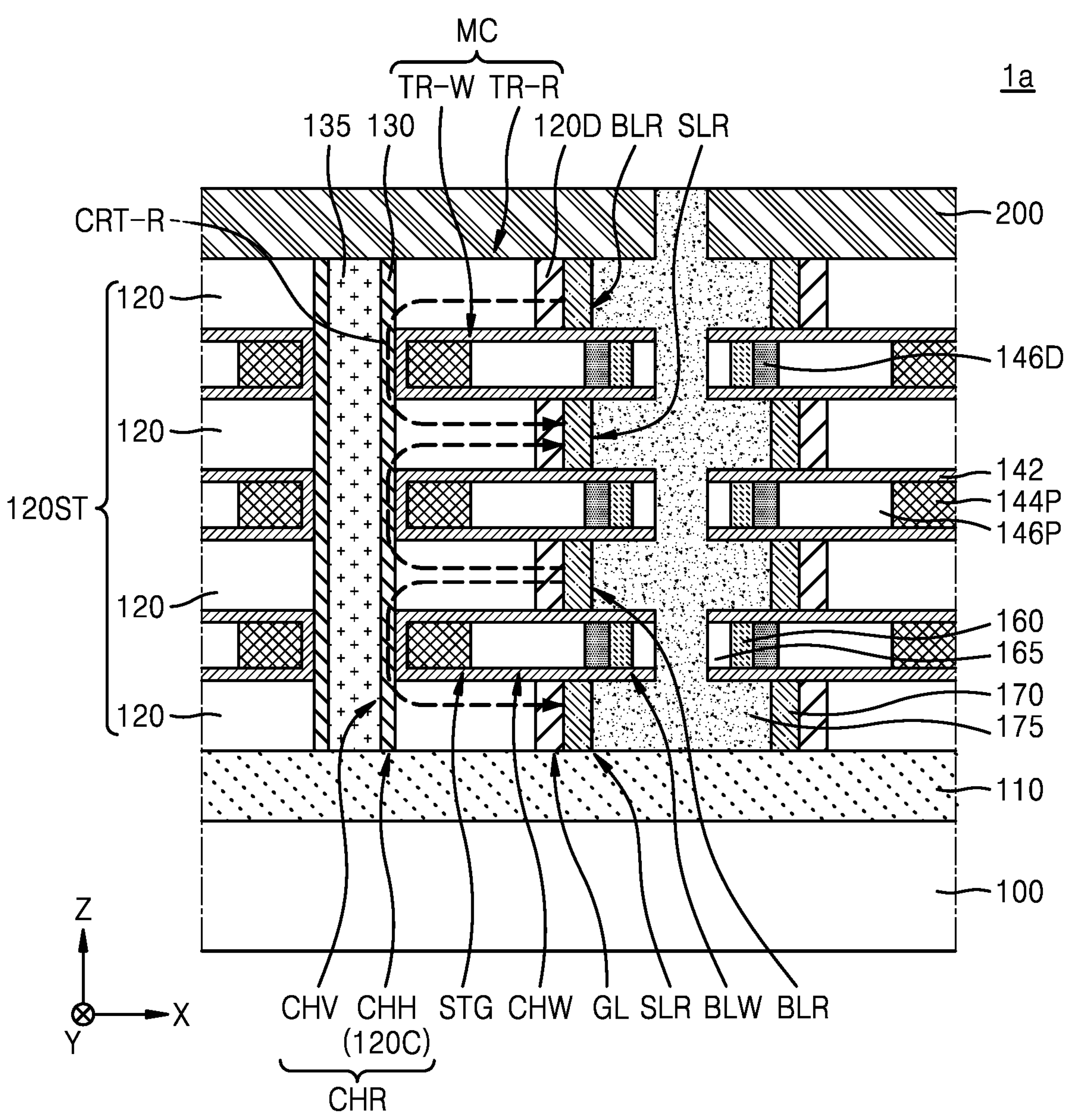
FIG. 17 illustrates a semiconductor memory device according to embodiments of the present disclosure.

FIG. 17 is a view illustrating a semiconductor memory device 1*a* according to embodiments. Specifically, FIG. 17 is a vertical cross-sectional view taken along the line C-C' of FIGS. 16A and 16D.

Referring to FIG. 17, the semiconductor memory device 1*a* may include a plurality of memory cells MC. The plurality of memory cells MC may be three-dimensionally arranged (i.e., arranged in the first horizontal direction (the X direction), the second horizontal direction (the Y direction), and the vertical direction (the Z direction)). Each of the plurality of memory cells MC may include a pair of transistors, for example, a first transistor TR-R and a second transistor TR-W. The first transistor TR-R may include a first channel structure CHR and the second transistor TR-W may include a second channel structure CHW. The first channel structure CHR may have a nonlinear shape (e.g., a 'C' shape) in an X-Z plane formed in the first horizontal direction (the X direction) and the vertical direction (the Z direction). The first channel structure CHR may include a pair of horizontal parts CHH and a vertical part CHV connecting the pair of horizontal parts CHH.

A first impurity region 120D may be formed in a horizontal part CHH, that is, the other end of a horizontal channel 120C of a semiconductor layer 120. The first impurity region 120D may be formed by implanting impurities into the other end of the horizontal channel 120C of the semiconductor layer 120 before forming the second conductive line 170 illustrated in FIGS. 14A to 14D. In some embodiments, the first impurity region 120D may be formed by implanting n-type impurities into the other end of the horizontal channel 120C of the semiconductor layer 120.

A second impurity region 146D may be formed in the second channel structure CHW, that is, the other end of a channel pattern 146P. The second impurity region 146D may be formed by implanting impurities into the other end of the channel pattern 146P before forming the first conductive line 160 illustrated in FIGS. 11A to 11D. In some embodiments, the second impurity region 146D may be formed by implanting n-type impurities into the other end of the channel pattern 146P.

The first impurity region 120D may function as a source/drain region of the first transistor TR-R and the second impurity region 146D may function as a source/drain region of the second transistor TR-W.

Figure 18A:
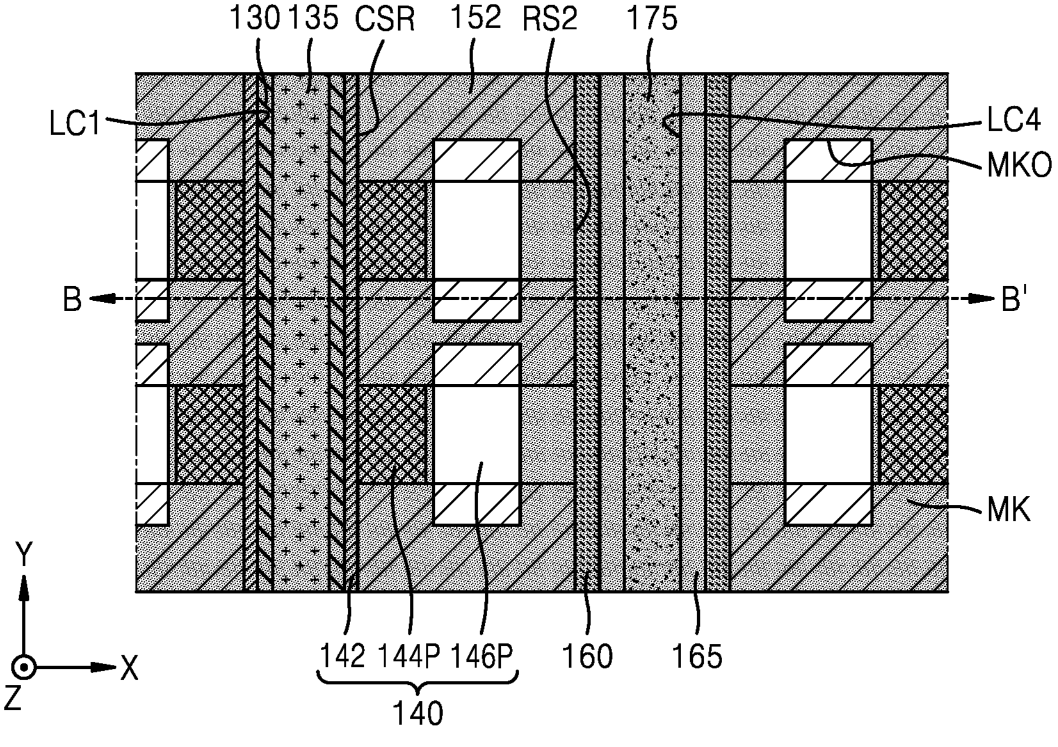
FIGS. 18A and 18B illustrate a method of manufacturing a semiconductor memory device according to embodiments of the present disclosure.
Figure 18B:
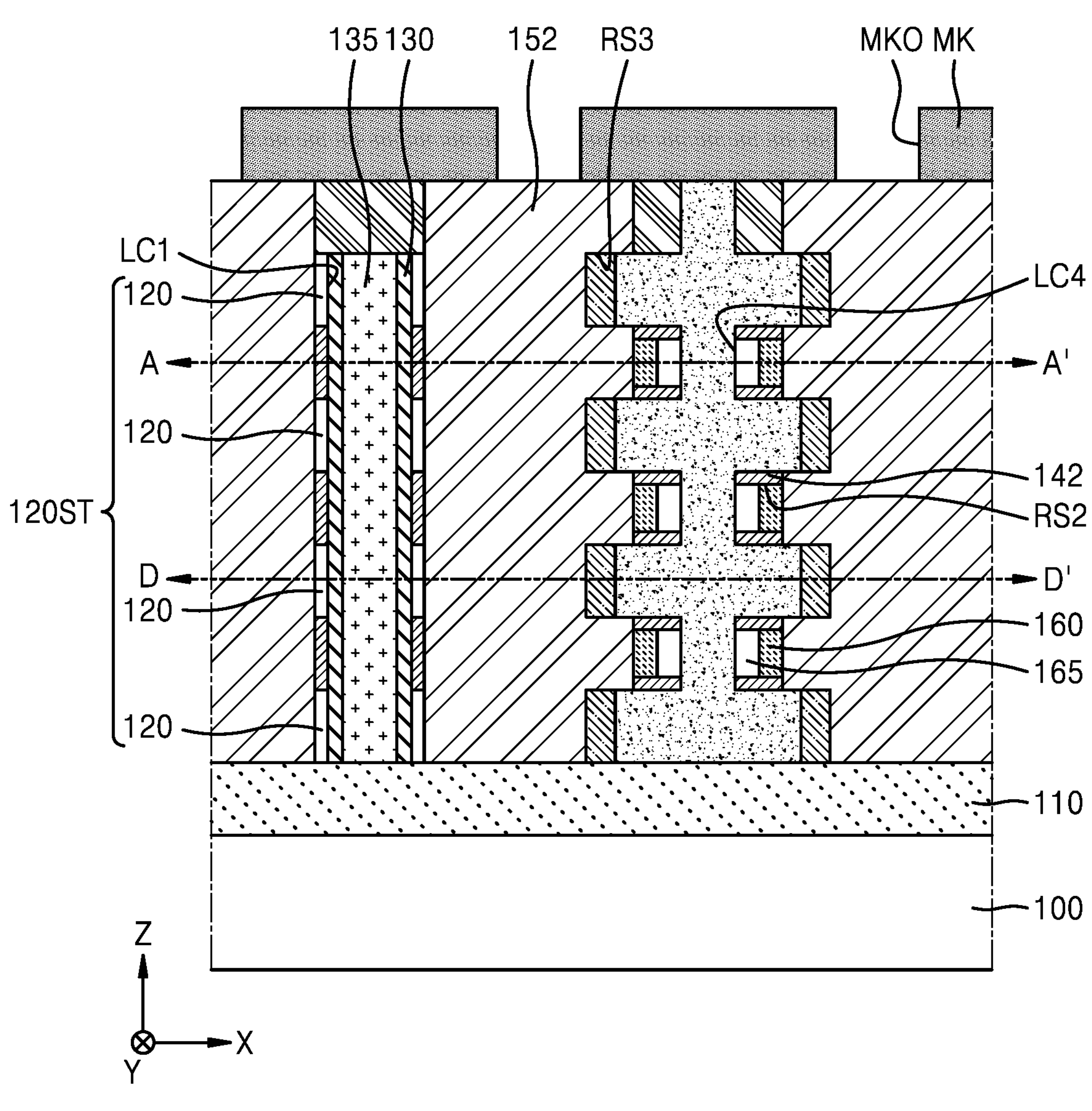

FIGS. 18A and 18B are views illustrating a method of manufacturing a semiconductor memory device, according to embodiments. Specifically, FIG. 18A is a horizontal cross-sectional view taken along the line A-A' of FIG. 18B, and FIG. 18B is a vertical cross-sectional view taken along line B-B' of FIG. 18A.

Referring to FIGS. 18A and 18B, a mask pattern MK having a plurality of mask openings MKO is formed on the semiconductor device as illustrated in FIGS. 14A to 14D. Each of the plurality of mask openings MKO may expose a part corresponding to a pair of gate structures 180 arranged at both ends of the channel pattern 146P and the horizontal channel 120C of the semiconductor layer 120 in the second horizontal direction (the Y direction), which are illustrated in FIGS. 15A and 15C. For example, one mask opening MKO may be arranged on the part corresponding to the pair of gate structures 180 illustrated in FIGS. 15A and 15C, the part of the channel pattern 146P between the pair of gate structures 180, and the part of the horizontal channel 120C of the semiconductor layer 120. Through the mask opening MKO, a part of a top surface of the third filling insulating layer 152, which is the part corresponding to the pair of gate structures 180 illustrated in FIGS. 15A and 15C, may be exposed and a part of the top surface of the cover insulating layer 200 corresponding to the part of the channel pattern 146P between the pair of gate structures 180 and the part of the horizontal channel 120C of the semiconductor layer 120 may be exposed.

Figure 19:
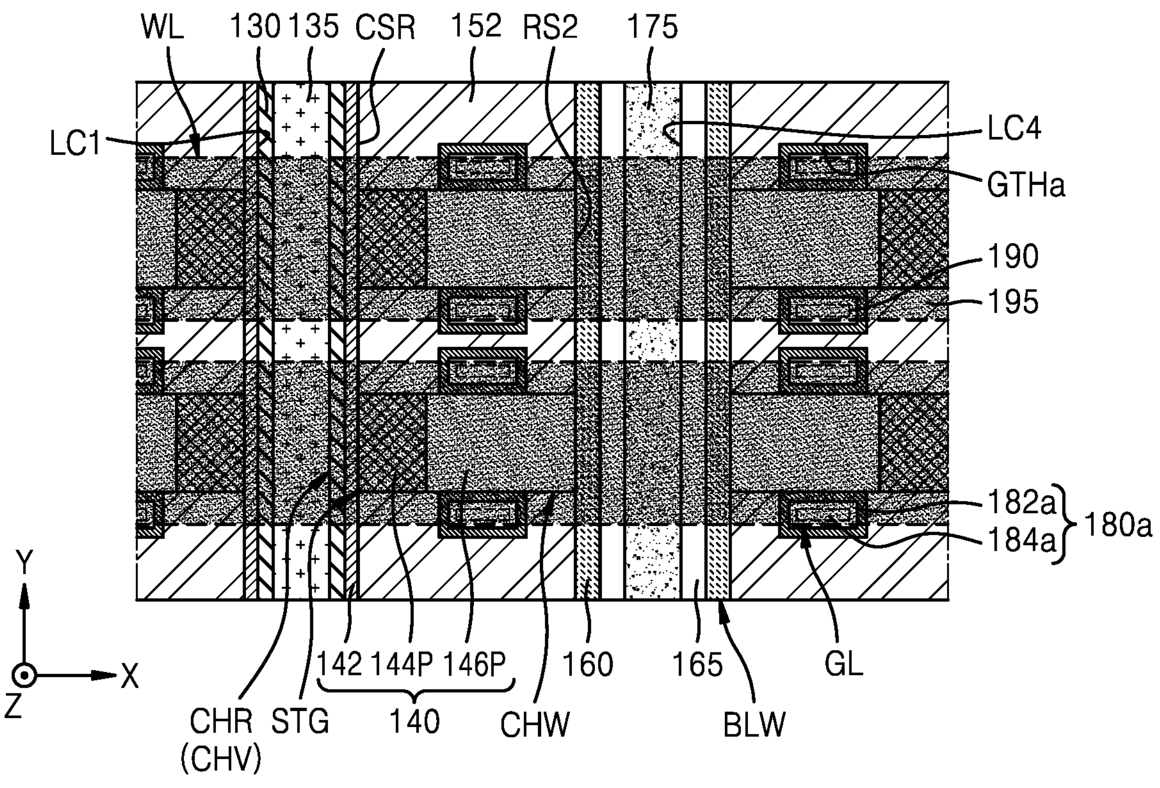
FIG. 19 illustrates a semiconductor memory device according to embodiments of the present disclosure.

FIG. 19 is a view illustrating a semiconductor memory device 1*b* according to embodiments. Specifically, FIG. 19 is a horizontal cross-sectional view taken along the line D-D' of FIG. 18B.

Referring to FIGS. 18A, 18B, and 19, a plurality of gate holes GTHa are formed that extend through the plurality of third filling insulating layers 152 by removing a part of the plurality of third filling insulating layers 152 and by using the mask pattern MK as an etching mask. The plurality of gate holes GTHa may be formed adjacent to the plurality of channel patterns 146P and the plurality of horizontal channels 120C. For example, the plurality of gate holes GTHa may be formed so that the plurality of channel patterns 146P and the plurality of horizontal channels 120C are exposed on internal surfaces of the plurality of gate holes GTHa.

A plurality of gate structures 180*a* that each include a gate dielectric layer 182*a* overlapping or covering the internal surface of each of the plurality of gate holes GTHa and a gate electrode layer 184*a* overlapping or covering the gate dielectric layer 182*a* and filling each of the plurality of gate holes GTHa are formed. Because the gate structure 180*a* is similar to the gate structure 180, a detailed description thereof is omitted.

Then, referring to FIGS. 16A to 16D, a plurality of word line contacts 190 are formed on the plurality of gate electrode layers 184*a*, and then a plurality of word line layers 195 connected to some of the plurality of word line contacts 190 are formed.

Figure 20A:
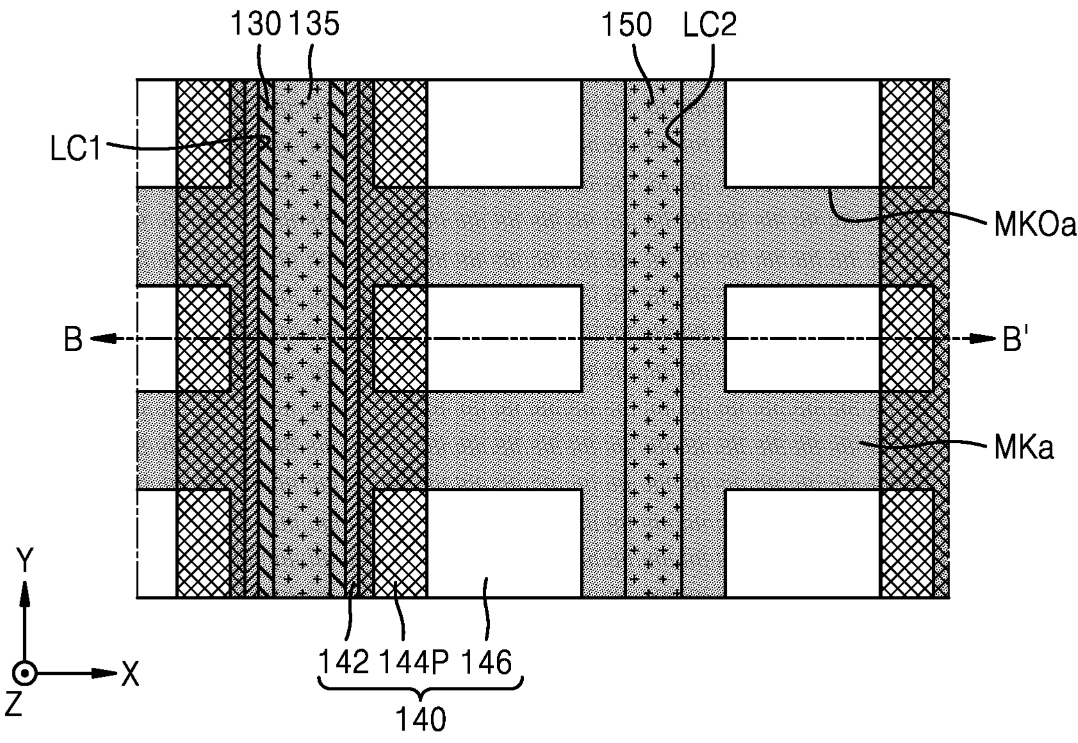
FIGS. 20A and 20B illustrate a semiconductor memory device according to embodiments of the present disclosure.
Figure 22A:
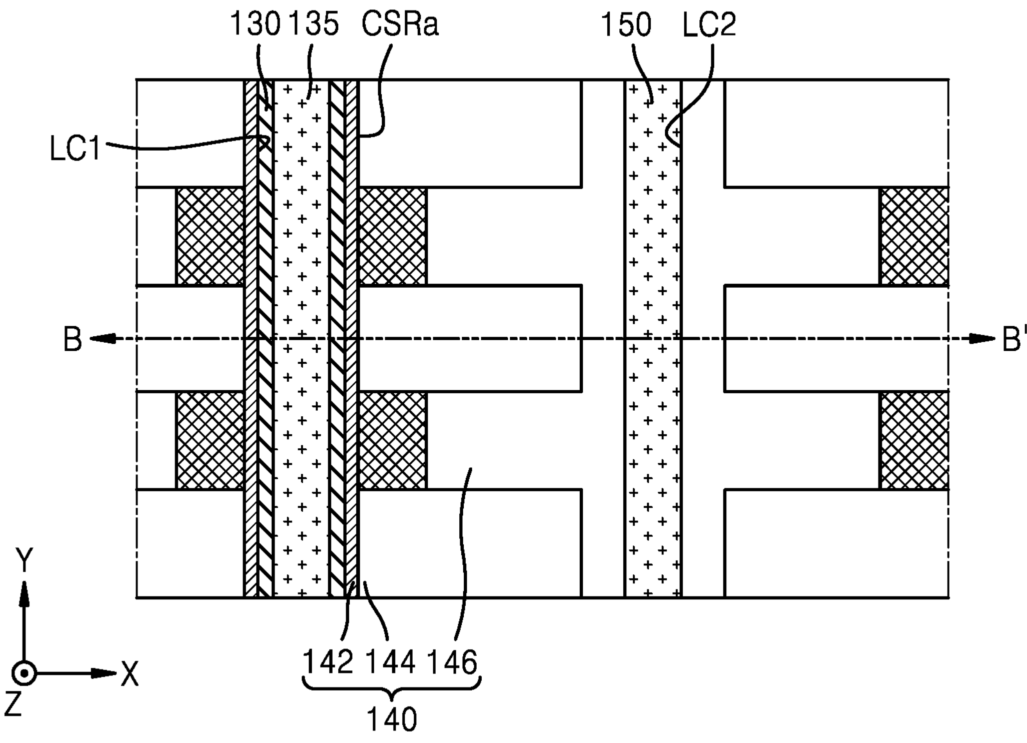
Figure 22B:
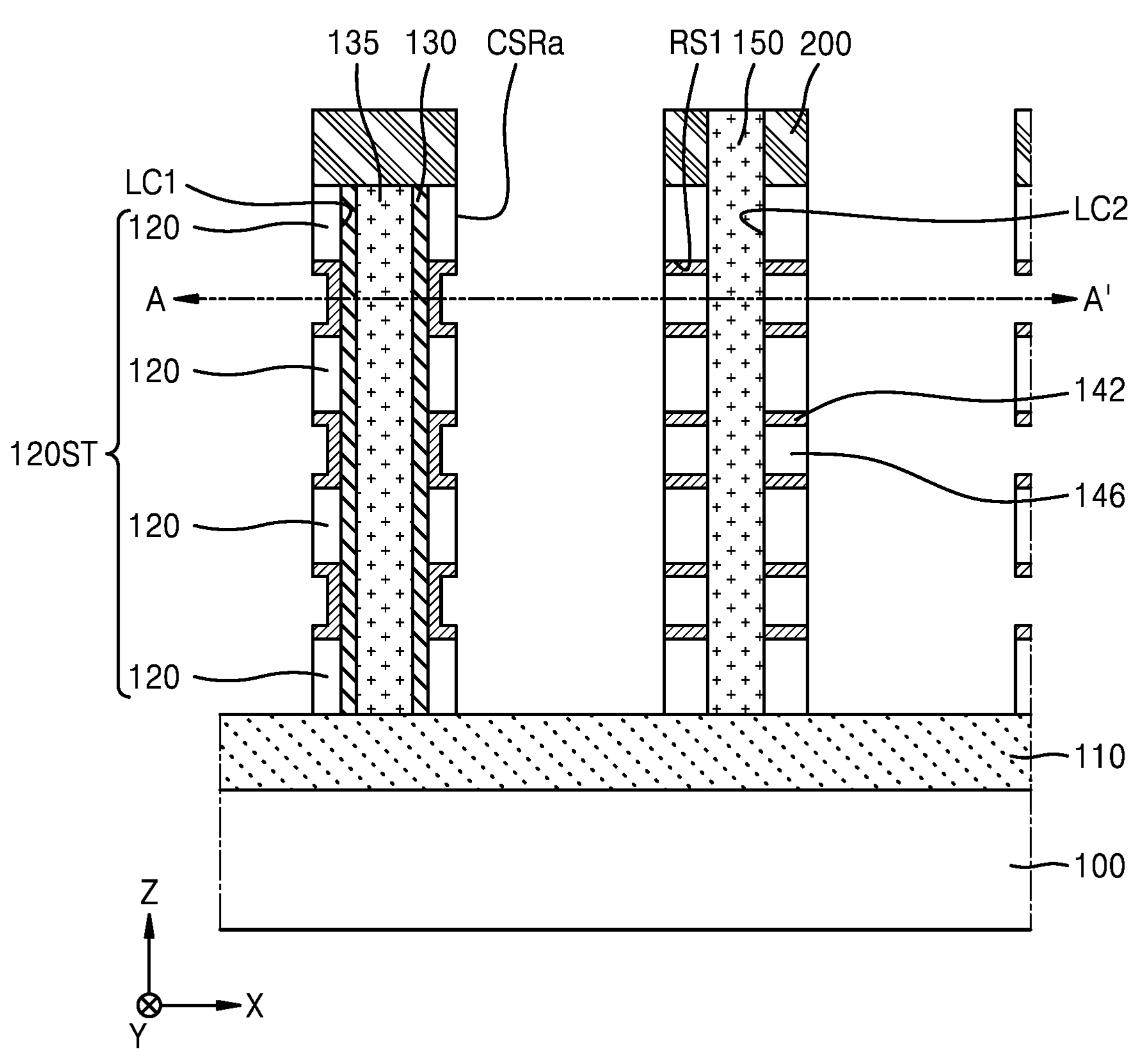

FIGS. 20A to 22B are views illustrating a method of manufacturing a semiconductor memory device, according to embodiments. Specifically, FIGS. 20A, 21A, and 22A are horizontal cross-sectional views taken along the line A-A' line of FIGS. 20B, 21B, and 22B, and FIGS. 20B, 21B, and 22B are vertical cross-sectional views taken along the line B-B' of FIGS. 20A, 21A, and 22A.

Figure 20B:
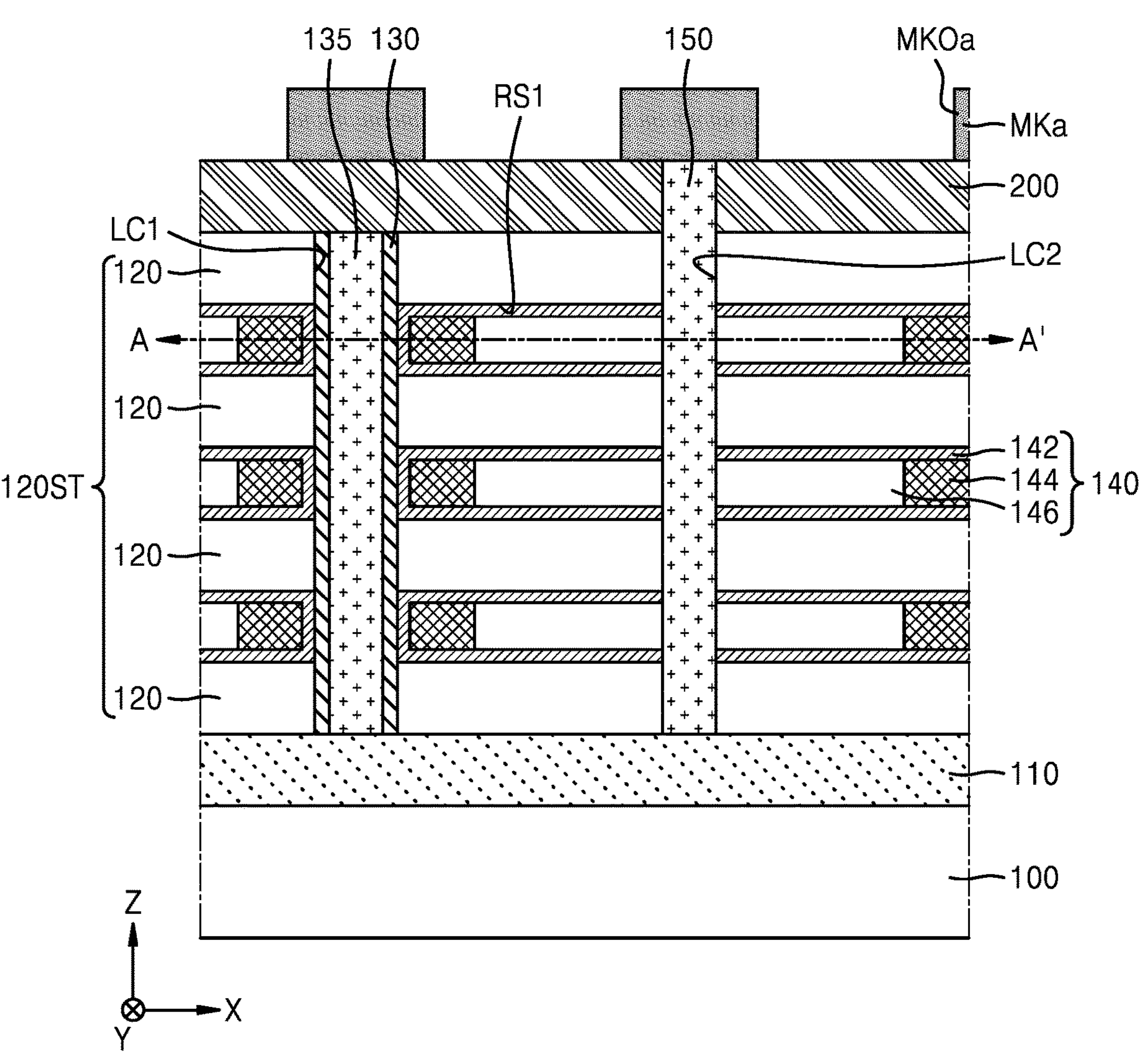
Figure 21A:
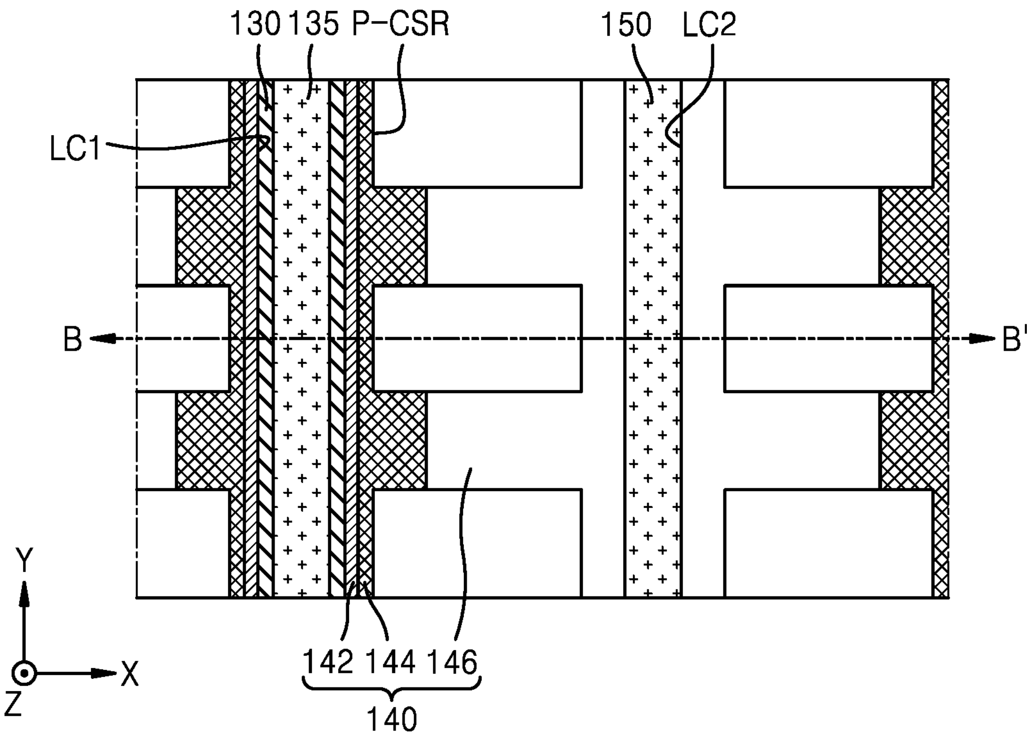
FIGS. 21A, 21B, 22A, and 22B illustrate a method of manufacturing a semiconductor memory device according to embodiments of the present disclosure.
Figure 21B:
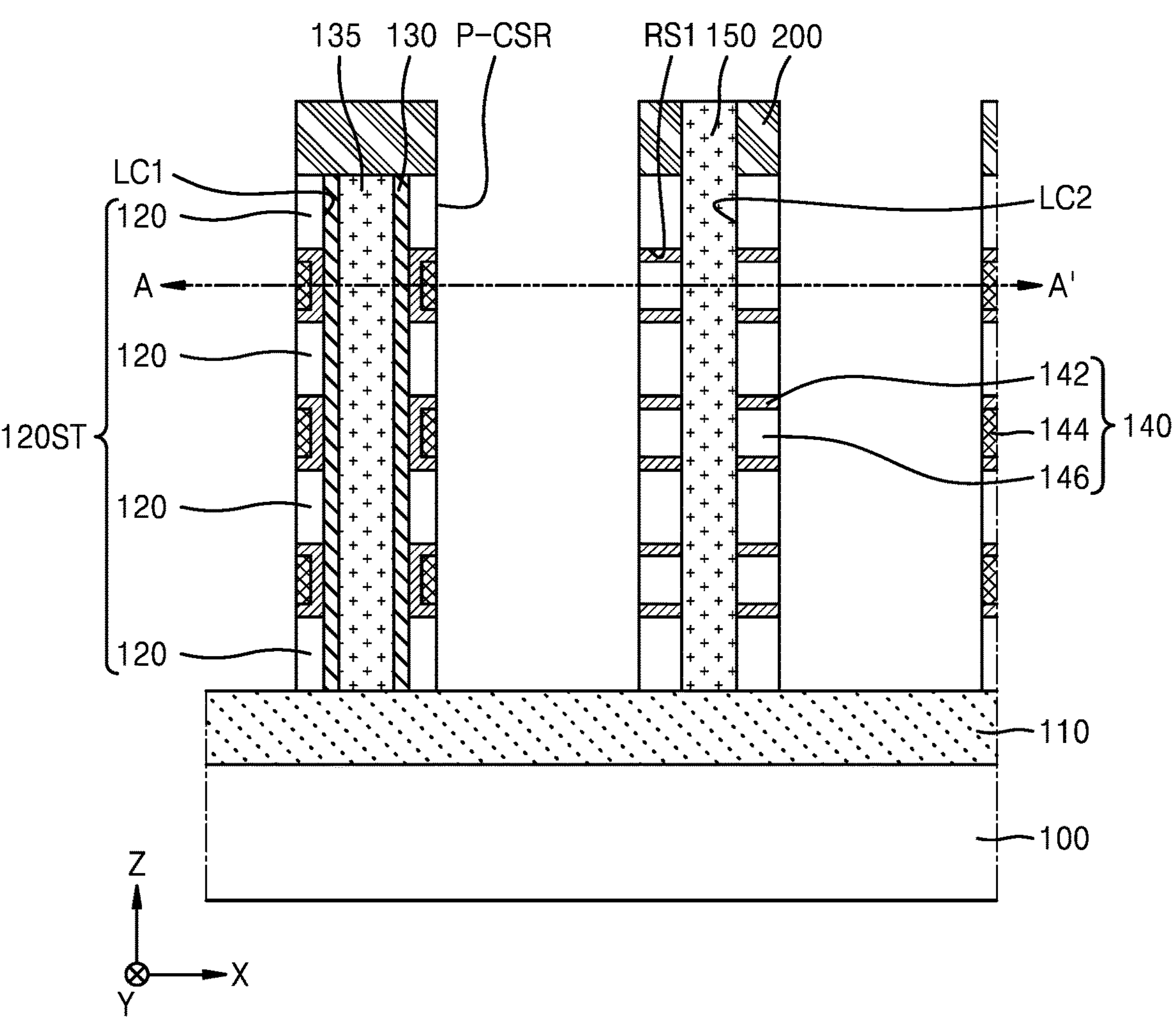

Referring to FIGS. 20A and 20B, a mask pattern MKa having a plurality of mask openings MKOa is formed on the result illustrated in IGS. 7A to 7D. Each of the plurality of mask openings MKOa may be formed to be slightly smaller than the cell separation region CSR illustrated in FIGS. 8A to 8D. For example, one end of the cell separation region CSR illustrated in FIGS. 8A to 8D in the first horizontal direction (the X direction) may contact the separation insulating layer 142 and one end of the mask opening MKOa in the first horizontal direction (the X direction) may be spaced apart from the separation insulating layer 142. That is, in a part of the charge storage layer 144 removed by the cell separation region CSR illustrated in FIGS. 8A to 8D, a part contacting the separation insulating layer 142 may not be exposed by the mask opening MKOa and may be covered by the mask pattern MKa.

Referring to FIGS. 20A to 21B, a plurality of preliminary cell separation regions P-CSR are formed through the stacked semiconductor structure 120ST and the filling structure 140 by using the mask pattern MKa as an etching mask. The plurality of preliminary cell separation regions P-CSR may be arranged in a matrix in a plan view to be spaced apart from one another in the first horizontal direction (the X direction) and the second horizontal direction (the Y direction). The charge storage layer 144 may not be separated by the plurality of preliminary cell separation regions P-CSR. Each of the plurality of preliminary cell separation regions P-CSR may be spaced apart from the vertical channel layer 130 with the separation insulating layer 142 and a part of the charge storage layer 144 adjacent to the separation insulating layer 142 therebetween.

Referring to FIGS. 21A to 22B, a part of the charge storage layer 144 adjacent to the separation insulating layer 142 exposed through the plurality of preliminary cell separation regions P-CSR is removed to form a plurality of cell separation regions CSRa through the stacked semiconductor structure 120ST and the filling structure 140. The plurality of cell separation regions CSRa may be arranged in a matrix in a plan view to be spaced apart from one another in the first horizontal direction (the X direction) and the second horizontal direction (the Y direction). The charge storage layer 144 may be divided into a plurality of charge storage patterns 144P by the plurality of cell separation regions CSRa. Each of the plurality of cell separation regions CSRa may be spaced apart from the vertical channel layer 130 with the separation insulating layer 142 therebetween. The plurality of cell separation regions CSRa may be spaced apart from the second line cut region LC2 in the first horizontal direction (the X direction).

Then, similar to the embodiments illustrated in FIGS. 8A to 8D, a semiconductor memory device may be formed by filling the third filling insulating layer 152 in each of the plurality of cell separation regions CSRa and performing the processes described in FIGS. 9A to 16D.

Figure 23:
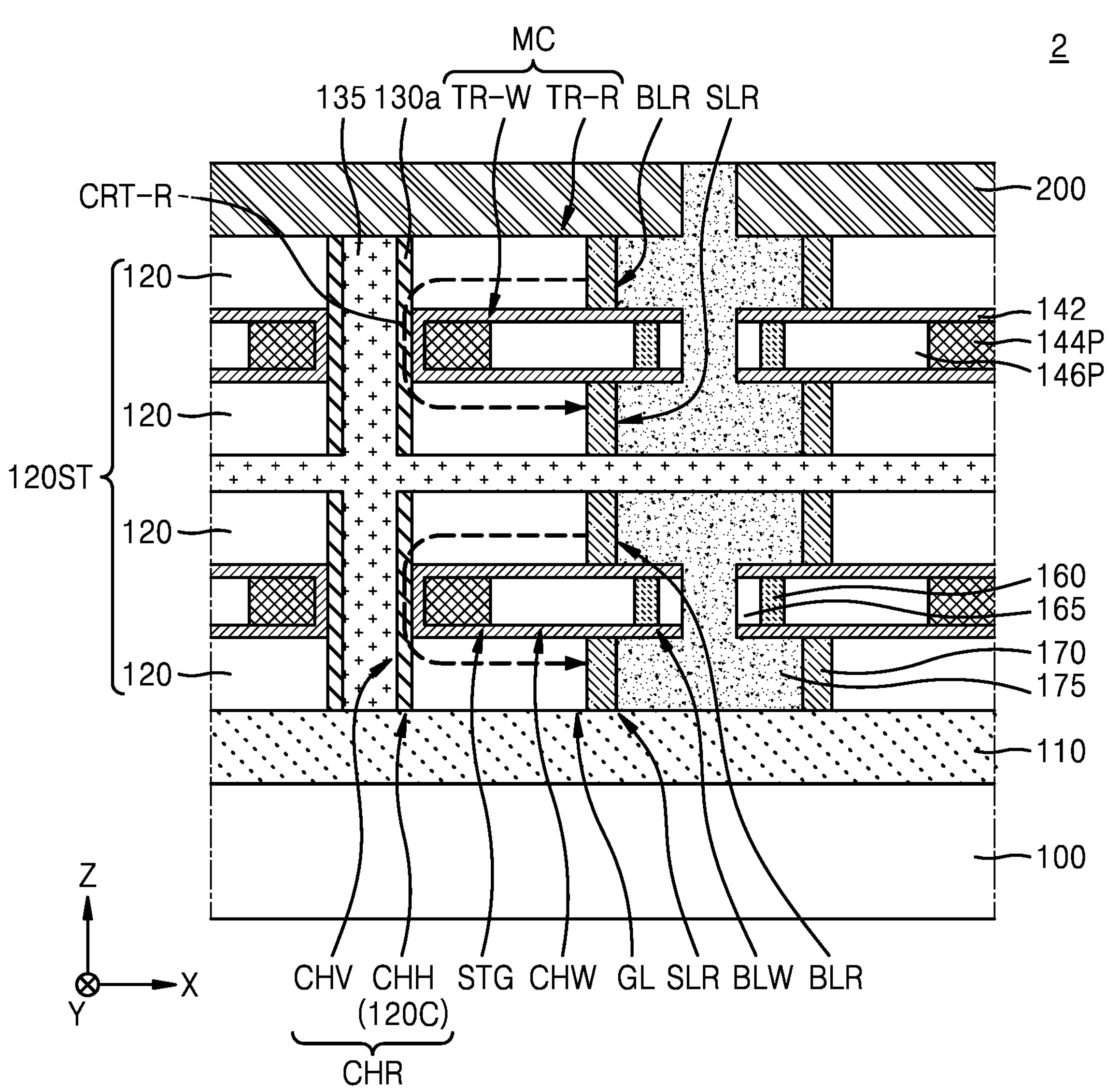
FIGS. 23 and 24 illustrate semiconductor memory devices according to embodiments of the present disclosure.
Figure 24:
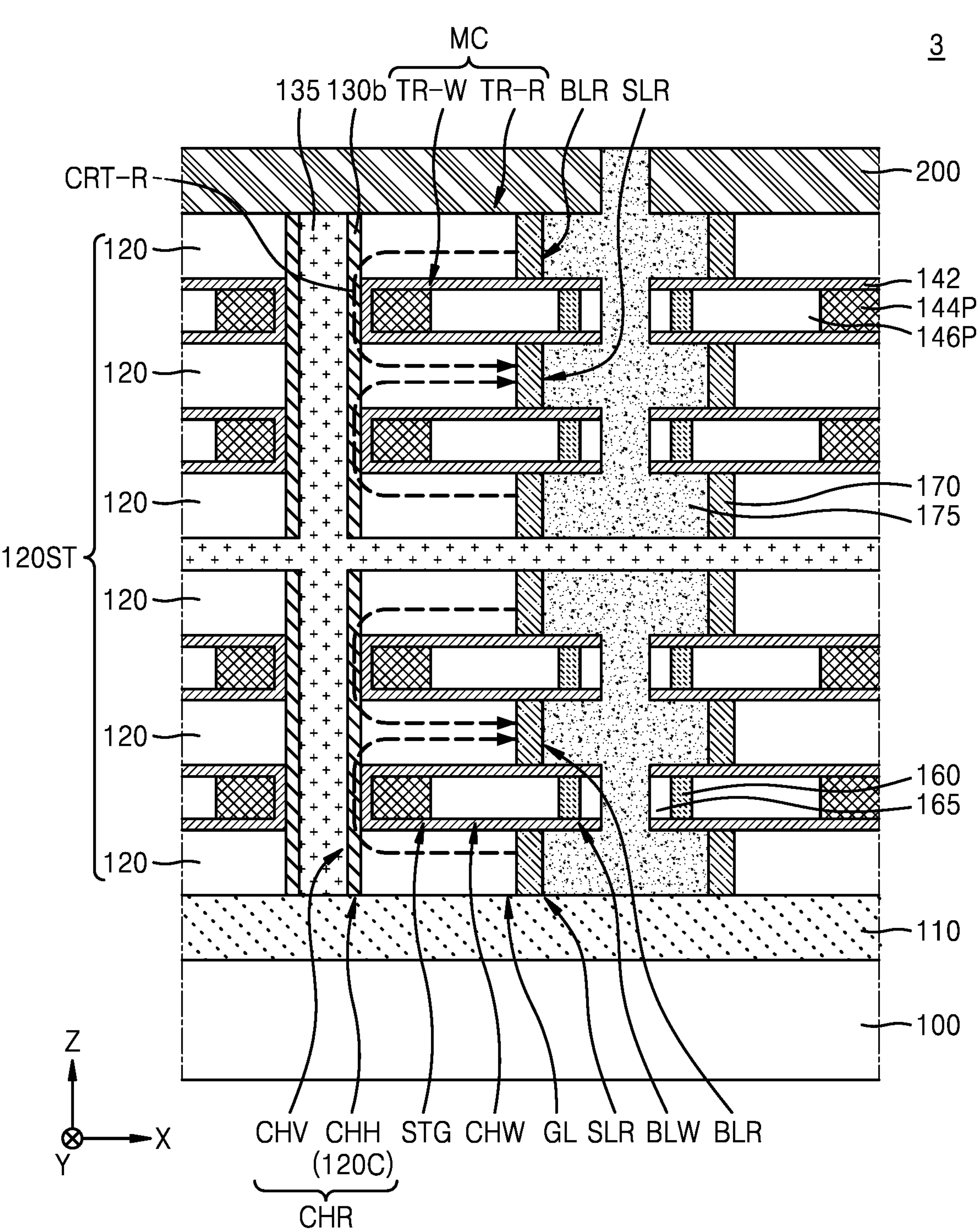

FIGS. 23 and 24 are views illustrating semiconductor memory devices 2 and 3 according to embodiments of the present disclosure. Specifically, FIGS. 23 and 24 are vertical cross-sectional views taken along the line C-C' of FIGS. 16A and 16D.

Referring to FIG. 23, the semiconductor memory device 2 may include a plurality of memory cells MC. The plurality of memory cells MC may be three-dimensionally arranged in the first horizontal direction (the X direction), the second horizontal direction (the Y direction), and the vertical direction (the Z direction). Each of the plurality of memory cells MC may include a pair of transistors, for example, a first transistor TR-R and a second transistor TR-W. The first transistor TR-R may include a first channel structure CHR and the second transistor TR-W may include a second channel structure CHW. The first channel structure CHR may have a nonlinear shape (e.g., a 'C' shape) in an X-Z plane formed in the first horizontal direction (the X direction) and the vertical direction (the Z direction). The first channel structure CHR may include a pair of horizontal parts CHH and a vertical part CHV connecting the pair of horizontal parts CHH.

In some embodiments, each of the plurality of memory cells MC included in the semiconductor memory device 2 may not share the pair of horizontal parts CHH of the first channel structure CHR included in each of the plurality of memory cells MC.

The pair of horizontal parts CHH of the first channel structure CHR included in the semiconductor memory device 2 may include horizontal channels 120C of a pair of adjacent semiconductor layers 120 in the vertical direction (the Z direction), and the vertical part CHV may include a part of a vertical channel layer 130*a* connecting the horizontal channels 120C of the adjacent pair of semiconductor layers 120. Each of the vertical parts CHV of the first transistors TR-R arranged in the vertical direction (the Z direction) may include different vertical channel layers 130*a*.

Referring to FIG. 24, the semiconductor memory device 3 may include a plurality of memory cells MC. The plurality of memory cells MC may be three-dimensionally arranged in the first horizontal direction (the X direction), the second horizontal direction (the Y direction), and the vertical direction (the Z direction). Each of the plurality of memory cells MC may include a pair of transistors, for example, a first transistor TR-R and a second transistor TR-W. The first transistor TR-R may include a first channel structure CHR and the second transistor TR-W may include a second channel structure CHW. The first channel structure CHR may have a nonlinear shape (e.g., a 'C' shape) in an X-Z plane formed in the first horizontal direction (the X direction) and the vertical direction (the Z direction). The first channel structure CHR may include a pair of horizontal parts CHH and a vertical part CHV connecting the pair of horizontal parts CHH.

In some embodiments, among the plurality of memory cells MC included in the semiconductor memory device 1, two memory cells MC adjacent to each other in the vertical direction (the Z direction) may share one of the pair of horizontal parts CHH of the first channel structure CHR included in each of the two memory cells MC.

The pair of horizontal parts CHH of the first channel structure CHR included in the semiconductor memory device 3 may include horizontal channels 120C of a pair of adjacent semiconductor layers 120 in the vertical direction (the Z direction), and the vertical part CHV may include a part of a vertical channel layer 130*b* connecting the horizontal channels 120C of the pair of semiconductor layers 120. Vertical parts CHV of at least two first transistors TR-R sequentially arranged in the vertical direction (the Z direction) may include a part of one vertical channel layer 130*b*.

In FIG. 24, vertical parts CHV of two first transistors TR-R sequentially arranged in the vertical direction (the Z direction) and vertical parts CHV of two other first transistors TR-R are illustrated as different vertical channel layers 130*b*. However, the present disclosure is not limited thereto. For example, vertical parts CHV of three or more first transistors TR-R sequentially arranged in the vertical direction (the Z direction) and vertical parts CHV of three or more other first transistors TR-R may be different vertical channel layers 130*b*.

While the present disclosure has been particularly shown and described with reference to embodiments thereof, it will be understood that various changes in form and details may be made therein without departing from the spirit and scope of the following claims.

What is claimed is:

1. A semiconductor memory device comprising:

a memory cell that extends in a first horizontal direction, a second horizontal direction that intersects the first horizontal direction, and a vertical direction, wherein the memory cell comprises a first transistor comprising a first channel structure, a second transistor comprising a second channel structure, and a charge storage element electrically connected to a first end of the second channel structure and adjacent to the first channel structure;

a first bit line electrically connected to a first end of the first channel structure and that extends in the second horizontal direction;

a selection line electrically connected to a second end of the first channel structure and that extends in the second horizontal direction;

a second bit line electrically connected to a second end of the second channel structure and that extends in the second horizontal direction; and a gate line adjacent to each of the first channel structure and the second channel structure and that extends in the vertical direction.

2. The semiconductor memory device of claim 1, wherein the second channel structure and the charge storage element extend in the first horizontal direction.

3. The semiconductor memory device of claim 2, wherein the first channel structure comprises a portion with a nonlinear shape.

4. The semiconductor memory device of claim 3, wherein the charge storage element is adjacent to the portion with the nonlinear shape of the first channel structure.

5. The semiconductor memory device of claim 2, wherein the first channel structure comprises a pair of horizontal parts that are spaced apart from each other in the vertical direction and that extend in the first horizontal direction, and wherein the first channel structure comprises a vertical part that extends in the vertical direction and that is electrically connected to the pair of horizontal parts.

6. The semiconductor memory device of claim 5, wherein the charge storage element is between the pair of horizontal parts and between the vertical part and the second channel structure.

7. The semiconductor memory device of claim 6, further comprising a separation insulating layer that extends between the first channel structure and the second channel structure and that extends between the first channel structure and the charge storage element.

8. The semiconductor memory device of claim 1, wherein the second channel structure comprises an undoped oxide semiconductor material.

9. The semiconductor memory device of claim 1, wherein the charge storage element comprises a semiconductor material doped with impurities or an oxide semiconductor material doped with impurities.

10. A semiconductor memory device comprising:

a plurality of memory cells that extend in a first horizontal direction, a second horizontal direction that intersects the first horizontal direction, and a vertical direction, wherein each memory cell of the plurality of memory cells comprises a first transistor comprising a first channel structure, a second transistor comprising a second channel structure, and a charge storage element electrically connected to a first end of the second channel structure and adjacent to the first channel structure;

a plurality of first bit lines, wherein a first bit line of the plurality of first bit lines is electrically connected to a first end of the first channel structure, and wherein the first bit line extends in the second horizontal direction;

a plurality of selection lines, wherein a selection line of the plurality of selection lines is electrically connected to a second end of first channel structure, and wherein the selection line extends in the second horizontal direction;

a plurality of second bit lines, wherein a second bit line of the plurality of second bit lines is electrically connected to a second end of the second channel structure, and wherein the second bit line extends in the second horizontal direction; and a plurality of gate lines, wherein a gate line of the plurality of gate lines is adjacent to the first end of the first channel structure, the second end of the first channel structure, the first end of the second channel structure, and the second end of the second channel structure, wherein the gate line extends in the vertical direction, wherein the first channel structure of the plurality of memory cells comprises a portion with a nonlinear shape, and wherein a first end of charge storage elements of the plurality of memory cells and the first end of the second channel structures of the plurality of memory cells are adjacent to the portion with the nonlinear shape of the first channel structure of the plurality of memory cells.

11. The semiconductor memory device of claim 10, wherein the charge storage element of the plurality of memory cells comprises a floating gate of the first transistor.

12. The semiconductor memory device of claim 10, wherein the plurality of first bit lines and the plurality of selection lines are spaced apart from one another and alternately arranged in the vertical direction.

13. The semiconductor memory device of claim 10, wherein the first channel structure of the plurality of memory cells comprises a pair of horizontal parts that are spaced apart from one another in the vertical direction and that extend in the first horizontal direction, and wherein the first channel structure of the plurality of memory cells comprises a vertical part that extends in the vertical direction and that is electrically connected to the pair of horizontal parts, and wherein the charge storage element of the plurality of memory cells is between the pair of horizontal parts and between the vertical part and the second channel structure.

14. The semiconductor memory device of claim 13, wherein the first bit line of the plurality of first bit lines and the selection line of the plurality of selection lines are electrically connected to the pair of horizontal parts of the first channel structure, and wherein the first bit line and the selection line are closer to the vertical part of the first channel structure than the second bit line of the plurality of second bit lines.

15. The semiconductor memory device of claim 13, further comprising a vertical channel layer that extends in the vertical direction, wherein the vertical channel layer comprises at least two vertical parts of at least two first transistors among the plurality of memory cells.

16. The semiconductor memory device of claim 15, wherein two adjacent memory cells of the plurality of memory cells share one horizontal part of the pair of horizontal parts of the first channel structure.

17. The semiconductor memory device of claim 10, further comprising a plurality of word lines that extend in the first horizontal direction, wherein a word line of the plurality of word lines electrically connects a pair of adjacent gate lines of the plurality of gate lines.

18. A semiconductor memory device comprising:

a plurality of memory cells on a substrate and that extend in a first horizontal direction, a second horizontal direction that intersects the first horizontal direction, and a vertical direction, wherein each memory cell of the plurality of memory cells comprises a first transistor and a second transistor;

a plurality of first bit lines that extend in the second horizontal direction;

a plurality of selection lines that extend in the second horizontal direction;

a plurality of second bit lines that extend in the second horizontal direction; and a plurality of gate lines that extend in the vertical direction, wherein the first transistor comprises a charge storage element, which is configured to operate as a floating gate, and a first channel structure, and one of the plurality of first bit lines and one of the plurality of selection lines are electrically connected to a first end of the first channel structure and a second end of the first channel structure, the second transistor comprises a second channel structure, and the charge storage element and one of the plurality of second bit lines are electrically connected to a first end and a second end of the second channel structure, wherein a pair of gate lines of the plurality of gate lines are adjacent to the first end of the first channel structure, the second end of the first channel structure, the first end of the second channel structure, and the second end of the second channel structure, and a word line electrically connects the pair of gate lines, the first channel structure comprises a pair of horizontal parts spaced apart from one another in the vertical direction and that extend in the first horizontal direction, and a vertical part that extends in the vertical direction and is electrically connected to the pair of horizontal parts, and a first end of the charge storage element and the first end of the second channel structure are between the pair of horizontal parts of the first channel structure.

19. The semiconductor memory device of claim 18 further comprising a vertical channel layer that extends in the vertical direction, wherein the vertical channel layer comprises the vertical parts of the first transistors, and wherein two adjacent memory cells among the plurality of memory cells share one horizontal part of the pair of horizontal parts of the first channel structure.

20. The semiconductor memory device of claim 18, wherein the charge storage element comprises a semiconductor material doped with impurities or an oxide semiconductor material doped with impurities, and wherein the second channel structure comprises an undoped oxide semiconductor material.

* * * * *